US006865699B2

(12) United States Patent
Tanaka et al.

(10) Patent No.: US 6,865,699 B2
(45) Date of Patent: Mar. 8, 2005

(54) INFORMATION DATA MULTIPLEX TRANSMISSION, SYSTEM, ITS MULTIPLEXER AND DEMULTIPLEXER, AND ERROR CORRECTION ENCODER AND DECODER

(75) Inventors: Hirokazu Tanaka, Chiba (JP); Shoichiro Yamasaki, Tokyo (JP); Tatsunori Saito, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 388 days.

(21) Appl. No.: 10/199,091

(22) Filed: Jul. 22, 2002

(65) Prior Publication Data

US 2003/0012228 A1 Jan. 16, 2003

Related U.S. Application Data

(62) Division of application No. 09/242,539, filed as application No. PCT/JP98/02749 on Jun. 19, 1998, now Pat. No. 6,490,243.

(30) Foreign Application Priority Data

Jun. 19, 1997 (JP) ............................................. 9-178954
Oct. 22, 1997 (JP) ............................................. 9-289753

(51) Int. Cl.[7] ........................ G06F 11/00; H03M 13/00; H04J 3/24; H04J 3/00

(52) U.S. Cl. ........................ 714/701; 714/755; 714/758; 714/776; 370/473; 370/474; 370/476

(58) Field of Search ................................ 714/701, 746, 714/751, 752, 755, 758, 761, 762, 776, 777, 786, 787, 788, 799, 800, 712, 48, 52; 370/535, 473, 474, 476, 479, 242; 375/240.27

(56) References Cited

U.S. PATENT DOCUMENTS

| 4,077,565 | A | * | 3/1978 | Nibby et al. ................. 714/758 |
| 5,430,738 | A | * | 7/1995 | Tsuda ......................... 714/748 |
| 5,463,642 | A | | 10/1995 | Gibbs et al. |
| 5,559,813 | A | | 9/1996 | Shimizu |
| 5,659,556 | A | | 8/1997 | Denissen et al. |
| 6,040,867 | A | * | 3/2000 | Bando et al. ........... 375/240.27 |
| 6,134,572 | A | | 10/2000 | Wolf et al. |
| 6,788,707 | B1 | * | 9/2004 | Horton et al. ............... 370/474 |

FOREIGN PATENT DOCUMENTS

| JP | 61-237523 | 10/1986 |
| JP | 62-291222 | 12/1987 |
| JP | 1-109827 | 4/1989 |

(List continued on next page.)

OTHER PUBLICATIONS

R. Pyndiah, et al., "Near Optimum Decoding of Product Codes" IEEE Globecom, IEEE vol. 1, pp. 339–343 (1994).

(List continued on next page.)

*Primary Examiner*—Christine T. Tu
(74) *Attorney, Agent, or Firm*—Finnegan, Henderson, Farabow, Garrett & Dunner, L.L.P.

(57) ABSTRACT

A multiplexing unit on the transmitting side estimates information amounts supplied from respective signal processing units, determines a multiplex code on the basis of respective information amounts, derives a parity of the first determined multiplex code to form a second multiplex code, adds a CRC to each of the multiplex codes to generate two headers H1 and H2, takes out information data of respective media according to the multiplex codes, incorporates the information data into a packet together with the two headers H1 and H2, and outputs the packet. If error correction of H1 is impossible on the receiving side, error correction decoding is conducted by using the header H2. If error correction of H2 is also impossible, error correction decoding is conducted collectively for H1 and H2.

23 Claims, 39 Drawing Sheets

FOREIGN PATENT DOCUMENTS

| | | |
|---|---|---|
| JP | 3-234124 | 10/1991 |
| JP | 5-14742 | 1/1993 |
| JP | 5-268129 | 10/1993 |
| JP | 5-284148 | 10/1993 |
| JP | 5-325432 | 12/1993 |
| JP | 6-292161 | 10/1994 |
| JP | 6-303152 | 10/1994 |
| JP | 6-326967 | 11/1994 |
| JP | 7-283740 | 10/1995 |
| JP | 7-336316 | 12/1995 |
| JP | 8-251140 | 9/1996 |
| JP | 8-293801 | 11/1996 |
| JP | 8-330978 | 12/1996 |
| JP | 9-7312 | 1/1997 |
| JP | 9-17132 | 1/1997 |
| JP | 9-116440 | 5/1997 |
| JP | 10-276099 | 10/1998 |
| JP | 10-303877 | 11/1998 |

OTHER PUBLICATIONS

J. Hagenauer, et al., "Iterative Decoding of Binary Block and Convolutional Codes," IEEE Transactions on Information Theory, 42(2): 429–445 (Mar. 1996).

Telecommunications Union International (ITU–T) White Book, "H Series Recommendations (Part II)" pp. 22–43 and pp. 518–519 (May 26–Jun. 7, 1996) (in Japanese).

H. Tanaka, et al., "A Study on Multiplexing Scheme over Mobile Multimedia Networks" Technical Research Report of Institute of Electronics Information and Communications Engineers, 97(326):105–110 (Sep. 1997) (in Japanese).

S. Wicker and V. Bhargava, "Reed–Solomon Codes and Their Applications" IEEE Press, pp. 8, 9, 76, 77 (1994).

E. Watanabe and S Kamiya, "MPEG 4 Technology for Mobile Multimedia Communication" Toshiba Review, 53(4):41–44 (1998) (in Japanese).

Shoichiro Yamasaki, et al. "Error Correction Decoding Methods on Multimedia Multiplexing for Mobile Communication" Technical Research Report of Institute of Electronics Information and Communications Engineers, 97(254):35–40 (Sep. 1997) (in Japanese).

K. Akihito, et al. "A Frame Transmission Scheme Adding Error Check Code for Header Fields" Proceedings of the 1992 IEICE Spring Conference, Part 3(B697):264 (Mar. 24–27, 1992) (in Japanese).

S. Hotani and T. Miki, "A Study on Variable Length Frame Synchronization for MPEG–4 Audio RCS96–119" Technical Report of IEICE, 96(481): 35–42 (Jan. 23, 1997) (in Japanese).

* cited by examiner

PROCESSING FOR REPRODUCING H1 BY USING H2

THIRD CONFIGURATION EXAMPLE OF MUX PACKET

CONCRETE EXAMPLE OF MUX PACKET $$\begin{pmatrix} \overbrace{1\ 0\ 0\ 0\ 0\ 1\ 0}^{X1} \\ \underbrace{1\ 1\ 1\ 1\ 1\ 0\ 1}_{Y1} \end{pmatrix}$$

SIMULATION RESULT OF GSM

| GSM AVERAGE BER | CORRECT DECODING RATE | | OVERLOOKING RATE | | DECODING ERROR | |
|---|---|---|---|---|---|---|
| | PRESENT INVENTION SCHEME | CONVENTIONAL SCHEME | PRESENT INVENTION SCHEME | CONVENTIONAL SCHEME | PRESENT INVENTION SCHEME | CONVENTIONAL SCHEME |
| 1.56E-2 | 99.456% | 95.339% | 6.10E-4 | 0.00 | 5.44E-3 | 4.66E-2 |
| 6.04E-3 | 99.911% | 98.286% | 1.77E-4 | 0.00 | 8.92E-4 | 1.71E-2 |
| 1.03E-3 | 99.990% | 99.708% | 6.00E-6 | 0.00 | 1.03E-4 | 2.92E-3 |

FIG. 18

SIMULATION RESULT OF DECT

| DECT (14km/h) AVERAGE BER | CORRECT DECODING RATE | | OVERLOOKING RATE | | DECODING ERROR | |
|---|---|---|---|---|---|---|
| | PRESENT INVENTION SCHEME | CONVENTIONAL SCHEME | PRESENT INVENTION SCHEME | CONVENTIONAL SCHEME | PRESENT INVENTION SCHEME | CONVENTIONAL SCHEME |
| 1.46E-1 | 73.618% | 48.932% | 3.48E-2 | 5.30E-5 | 2.64E-1 | 5.11E-1 |
| 2.30E-2 | 99.227% | 92.716% | 1.53E-3 | 6.00E-6 | 4.67E-3 | 7.28E-2 |
| 2.64E-3 | 99.997% | 99.185% | 3.90E-5 | 2.00E-6 | 3.30E-5 | 8.16E-3 |

FIG. 19

SIMULATION RESULT OF GSM

| GSM AVERAGE BER | ERROR RATE | |
|---|---|---|
| | RS | CONVOLUTION |
| 1.56E-2 | 3.32E-3 | 1.22E-2 |
| 6.04E-3 | 3.65E-4 | 3.19E-3 |
| 1.03E-3 | 4.10E-5 | 5.29E-4 |

FIG. 20

SIMULATION RESULT OF DECT

| DECT (14km/h) AVERAGE BER | ERROR RATE | |
|---|---|---|
| | RS | CONVOLUTION |
| 1.46E-1 | 1.38E-1 | 1.88E-1 |
| 2.30E-2 | 8.40E-3 | 1.21E-2 |
| 2.64E-3 | 3.99E-4 | 7.95E-4 |

FIG. 21

| PM:1 | PM:1 | PM:1 | MC:4 | HEC:3 |
|---|---|---|---|---|

FIG. 22

SIMULATION RESULT OF GSM

| GSM AVERAGE BER | PM (1BITS) THE NUMBER OF ERRORS | PM (3BITS) THE NUMBER OF ERRORS | PM (5BITS) THE NUMBER OF ERRORS |
|---|---|---|---|
| 1.56E-2 | 16451 | 11474 | 10575 |
| 6.04E-3 | 6517 | 3996 | 3334 |
| 1.03E-3 | 1076 | 642 | 557 |

FIG. 23

SIMULATION RESULT OF DECT

| DECT AVERAGE BER | PM (1BITS) THE NUMBER OF ERRORS | PM (3BITS) THE NUMBER OF ERRORS | PM (5BITS) THE NUMBER OF ERRORS |
|---|---|---|---|
| 1.46E-1 | 145649 | 83368 | 58428 |
| 2.30E-2 | 23182 | 10710 | 7067 |
| 2.64E-3 | 2633 | 1231 | 771 |

FIG. 24

TRANSMISSION WITH FREQUENCY SPACING

TRANSMISSION USING DIFFERENT SPREAD CODES

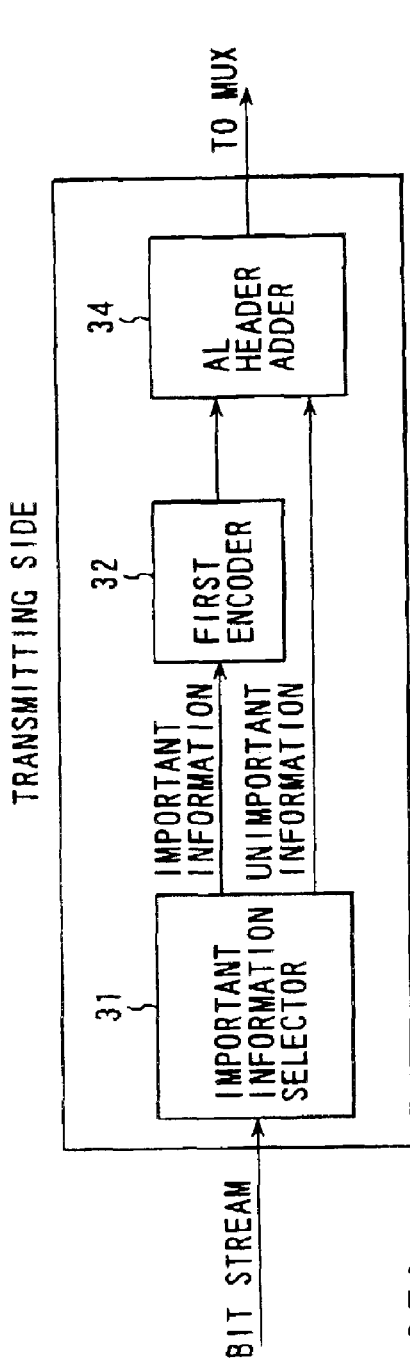
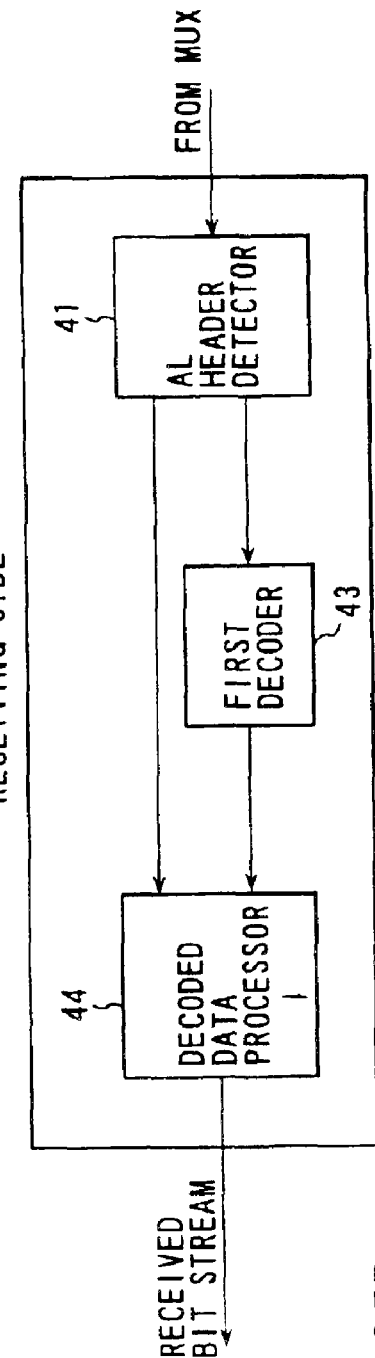
FIG. 35A
FIG. 35B

ENCODED DATA

INFORMATION DATA MULTIPLEX TRANSMISSION, SYSTEM, ITS MULTIPLEXER AND DEMULTIPLEXER, AND ERROR CORRECTION ENCODER AND DECODER

CROSS-REFERENCE TO RELATED APPLICATIONS

This application is a Rule 1.53(b) divisional application of U.S. patent application Ser. No. 09/242,539, entitled "INFORMATION DATA MULTIPLEX TRANSMISSION SYSTEM, ITS MULTIPLEXER AND DEMULTIPLEXER, AND ERROR CORRECTION ENCODER AND DECODER" filed on Feb. 18, 1999, now U.S. Pat. No. 6,490,243 based on International Application No. PCT/JP98/02749, filed on Jun. 19, 1998, and to which Applicants claim the benefit of priority under 35 U.S.C. § 120. Applicants also claim foreign priority benefits under 35 U.S.C. § 119 (a)–(d) or § 365 (a)–(b) based on Japanese Patent Application No. 9-17954, filed Jun. 19, 1997, and Japanese Patent Application No. 9-289753, filed Oct. 22, 1997. The contents of all of the above-identified applications are expressly incorporated herein by reference in their entirety.

TECHNICAL FIELD

The present invention relates to a multimedia information data multiplex transmission system for putting information data of a plurality of kinds each having an arbitrary information content into a single packet and conducting multiplexed radio transmission, and its multiplexer and demultiplexer. The present invention further relates to an error correction encoder and decoder suitable for application to this system.

BACKGROUND ART

For implementing radio multimedia, it is necessary to multiplex and transmit media information such as image data, voice data, additional data, and the like. Especially for giving and taking these kinds of information by using a mobile communication terminal, it is important that the information is made to be capable of being transmitted in a poor environment such as a multi-path fading environment.

Heretofore, ITU-T recommendation H.223 has been standardized as a scheme concerning multimedia multiplexing. This scheme implements multimedia multiplexing of packet multiplexing type in an existing telephone network. An example of H.223 is shown in FIG. 13A. In FIG. 13A, LCN represents logical channel, AL adaptation layer, PM packet marker, MUX and multiplexing.

Typically, in a MUX packet, a header is disposed at its head. In succession, four voice bytes (LCN1), one data byte (LCN2), two image (video) bytes (LCN3), one data byte (LCN2), and two image bytes (LCN3) are disposed in the cited order. In the example of FIG. 13A, however, image data finishes in the middle of a MUX packet, and consequently only one byte is accommodated in a two-byte capacity in the last LCN3. This is indicated by setting a PM bit in the next packet header to "1".

The format of the header is shown in FIG. 13B. With reference to FIG. 13B, by referring to an entry of a multiplex table in a four-bit MC (multiplex code) field, it is specified which media information is represented by each byte of an information field. A three-bit HEC (header error control) field provides an error detection function of the MC field using a three-bit CRC. (As for details, see "ITU-T Draft recommendation H.223, for example.)

By the way, H.223 has been determined on condition that multimedia multiplexing of packet multiplexing type is implemented in an existing telephone network having a comparatively fine transmission quality as described above. In order to raise the transmission efficiency, the header is protected by the three-bit CRC alone.

In radio multimedia communication, however, the transmission channel state is made poor by fading or the like. If it is attempted to apply H.223 to radio multimedia communication as it is, therefore, then such a situation cannot be coped with by the CRC of three bits or so, and header errors frequently occur. This results in a problem that contents of the multiplex table cannot be read and discard of MUX packets frequently occurs.

Furthermore, the length of the MUX packets is not always constant, but changes according to the information content of each media information as shown in the example of FIG. 13A as well. If packets of such a variable length are transmitted through a poor radio transmission channel, then packet synchronizing cannot be attained or the packet length cannot be found on the receiving side, resulting in frequent discard of MUX packets.

On the other hand, payloads containing information such as data, voice, and data cannot be decoded correctly either regardless of the received result of header information, if the radio transmission channel is brought into a poor state. Heretofore, therefore, there has been proposed such a scheme as to protect the payload by applying convolution encoding to information of each of image, voice, and data. (As for details, see, for example, "Proposal for High Level Approach of H.324/Annex C Mode 1", Q11-A-11b, ITU-T Q11/WP2/SG16, June 1997.)

If it is attempted to securely protect the information of the payload, however, it is necessary to encode all of the information to be protected, resulting in a lowered transmission efficiency. This is a serious problem especially in a system having a limited transmission band such as a mobile communication system.

As a scheme for putting information data of a plurality of kinds such as multimedia information into a packet and conducting multiplex transmission, there is a scheme standardized on condition that transmission is conducted via a wire telephone network as heretofore described. If this standardized scheme is employed as it is in a radio communication system, however, detection errors of header information are frequently caused on the receiving side by the poor transmission channel state. Since the multiplex table cannot be read, discard of packets frequently occur. Especially in the case where the packet length is variable, there occurs such a state that the packet synchronizing cannot be attained or the packet length cannot be recognized, resulting in a substantially disabled state in communication.

On the other hand, for the payload, there has been proposed such a scheme as to protect it by using an error correction code such as a convolutional code. If it is attempted to decode information securely on the receiving side by using a conventional scheme, however, the transmission efficiency of the information significantly falls. This poses an especially serious problem in a mobile communication system in which it is difficult to secure a wide transmission band.

DISCLOSURE OF INVENTION

A first object of the present invention is to provide an information data multiplex transmission system and its multiplexer and demultiplexer capable of reproducing header information favorably even in the case where transmission is conducted via a poor transmission channel, thereby reading the multiplex table accurately, and lowering the packet discard rate.

A second object of the present invention is to provide an information multiplex transmission system, its multiplexer and demultiplexer, an error correction encoder, and an error correction decoder capable of decoding and reproducing payloads securely without significantly deteriorating the transmission efficiency even in the case where transmission is conducted via a poor transmission channel, and thereby having a high transmission efficiency and excellent protection performance.

In order to achieve the above described first and second objects, the present invention provides the following configurations.

(1) In an information transmission system for inserting information into a packet and transmitting the packet, a transmitting side generates a plurality of error correction data making the information independently restorable, inserts these error correction data into a packet together with the information in a predetermined position relation, and transmits the packet.

If on the receiving side at least one of a plurality of error correction data can be received and reproduced, it becomes possible owing to such a configuration to correct transmission errors of information on the basis of the error correction data and reproduce the information. For example, even in a mobile communication system having a poor transmission channel quality, therefore, highly reliable information transmission can be conducted.

(2) In an information data multiplex transmission system for inserting a plurality of kinds of information data into one packet and conducting multiplex transmission, a transmitting side generates a plurality of header information pieces, each of the plurality of header information pieces including a multiplex code indicating disposition positions in the packet according to kinds of information data inserted in the packet and including error detection bits for detecting a receiving error of the multiplex code, causes each header information piece to include error correction data making the header information piece independently restorable, inserts header information pieces in predetermined positions of the packet, inserts the plurality of kinds of information data in positions of the packet indicated by the multiplex code, and transmits the packet.

In such a configuration, header are provided with an error correction capability. Even in a mobile communication system having a poor transmission channel quality, therefore, headers can be reproduced correctly. In addition, a plurality of headers are transmitted. If at least one of a plurality of headers can be received and reproduced, therefore, it becomes possible to correct transmission errors of information on the basis of the header and reproduce the information. As a result, packets discarded due to an unreadable multiplex table can be reduced. Even in a mobile communication system or the like having a poor transmission channel quality, therefore, highly reliable information transmission can be conducted.

(3) In the configuration of (2), multiplexing is effected while conducting processing so as to make all packets have a predetermined length. In other words, the packet length is made to be a fixed length. Owing to such a configuration, configuration of the encoding and decoding means can be simplified.

(4) In the configuration of (2), a receiving side extracts one out of a plurality of header information pieces inserted in a packet, conducts error detection and error correction, and, if error correction is impossible, extracts another header information piece and conducts error detection and error correction, and repetitively executes processing of extracting another header information piece and conducting error detection and error correction for all header information pieces until errorless header information piece is reproduced.

By doing so, an errorless header information piece out of a plurality of header information pieces can be reproduced.

(5) If all header information pieces cannot be corrected in error in the configuration of (4), all header information pieces are subjected together to error correction processing using a coupled code.

Even if all header information pieces cannot be individually reproduced, such a configuration makes it possible to reproduce the header information by conducting error correction on all header information pieces collectively.

(6) In an information data multiplexing apparatus of a transmitting apparatus used in an information data multiplex transmission system for inserting a plurality of kinds of information data into one packet and conducting multiplex transmission, the information data multiplexing apparatus includes: an information content estimation means for estimating information amounts respectively of the plurality of kinds of information data; a multiplex code generation means for generating a first multiplex code indicating disposition positions in the packet on the basis of the information amounts of respective information data estimated by the information content estimation means, and further generating a second multiplex code having a fixed relation with the first multiplex code; a header information generation means for adding error detection and correction code data for detecting and correcting receiving errors to each of the first and second multiplex codes generated by the multiplex code generation means and thereby generating first and second header information; and a packet generation means for storing the information data to be transmitted in the packet together with the first and second header information on the basis of the multiplex codes.

The apparatus of the transmitting side has such a configuration. Even if in the apparatus of the receiving side the first multiplex code cannot be reproduced by itself, therefore, it becomes possible to reproduce the first multiplex code on the basis of the second multiplex code. On the basis of the reproduced multiplex code, each information data can be taken out from the packet.

(7) In the configuration of (6), a parity of the first multiplex code is used as the second multiplex code. In other words, a concatenated code with respect to the first multiplex code is used as the second multiplex code.

(8) and (9) As a concrete example of the concatenated code, a convolutional code and a Hamming code can be mentioned. If a convolutional code is used, the most likelihood decoding scheme can be used. As a result, the error correction capability can be raised. If a Hamming code is used, decoding means complying with H.223 already has an error detection function using the Hamming code, and hence existing decoding means complying with H.223 advantageously need only to be provided with an error correction function.

(10) and (11) As the configuration of the packet generation means, such a configuration as to store the first and second header information in an identical packet, and such a configuration as to store the first and second header information in different packets are conceivable. The former one has an advantage that the insertion and reproduction of header information can be simplified. The latter one has an advantage that the error correction capability against burst errors can be kept high by making time distance between the header information pieces long and thereby providing an interleaving effect.

(12) In the configuration of (6), it is desirable that the multiplex code generation means determines the multiplex codes so as to make all packets have a predetermined length. By doing so, fixed-length packets can be transmitted. In a mobile communication system, highly reliable packet transmission can be effected.

(13) In an information data demultiplexing apparatus of a receiving apparatus used in an information data multiplex transmission system for inserting a plurality of kinds of information data having arbitrary information amounts into one packet and conducting multiplex transmission, it is now assumed that first and second header information pieces having a multiplex code indicating disposition positions in the packet according to the plurality of kinds of information data and error detection and correction code data for detecting and correcting receiving errors of the multiplex code are stored in the packet, and the plurality of information data are stored in positions of the packet indicated by the multiplex code.

At this time, an information data demultiplexing apparatus of a receiving apparatus includes a header information extraction means for selectively extracting the first and second information pieces from the packet, and first, second, and third demultiplexing means.

First, the first demultiplexing means conducts error detection on the first header information piece. If there are no errors, the first demultiplexing means demultiplexes and outputs the plurality of information data from the packet on the basis of the multiplex code included in the header information piece. When an error is detected by the first demultiplexing means, a second demultiplexing means conducts error correction of the first header information piece and then conducts error detection again. If there are no errors, the second demultiplexing means demultiplexes and outputs the plurality of information data from the packet on the basis of the multiplex code included in the header information piece corrected in error. Furthermore, when an error is detected by the second demultiplexing means as well, the third demultiplexing means conducts error detection of the second header information piece. If there are no errors, the third demultiplexing means demultiplexes and outputs the plurality of information data from the packet on the basis of the multiplex code included in the header information piece.

According to the error occurrence state, the first, second and third demultiplexing means are thus used by stages in order to demultiplex the information data. For example, in such a state that the transmission channel quality is poor, therefore, all of the first to third demultiplexing means are used, and the error detection and error correction of three stages are conducted, accurate information data demultiplexing being made possible. On the other hand, in such a state that the transmission quality is comparatively fine, demultiplexing of the information data can be conducted in a short time.

(14) In the configuration of (13), a fourth demultiplexing means is provided. When an error is detected by the third demultiplexing means, the fourth demultiplexing means conducts error correction of the second header information piece and then conducts error detection again. If there are no errors, the fourth demultiplexing means demultiplexes and outputs the plurality of information data from the packet on the basis of the multiplex code included in the header information piece corrected in error.

(15) In the configuration of (14), a fifth demultiplexing means is further provided. When an error is detected by the fourth demultiplexing means, the fifth demultiplexing means conducts error correction of the first header information piece and the second header information piece collectively and then conducts error detection again. If there are no errors, the fifth demultiplexing means demultiplexes and outputs the plurality of information data from the packet on the basis of the multiplex code included in the first or second header information piece corrected in error.

Even in a case where the transmission channel quality is very poor and the first to third demultiplexing means cannot demultiplex the information data, it becomes possible in the configuration heretofore described to restore the header information by using the fourth and fifth demultiplexing means. As a result, accurate demultiplexing of the information data becomes possible.

(16) When in the configuration of (2) the header information piece includes a packet marker representing a continuation state between packets, a multiplex code field specifying kinds of information data inserted in the packet, and a header error control field having an error detection function, the transmitting side includes means for inserting a plurality of the packet markers in the header information piece repetitively. The receiving side includes means for conducting a majority decision on the plurality of packet markers and reproducing one correct packet marker.

Owing to such a configuration, it becomes possible on the receiving side to reproduce a correct packet marker by using such an extremely simple configuration that a plurality of packet markers are inserted. Even under such a condition that the transmission quality is poor, therefore, packets can be recognized correctly and packet discard ratio can be reduced.

(17) In an information data multiplex transmission system for inserting a plurality of kinds of information data having arbitrary information amounts into one packet, inserting header information including at least a multiplex code indicating disposition positions of the plurality of kinds of informations data within the packet into the packet, and conducting multiplex transmission, the transmitting side includes a means for adding an error correction code formed of a Reed-Solomon code to at least one of the plurality of kinds of information data.

The receiving side includes a means for conducting error correction decoding processing on the plurality of kinds of information data which have been received, on the basis of error correction codes added to the information data and thereby reproducing the plurality of kinds of information data.

(18) An information data transmitting apparatus includes an error detection code addition means for adding an error detection code to first information data to be transmitted and outputting second information data; an error correction encoding means for encoding the second information data output from the error detection code addition means, by using an error correction code formed of a Reed-Solomon code and outputting third information data; and a header addition means for adding a control header having control information representing a transmission form of the information data inserted therein to the third information data output from the error correction encoding means.

In such a configuration, error correction can be conducted on the information data while taking a symbol as the unit by using an error correction code formed of a Reed-Solomon code. As a result, it becomes possible to effectively protect the information data from burst errors.

(19) In the configuration of (18), the error correction encoding means conducts error correction encoding on the second information data by using a Reed-Solomon code over $GF(2^8)$.

This configuration is effective in the case where the information data length is a fixed length. Furthermore, by using a Reed-Solomon code over $GF(2^8)$, error correction encoding and decoding processing taking 8 bits as the unit becomes possible. Therefore, it is also possible to assure the conformity with H.223 which is an existing scheme.

(20) In the configuration of (18), the error correction encoding means conducts error correction encoding on the second information data by using a shortened Reed-Solomon code.

By using a shortened Reed-Solomon code, the present invention can be applied to variable-length information data as well. In other words, in multimedia communication including images, a variable-length encoding scheme is typically adopted as the image encoding scheme. Therefore, the information data length varies from frame to frame. By conducting error correction encoding by using a shortened Reed-Solomon code, however, the length variation of the information data can also be coped with.

(21) In the configuration of (20), the error correction encoding means includes: an encoder main body for conducting error correction encoding processing on the second information data which has been shift-input by using a shortened Reed-Solomon code; and an order reversal means for shift-inputting a plurality of information elements forming the second information data to the encoder main body in descending order of term degree of an information polynomial and causing the information elements to be subjected to error correction encoding processing.

Owing to such a configuration, a shortened Reed-Solomon encoding processing can be implemented while using a general purpose Reed-Solomon encoder as it is.

(22) In the configuration of (20), the error correction encoding means includes an encoder main body for conducting error correction encoding processing on the second information data which has been shift-input by using a Reed-Solomon code; a comparison means for comparing a length of the second information data with a predetermined fixed length; a null code addition means; and a null code deletion means. If the length of the second information data is judged to be shorter than the fixed length by the comparison means, the null code addition means adds a null code sequence having a length corresponding to a difference to the second information data, shift-inputs the second information data having the null code sequence thus added thereto to the encoder main body, and causes the error correction encoding processing. The null code deletion means deletes a null code sequence corresponding to the null code sequence added by the null code addition means from the information data subjected to error correction decoding in the encoder main body, and outputting a shortened third information data.

Owing to such a configuration, error correction encoding using a shortened Reed-Solomon code can be implemented.

(23) In an information data multiplex transmission system for inserting a plurality of kinds of information data into one packet, inserting header information including at least a multiplex code indicating disposition positions of the plurality of kinds of informations data within the packet into the packet, and conducting multiplex transmission, the transmitting side includes a means for adding an error correction code to first information data to be transmitted, then adding an error correction code formed of a shortened Reed-Solomon code over $GF(2^8)$ to the information data having the error correction code thus added thereto, further adding a control header having control information representing a transmission form of the information data inserted therein to the information data thus output, and transmitting resultant information data.

The receiving side includes a means for conducting error correction decoding processing on the information data which has been received, on the basis of error correction code formed of the shortened Reed-Solomon code over $GF(2^8)$ added to the information data and thereby reproducing the information data.

(24) An information data transmitting apparatus includes: an error detection code addition means for adding an error detection code to first information data to be transmitted and outputting second information data; an error correction encoding means for encoding the second information data output from the error detection code addition means, by using an error correction code formed of a shortened Reed-Solomon code over $GF(2^8)$ and outputting third information data; and a header addition means for adding a control header having control information representing a transmission form of the information data inserted therein to the third information data output from the error correction encoding means.

In the configuration of (23) and (24), the information data can be effectively protected from burst errors by using a Reed-Solomon code. In addition, since a shortened Reed-Solomon code is used, the configuration can be applied to variable-length Reed-Solomon code as well. Furthermore, by using a Reed-Solomon code over $GF(2^8)$, error correction encoding and decoding processing while taking 8 bits as the unit becomes possible. As a result, the conformity with H.223 which is an existing scheme can be ensured.

(25) In a receiving apparatus for communicating with a transmitting apparatus, the transmitting apparatus generating a first parity signal formed of arbitrary elements according to a first encoding rule with respect to a transmitting signal formed of an arbitrary number of elements, generating a second parity signal formed of an arbitrary number of elements according to a second encoding rule with respect to at least a part of the transmitting signal and the first parity signal, and generating and transmitting a transmitting encoded signal by combining the transmitting signal and the first and second parity signals, the receiving apparatus includes: a means for receiving the transmitting encoded signal and outputting a received encoded signal including the first and second parity signals; a first decoding means for conducting most likelihood decoding on the received encoded signal including the first parity signal; a second decoding means for conducting most likelihood decoding on a received encoded signal including the first parity signal; a second decoding means for conducting most likelihood decoding on a received encoded signal including the second parity signal; and a means for calculating distance values respectively between decoded signals obtained by the first and second decoding means and the received signal, and reproducing the transmitting encoded signal on the basis of the decoded signal corresponding to a shorter distance.

Owing to such a configuration, the received encoded signal including the first parity signal and the received encoded signal including the second parity signal are decoded by using the most likelihood decoding scheme having a high error correction capability. In addition, on the basis of a decoded signal having higher reliability out of the two decoded signals thus obtained, the transmitted encoded signal is reproduced. As a result, highly reliable signal reproduction can be conducted.

(26) In a receiving apparatus for communicating with a transmitting apparatus, the transmitting apparatus generating a first parity signal formed of arbitrary elements according to a first encoding rule with respect to a transmitting signal formed of an arbitrary number of elements, generating a second parity signal formed of an arbitrary number of elements according to a second encoding rule with respect to at least a part of the transmitting signal and the first parity signal, and generating and transmitting a transmitting encoded signal by combining the transmitting signal and the first and second parity signals, the receiving apparatus includes: a means for receiving the transmitting encoded signal and outputting a received encoded signal including the first and second parity signals; a first amending and decoding means for amending the received encoded signal including the first parity signal on the basis of a first amending signal, then conducting most likelihood decoding on a resultant signal, outputting a decoded signal together with information representing reliability of the decoded signal, and using the reliability information as the first amending signal; a second amending and decoding means for amending the received encoded signal including the second parity signal on the basis of a second amending signal, then conducting most likelihood decoding on a resultant signal, outputting a decoded signal together with information representing reliability of the decoded signal, and using the reliability information as the second amending signal; and a control means for causing the amending and decoding processing to be repetitively conducted by the first amending and decoding means a predetermined number of times and causing the amending and decoding processing to be repetitively conducted by the second amending and decoding means a predetermined number of times, and reproducing the transmitting encoded signal on the basis of the received encoded signal, the first amendment, and the second amendment.

Owing to such a configuration, the received encoded signal including the first parity signal and the received encoded signal including the second parity signal are decoded by using the most likelihood decoding scheme having an input amending function according to the reliability information. As compared with the case where the most likelihood decoding is simply conducted, further highly reliable signal reproduction can be implemented.

(27) In an information data multiplex transmission system for inserting a plurality of kinds of information data having arbitrary information amounts into one packet and conducting multiplex transmission, the transmitting side includes: a first encoding means for generating a first parity signal formed of arbitrary elements according to a first encoding rule with respect to a first transmitting signal formed of an arbitrary number of elements; a first interleaving means for altering order of elements of the first transmitting signal; a second encoding means for generating a second parity signal formed of arbitrary elements according to a second encoding rule with respect to a second transmitting signal altered in element order by the first interleaving means; and a means for generating and transmitting a transmitting encoded signal including the first transmitting signal and the first and second parity signals.

The receiving side includes: a means for receiving the transmitting encoded signal, and outputting a received encoded signal including the first received signal, the first received parity signal, and the second parity signal; a first decoding means for adding an adjustment signal formed of an arbitrary number of elements to the first received signal and the first received parity signal, thereby generating a first decoding input signal, and generating a decoding output signal from the first decoding input signal; a first amending means for amending the adjustment signal on the basis of the first decoding output signal; a second interleaving means for conducting interleaving processing on the first received signal, and outputting a second received signal; a second decoding means for adding the adjustment signal to the second received signal and the second received parity signal, thereby generating a second decoding input signal, and generating a second decoding output signal from the second decoding input signal; a second amending means for amending the adjustment signal on the basis of the second decoding output signal; a control means for causing the generation processing of the first decoding output signal in the first decoding means and amending processing of the adjustment signal in the first amending means, and the generation processing of the second decoding output signal in the second decoding means and amending processing of the adjustment signal in the second amending means to be repetitively executed a predetermined number of times; and a means for setting so as to change the number of times of repetition for specific elements of the first and second received signals.

In such a configuration, a favorable effect can be obtained against burst errors by conducting interleaving, in the same way as the case where a plurality of header information pieces are transmitted at time intervals. In addition, in the case where a plurality of header information pieces are transmitted at time intervals, the effect against burst errors is lowered if the packet length is short. Even if the packet length is short, however, a sufficient effect is obtained by conducting interleaving.

(28) In a multiplexing apparatus of an information data multiplex transmission system for inserting a plurality of kinds of information data into one packet and conducting multiplex transmission, the multiplexing apparatus includes: a division means for dividing each of the plurality of kinds of information data into an important part and an unimportant part; a first error correction encoding means for conducting error correction encoding on the important part resulting from the division in the division means by using a first error correction code; a header generation means for generating first header information representing a boundary between encoded information data of the important part yielded by the first error correction encoding means and the unimportant data; a second error correction encoding means for conducting error correction encoding on a new information data group including the encoded information data of the important part yielded by the first error correction encoding means, the first header information, and information data of the unimportant part, by using a second error correction code; a multiplexing means for inserting encoded information data groups corresponding to the plurality of kinds of information data, yielded by the second error correction encoding means into predetermined positions of the packet, respectively; and a means for adding second header information representing a multiplexing state to the encoded information data groups multiplexed by the multiplexing means.

Owing to such a configuration, it becomes possible to provide an especially important part of the information data with a double error correction function. As compared with case where all information data are subjected to error correction coding under the same condition, therefore, the information data can be transmitted with a high quality without lowering the transmission efficiency.

(29) In (28), the header generation means has a function of generating an error detection code for conducting error detection on the first header information; and the second error correction encoding means conducts error correction encoding on a new information data group including the encoded information data of the important part yielded by the first error correction encoding means, the first header information and the error detection code thereof, and the information data of the unimportant part, by using the second error correction code.

By doing so, it is possible to provide the first header information representing the code length of the information data encoded by using the first error correction code.

(30) In the configuration of (28), the multiplexing apparatus further includes: an acquisition means for acquiring information representing a quality of a transmission channel; and an encoding control means for supplying the new information group to the multiplexing means without conducting the second error correction encoding if the quality of the transmission channel acquired by the acquisition means is better than a predetermined quality.

Owing to such a configuration, the second error correction encoding processing is omitted in the case where the transmission channel is comparatively fine. As a result, the processing delay caused by the decoding processing can be reduced.

(31) In a demultiplexing apparatus of an information data multiplex transmission system for inserting a plurality of kinds of information data into one packet and conducting multiplex transmission, the demultiplexing apparatus includes: a demultiplexing means for demultiplexing a plurality of kinds of encoded information data groups inserted in a received packet, on the basis of second header information representing a multiplex state thereof; a second error correction decoding means for conducting second error correction decoding processing on each of the plurality of kinds of encoded information data groups demultiplexed by the demultiplexing means; a first error correction decoding means for dividing each of the decoded information data groups yielded by the second error correction decoding means into encoded information data of an important part and decoded information data of an unimportant part on the basis of first header information included in the decoded information data group, and conducting first error correction decoding processing on the encoded information data of the important part; and a means for reproducing original information data from decoded information data of the important part yielded by the first error correction decoding means and the decoded information data of the unimportant part.

Even if the transmission channel quality is poor, such a configuration makes it possible to reproduce the encoded data of the important part accurately by conducting the error correction decoding processing. As a result, the original data can be reproduced to such a degree that the user can at least decipher it.

(32) In a multiplexing apparatus of an information data multiplex transmission system for inserting a plurality of kinds of information data into one packet and conducting multiplex transmission, the multiplexing apparatus includes: a division means for dividing each of the plurality of kinds of information data into an important part and an unimportant part; an error correction encoding means for conducting error correction encoding on the important part resulting from the division in the division means by using an error correction code; a header generation means for generating first header information representing a boundary between encoded information data of the important part yielded by the error correction encoding means and information data of the unimportant part; a multiplexing means for inserting new information data each including the encoded information data of the important part yielded by the error correction encoding means, the header information generated by the header generation means, and the information data of the unimportant part, into predetermined positions of the packet, respectively; and a means for adding second header information representing a multiplexing state thereof to the new information data multiplexed by the multiplexing means and transmitting resulting information data.

Owing to such a configuration, it becomes possible to provide an important part of the information data with an error correction function. As compared with case where all information data are subjected to error correction coding under the same condition, therefore, the information data can be efficiently protected against errors without lowering the transmission efficiency.

(33) In the configuration of (32), the header generation means has a function of generating an error detection code for conducting error detection of the first header information, and the multiplexing means inserts new information data each including the encoded information data of the important part yielded by the error correction encoding means, the first header information generated by the header generation means, and the information data of the unimportant part, into predetermined positions of the packet, respectively.

By doing so, an error of the first header information can be detected in the apparatus of the receiving side.

(34) In a demultiplexing apparatus of an information data multiplex transmission system for inserting a plurality of kinds of information data into one packet and conducting multiplex transmission, the demultiplexing apparatus includes: a demultiplexing means for demultiplexing a plurality of kinds of information data groups inserted in a received packet, on the basis of second header information representing a multiplex state thereof; an error correction decoding means for dividing each of the plurality kinds of information data groups demultiplexed by the demultiplexing means into encoded information data of an important part and information data of an unimportant part on the basis of first header information included in the information data group, and conducting error correction decoding processing on the encoded information data of the important part; and a means for reproducing original information data from decoded information data of the important part yielded by the error correction decoding means and the information data of the unimportant part.

(35) In an error correction encoding apparatus provided in an information transmission apparatus, the error correction encoding apparatus includes: a first error correction encoding means for generating a first inspection signal sequence for a first information signal sequence and a second information signal sequence requiring more intense error protection than the first information signal sequence; a transmitting interleaving means for changing element order of the second information signal sequence; a second error correction encoding means for generating a second inspection signal sequence for the second information signal sequence changed in order by the transmitting interleaving means; and a transmitting means for transmitting an encoded signal including the first and second information signal sequences and the first and second inspection signal sequences onto a transmission channel.

In such an error correction encoding apparatus, it is possible to conduct double error correction encoding on the second information signal which is included and the transmission information and which requires intense error protection.

(36) In an error correction decoding apparatus for receiving and decoding the encoded signal transmitted from the error correction encoding apparatus described in (35), the error correction decoding apparatus includes:

a first error correction decoding means for conducting error correction decoding on the first and second information signal sequences included in the received encoded signal, on the basis of the first inspection signal sequence included in the encoded signal, and outputting first and second decoded information signal sequences; a receiving interleaving means for changing element order of the second decoded information signal sequence output from the first error correction decoding means; a second error correction decoding means for conducting error correction decoding on the second decoded information signal sequence changed in order by the receiving interleaving means, on the basis of the second inspection signal sequence included in the received encoded signal, and outputting the second decoded information signal sequence further subjected to the error correction; and a receiving de-interleaving means for restoring the second decoded information signal sequence output from the second error correction decoding means, to the original element order.

(37) In an error correction decoding apparatus for receiving and decoding the encoded signal transmitted from the error correction encoding apparatus described in (35), the error correction decoding apparatus includes: a receiving interleaving means for changing element order of the second decoded information signal sequence included in the received encoded signal; a second error correction decoding means for conducting error correction decoding on the second decoded information signal sequence changed in order by the receiving interleaving means, on the basis of the second inspection signal sequence included in the received encoded signal, and outputting the second decoded information signal sequence; a receiving de-interleaving means for restoring the second decoded information signal sequence output from the second error correction decoding means, to the original element order; and a first error correction decoding means for conducting error correction decoding on the second decoded information signal sequence output from the receiving de-interleaving means and the first information signal sequence included in the received encoded signal, on the basis of the first inspection signal sequence included in the received encoded signal, and outputting the first decoded information signal sequence and the second decoded information signal sequence further subjected to the error correction.

In the error correction decoding apparatuses described in (36) and (37), it is possible to conduct double error correction decoding on the second information signal which is included in the information signals transmitted from the transmitting side and which requires intense error protection. As a result, highly reliable information decoding can be conducted while suppressing the degradation of the transmission efficiency.

(38) In the configuration of (36) or (37), the first and second error correction decoding means has an iterative decoding function of iterating the error correction decoding processing between them at least once.

By providing such a function, further highly reliable decoding becomes possible.

(39) In the configuration of (38), the error correction decoding apparatus further includes an iteration control means for determining number of times of iteration according to at least one of a demanded error correction capability and a permitted processing delay amount, and setting the determined number of times of iteration into the first and second error correction decoding means.

By providing such a means, optimum iterative decoding processing is conducted according to the demanded error correction capability and the permitted processing delay amount.

(40) In the configuration of (35), the error correction decoding apparatus includes, besides the first and second error correction decoding means, a third error correction decoding means for iterating error correction decoding processing between the first error correction decoding means and the second error correction decoding means at least once, and outputting the first and second decoded information signal sequences thus subjected to iterative decoding; and a selection means for selecting one of the first, second, and third error correction decoding means on the basis of at least one of a transmission channel state and a property of the transmitted information signal sequences, and causing error correction decoding processing to be conducted.

(41) The error correction decoding apparatus includes, besides the first and second error correction decoding means provided in the error correction decoding apparatus of (35), a third error correction decoding means for iterating error correction decoding processing between the first error correction decoding means and the second error correction decoding means at least once, and outputting the first and second decoded information signal sequences thus subjected to iterative decoding; and a selection means for selecting one of the first, second, and third error correction decoding means on the basis of at least one of a transmission channel state and a property of the transmitted information signal sequences, and causing error correction decoding processing to be conducted.

In the error correction decoding apparatuses of (40) and (41), optimum error correction decoding means is selected according to the transmission channel state at each time and the property of the transmitted information signal, and the information signal is decoded.

(42) In an error correction encoding apparatus for conducting error correction encoding on a first information signal sequence and a second information signal sequence requiring more intense error protection than the first information signal sequence, and transmitting the encoded first information signal sequence and second information signal sequence, the error correction encoding apparatus includes: a transmitting interleaving means for changing element order of the second information signal sequence; a first error correction encoding means for generating a first inspection signal sequence for the second information signal sequence changed in order by the transmitting interleaving means and the first information signal sequence; a second error correction encoding means for generating a second inspection signal sequence for the second information signal sequence; and a transmitting means for transmitting an encoded signal including the first and second information signal sequences and the first and second inspection signal sequences onto a transmission channel.

When inputting the second information signal sequence to the second error correction encoding means, it is input as it is, in such a configuration. When inputting the first and second information signal sequences to the first error correction encoding means, interleaving is conducted on the second information signal sequence. In the case where it is attempted to reproduce on the receiving side only the second information signal sequence, therefore, it can be advantageously reproduced by simple processing without conducting interleaving and de-interleaving.

(43) In an error correction decoding apparatus for receiving and decoding the encoded signal transmitted from the error correction encoding apparatus of (42), the error correction decoding apparatus includes: a second error correction decoding means for conducting error correction decoding on the second information signal sequence included in the received encoded signal, on the basis of the second inspection signal sequence included in the encoded signal, and outputting a second decoded information signal sequence; a receiving interleaving means for changing element order of the second decoded information signal sequence output from the second error correction decoding means; a second error correction decoding means for conducting error correction decoding on the second decoded information signal sequence changed in order by the receiving interleaving means and the first information signal sequence included in the received encoded signal, on the basis of the first inspection signal sequence included in the received encoded signal, and outputting a first decoded information signal sequence and the second decoded information signal sequence further subjected to the error correction; and a receiving de-interleaving means for restoring the second decoded information signal sequence output from the second error correction decoding means, to the original element order.

In such a configuration, double error correction decoding processing is conducted on the second information signal sequence having high importance by the second and first error correction decoding means. For example, in such a state that the transmission channel quality is degraded as in a mobile communication system, therefore, the possibility that at least the second information signal sequence can be decoded correctly becomes high.

(44) In an error correction decoding apparatus for receiving and decoding the encoded signal transmitted from the error correction encoding apparatus of (42), the error correction decoding apparatus includes: a second error correction decoding means for conducting error correction decoding on the second information signal sequence included in the received encoded signal, on the basis of the second inspection signal sequence included in the encoded signal, and outputting a second decoded information signal sequence; a receiving interleaving means for changing element order of the second decoded information signal sequence output from the second error correction decoding means; a second error correction decoding means for conducting error correction decoding on the second decoded information signal sequence changed in order by the receiving interleaving means and the first information signal sequence included in the received encoded signal, on the basis of the first inspection signal sequence included in the received encoded signal, and outputting a first decoded information signal sequence and the second decoded information signal sequence further subjected to the error correction; and a receiving de-interleaving means for restoring the second decoded information signal sequence output from the second error correction decoding means, to the original element order.

In such a configuration as well, double error correction decoding processing is conducted on the second information signal sequence having high importance by the second and first error correction decoding means. Even in the case where the transmission channel quality is degraded, therefore, the possibility that the second information signal sequence can be decoded correctly becomes high.

(45) In the configuration of (43) or (44), the first and second error correction decoding means has an iterative decoding function of iterating the error correction decoding processing between them at least once.

In such a configuration, decoding utilizing the iteration of the most likelihood decoding is conducted in the first and second error correction decoding means. Therefore, decoding having a further higher error correction capability can be effected. Even in the case where a transmission channel having a poor quality is used, transmission of a high quality can be effected.

(46) In the configuration of (43) or (44), the error correction decoding apparatus further includes an iteration control means for determining number of times of iteration according to at least one of a demanded error correction capability and a permitted processing delay amount, and setting the determined number of times of iteration into the first and second error correction decoding means.

Even if the demanded error correction capability or the permitted processing delay amount is altered after the receiving apparatus is put in service, an optimum number of times of iteration can always be determined by the iteration control means in such a configuration.

(47) In an error correction decoding apparatus for receiving and decoding the encoded signal transmitted from the error correction encoding apparatus of (42), the error correction decoding apparatus includes: a second error correction decoding means for conducting error correction decoding on the second information signal sequences included in the received encoded signal, on the basis of the second inspection signal sequence included in the encoded signal, and outputting a second decoded information signal sequence; a second error correction decoding means for conducting error correction decoding on a signal sequence obtained by conducting interleaving on the second decoded information signal sequence output from the second error correction decoding means, and the first information signal sequence included in the received encoded signal, on the basis of the first inspection signal sequence included in the received encoded signal, thereby yielding a first decoded information signal sequence and the second decoded information signal sequence further subjected to the error correction, conducting de-interleaving on the second decoded information signal sequence, and outputting the first decoded information signal sequence and the second decoded information signal sequence thus interleaved; a third error correction decoding means for iterating error correction decoding processing between the first error correction decoding means and the second error correction decoding means at least once, and outputting the first and second decoded information signal sequences thus subjected to iterative decoding; and a selection means for causing the error correction decoding processing using only the first error correction decoding means, the error correction decoding processing using the first and second error correction decoding means, and the error correction decoding processing using the first, second, and third error correction decoding means to be selectively executed, on the basis of at least one of a transmission channel state and a property of the transmitted information signal sequences.

(48) In an error correction decoding apparatus for receiving and decoding the encoded signal transmitted from the error correction encoding apparatus of (42), the error correction decoding apparatus includes: a first error correction decoding means for conducting error correction decoding on a signal sequence obtained by conducting interleaving on the second decoded information signal sequence included in the received encoded signal, and the first information signal sequence included in the received encoded signal, on the basis of the first inspection signal sequence included in the received encoded signal, and outputting first and second decoded information signal sequence; a second error correction decoding means for conducting de-interleaving the second decoded information signal sequence output from the first error correction decoding means, then conducting error correction decoding on the second decoded information signal sequence thus de-interleaved, on the basis of the second inspection signal sequence included in the received encoded signal, and outputting the second decoded information signal sequence further subjected to the error correction; a third error correction decoding means for iterating error correction decoding processing between the first error correction decoding means and the second error correction decoding means at least once, and outputting the first and second decoded information signal sequences thus subjected to iterative decoding; and a selection means for causing the error correction decoding processing using only the first error correction decoding means, the error correction decoding processing using the first and second error correction decoding means, and the error correction decoding processing using the first, second, and third error correction decoding means to be selectively executed, on the basis of at least one of a transmission channel state and a property of the transmitted information signal sequences.

In the configurations of (47) and (48), the error correction decoding processing using only the first error correction decoding means, the error correction decoding processing using the first and second error correction decoding means, and the error correction decoding processing using the first, second, and third error correction decoding means are selectively conducted on the basis of the transmission channel state or the property of the transmitted information signal sequences. According to the transmission channel state at each time and the property of the transmitted information signal sequences, therefore, optimum error correction decoding processing is always effected. As a result, efficient error correction decoding having a high error correction capability can be conducted.

(49) In the configuration of (35) or (42), unimportant information requiring a predetermined transmission quality is assigned to the first information signal sequence, and important information requiring a higher transmission quality than the first information signal sequence is assigned to the second information signal sequence.

In the case where, for example, image data are transmitted, important information such as various kinds of control information, movement prediction information, and low frequency components of the discrete cosine transform (DCT) is assigned to the second information signal sequence, and unimportant information such as high frequency components of the DCT is assigned to the first information signal sequence, in such a configuration. Even under such a condition that the transmission quality is poor, at least various kinds of information which is important in forming images can be reproduced correctly. As a result, images which are sufficiently decipherable can be reconstructed. Furthermore, as compared with the case where all kinds of information are transmitted as the second information signal sequence, a high transmission efficiency can be ensured.

(50) In the configuration of (35) or (42), information transmitted by using a first transmission scheme having a predetermined intensity against transmission errors is assigned to the first information signal sequence, and information transmitted by using a second transmission scheme having an intensity against transmission errors lower than that of the first transmission scheme is assigned to the second information signal sequence.

An information signal transmitted by using a modulation scheme having a short distance between signal points, such as 16 QAM scheme or 64 QAM scheme, is susceptible to errors. In such a configuration, therefore, this information signal is transmitted as the second information signal sequence. On the other hand, since an information signal transmitted by using a modulation scheme having a long distance between signal points, such as QPSK scheme, is not susceptible to errors, this information signal can be transmitted as the first information signal sequence. By doing so, it is possible to provide all information signals with a uniform error correction capability and transmit them.

(51) The error correction encoding apparatus includes: a first error correction encoding means for generating a first two-dimensional inspection block having $(N-K) \times L$ elements in a horizontal direction of a first two-dimensional information block having $K \times L$ elements, in accordance with a first error correction encoding rule; a second error correction encoding means for generating a second two-dimensional inspection block having $K2 \times (M-L)$ elements in a vertical direction of a second two-dimensional information block having $K2 \times L$ elements (where $K > K2$) requiring especially intense error protection included in the first two-dimensional information block, in accordance with a second error correction encoding rule; and a transmitting means for transmitting an encoded signal including the first two-dimensional information block and the first and second inspection blocks onto a transmission channel.

In such a configuration, information can be handled by taking a block as the unit. Therefore, error correction encoding, decoding and transmission suitable for such a system that an information signal sequence is transmitted by taking a byte or an octet as the unit. In addition, error correction is conducted for the whole of the first information block in the horizontal direction. For the second information block having especially high importance in the first information block, error correction is conducted for its vertical direction. As compared with the case where error correction of the horizontal direction and the vertical direction is conducted for the whole of the information block, efficient error correction decoding processing can be conducted by only adding a small number of inspection blocks.

(52) In an error correction decoding apparatus for receiving and decoding the encoded signal transmitted from the error correction encoding apparatus of (51), the error correction decoding apparatus includes: a first error correction decoding means for conducting error correction decoding for the horizontal direction of the first two-dimensional information block included in the received encoded signal, on the basis of the first two-dimensional inspection block included in the encoded signal, and outputting a first decoded two-dimensional information block; and a second error correction decoding means for conducting error correction decoding for the vertical direction of an information block included in the first decoded two-dimensional information block output the first error correction decoding means, corresponding to the second two-dimensional information block, on the basis of the second two-dimensional inspection block included in the received encoded signal, and outputting a second decoded two-dimensional information block.

In such a configuration, double error correction decoding processing is conducted on the second two-dimensional information block having high importance by the second and first error correction decoding means. Even in such a state that the transmission channel quality is degraded as in a mobile communication system, therefore, the possibility that at least the second two-dimensional information block can be decoded correctly becomes high.

(53) In an error correction decoding apparatus for receiving and decoding the encoded signal transmitted from the error correction encoding apparatus of (51), the error correction decoding apparatus includes: a second error correction decoding means for conducting error correction decoding for the vertical direction of an information block included in the received encoded signal, corresponding to the second two-dimensional information block, on the basis of the second two-dimensional inspection block included in the received encoded signal, and outputting a second decoded two-dimensional information block; and a first error correction decoding means for conducting error correction decoding for the horizontal direction of the second decoded two-dimensional information block output from the second error correction decoding means and the first two-dimensional information block included in the received encoded signal, on the basis of the first two-dimensional inspection block included in the encoded signal, and outputting a first decoded two-dimensional information block, and the second decoded two-dimensional information block further subjected to the error correction.

In such a configuration as well, double error correction decoding processing is conducted on the second two-dimensional information block having high importance by the second and first error correction decoding means. Even in such a state that the transmission channel quality is degraded as in a mobile communication system, therefore, the possibility that the second two-dimensional information block can be decoded correctly becomes high.

(54) In the configuration of (52) or (53), the first and second error correction decoding means has an iterative decoding function of iterating the error correction decoding processing between them at least once.

In such a configuration, decoding untilizing the iteration of the most likelihood is conducted in the first and second error correction decoding means. Therefore, decoding having a further higher error correction capability can be conducted. Even in the case where a transmission channel having a poor transmission channel quality is used, therefore, high quality transmission can be effected.

(55) In the configuration of (54), the error correction decoding apparatus further includes an iteration control means for determining number of times of iteration according to at least one of a demanded error correction capability and a permitted processing delay amount, and setting the determined number of times of iteration into the first and second error correction decoding means.

Even if the demanded error correction capability or the permitted processing delay amount is altered after the receiving apparatus is put in service, an optimum number of times of iteration can always be determined by the iteration control means in such a configuration.

(56) In an error correction decoding apparatus for receiving and decoding the encoded signal transmitted from the error correction encoding apparatus of (51), the error correction decoding apparatus includes: a first error correction decoding means for conducting error correction decoding for the horizontal direction of the first two-dimensional information block included in the received encoded signal, on the basis of the first two-dimensional inspection block included in the encoded signal, and outputting a first decoded two-dimensional information block; a second error correction decoding means for conducting error correction decoding for the vertical direction of an information block included in the first decoded two-dimensional information block output the first error correction decoding means, corresponding to the second two-dimensional information block, on the basis of the second two-dimensional inspection block included in the received encoded signal, and outputting a second decoded two-dimensional information block; a third error correction decoding means for iterating error correction decoding processing between the first error correction decoding means and the second error correction decoding means at least once, and outputting the first and second decoded two-dimensional information blocks thus subjected to iterative decoding; and a selection means for causing the error correction decoding processing using only the first error correction decoding means, the error correction decoding processing respectively using the first and second error correction decoding means, and the error correction decoding processing respectively using the first, second, and third error correction decoding means to be selectively executed, on the basis of at least one of a transmission channel state and a property of the transmitted information signal.

(57) In an error correction decoding apparatus for receiving and decoding the encoded signal transmitted from the error correction encoding apparatus of (51), the error correction decoding apparatus includes: a second error correction decoding means for conducting error correction decoding for the vertical direction of an information block included in the received encoded signal, corresponding to the second two-dimensional information block, on the basis of the second two-dimensional inspection block included in the received encoded signal, and outputting a second decoded two-dimensional information block; and a first error correction decoding means for conducting error correction decoding for the horizontal direction of the second decoded two-dimensional information block output from the second error correction decoding means and the first two-dimensional information block included in the received encoded signal, on the basis of the first two-dimensional inspection block included in the encoded signal, and outputting a first decoded two-dimensional information block, and the second decoded two-dimensional information block further subjected to the error correction; a third error correction decoding means for iterating error correction decoding processing between the first error correction decoding means and the second error correction decoding means at least once, and outputting the first and second decoded two-dimensional information blocks thus subjected to iterative decoding; and a selection means for causing the error correction decoding processing using only the first error correction decoding means, the error correction decoding processing respectively using the first and second error correction decoding means, and the error correction decoding processing respectively using the first, second, and third error correction decoding means to be selectively executed, on the basis of at least one of a transmission channel state and a property of the transmitted information signal.

In the configurations of (56) and (57), the error correction decoding processing using only the first error correction decoding means, the error correction decoding processing using the first and second error correction decoding means, and the error correction decoding processing using the first, second, and third error correction decoding means are selectively conducted on the basis of the transmission channel state or the property of the transmitted information signal sequences. According to the transmission channel state at each time and the property of the transmitted two-dimensional information block, therefore, optimum error correction decoding processing is always effected. As a result, efficient error correction decoding having a high error correction capability can be conducted.

(58) In the configuration of (51), unimportant information requiring a predetermined first transmission quality is assigned to the first two-dimensional information block except the second two-dimensional information block, and important information requiring a higher transmission quality than the first transmission quality is assigned to the second two-dimensional information block.

In the case where, for example, image data are transmitted as a two-dimensional block, important information such as various kinds of control information, movement prediction information, and low frequency components of the discrete cosine transform (DCT) is assigned to the second two-dimensional information block, and unimportant information such as high frequency components of the DCT is assigned to the first two-dimensional information block, in such a configuration. Even under such a condition that the transmission quality is poor, at least various kinds of two-dimensional block which is important in forming images can be reproduced correctly. As a result, images which are sufficiently decipherable can be reconstructed. Furthermore, as compared with the case where all kinds of information are transmitted as the second two-dimensional information block, a high transmission efficiency can be ensured.

(59) In the configuration of (51), information transmitted by using a first transmission scheme having a predetermined intensity against transmission errors is assigned to the first two-dimensional information block except the second two-dimensional information block, and information transmitted by using a second transmission scheme having an intensity against transmission errors lower than that of the first transmission scheme is assigned to the second two-dimensional information block.

In such a configuration, transmitted information is assigned to the first or second two-dimensional information block according to the error resistance performance of the modulation scheme in use. As a result, it is possible to provide every transmitted information with a uniform error correction capability in transmission.

(60) In the configuration of (38), (45) or (54), the error correction decoding apparatus further includes, on an input side of the first and second error correction decoding means, a normalization means for normalizing a signal level of each of signal sequences or signal blocks to be input to the first and second error correction decoding means, on the basis of a level of the received encoded signal.

Owing to such a configuration, it is possible to occurrence of such inconvenience that the Euclidean distance becomes large despite the fact that the reliability information is raised by iterative decoding. As a result, the decoding precision can be raised.

BRIEF DESCRIPTION OF DRAWINGS

FIG. 18 is a diagram for description of another concrete example according to the first embodiment of the present invention;

FIG. 19 is a diagram for description of another concrete example according to the first embodiment of the present invention;

FIG. 20 is a diagram for description of another concrete example according to a second embodiment of the present invention;

FIG. 21 is a diagram for description of another concrete example according to the second embodiment of the present invention;

FIG. 22 is a diagram for description of a different concrete example of the first embodiment of the present invention;

FIG. 23 is a diagram for description of a different concrete example of the first embodiment of the present invention;

FIG. 24 is a diagram for description of a different concrete example of the first embodiment of the present invention;

FIGS. 35A and 35B are circuit block diagrams showing another variant according to the sixth embodiment of the present invention;

BEST MODE OF CARRYING OUT THE INVENTION

Figure 1A:
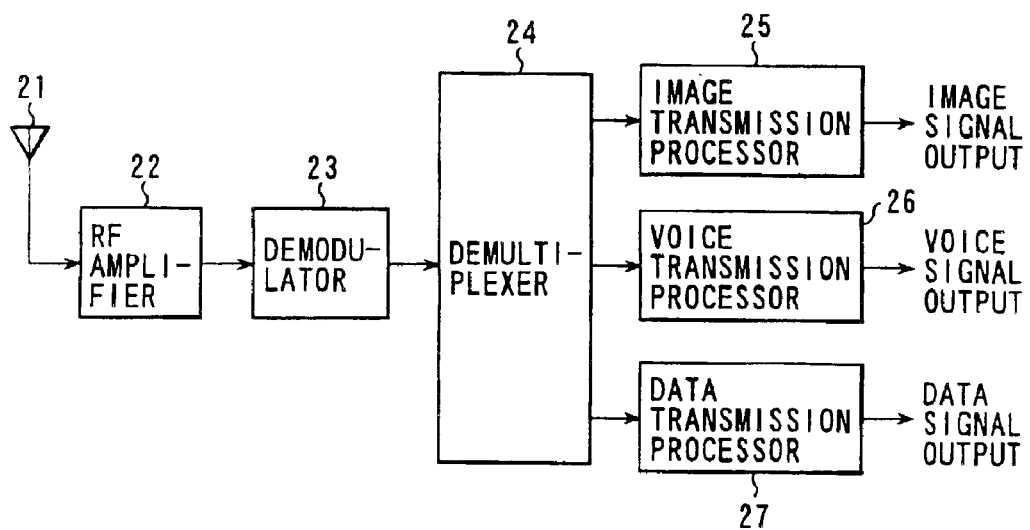
FIGS. 1A and 1B are block diagrams showing a basic configuration of a multimedia multiplex transmission system according to a first embodiment of the present invention.

Hereafter, several embodiments according to the present invention will be described in detail by referring to the drawing.

(First Embodiment)

It is assumed in the following description that multimedia information is handled as information to be transmitted, the multimedia information contains, for example, image data, voice data, and additional data such as computer data, and these kinds of information are subjected to multiplex transmission via a radio transmission channel.

Figure 1B:
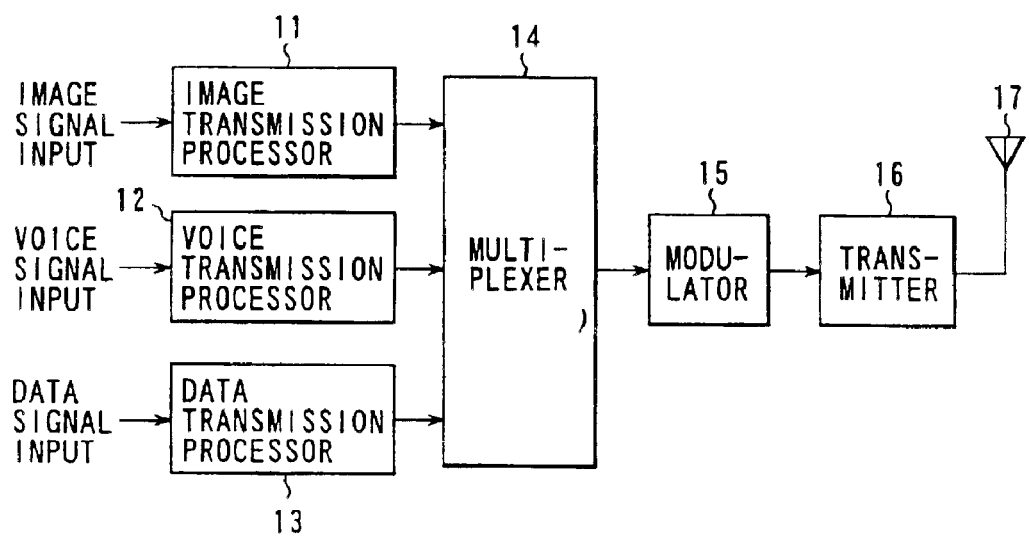

FIGS. 1A and 1B show a first embodiment of an information data multiplex transmission system according to the present invention. FIG. 1A shows a configuration of a transmitting device, and FIG. 1B shows a configuration of a receiving device.

In FIG. 1A, an image signal input, a voice signal input, and a data signal input are supplied to an image transmission processor 11, a voice transmission processor 12, and a data transmission processor 13, respectively. Each of the transmission processors 11 to 13 conducts conversion processing on its input data according to its predetermined format, extracts resultant data in response to a request from a multiplexer 14, and supplies the extracted data to the multiplexer 14.

The multiplexer 14 estimates information content supplied from the transmission processors 11 to 13, produces a multiplex table and incorporates the multiplex table into the header, reads information data from the transmission processors 11 to 13 and arrange them on the basis of the multiplex table, and thereby generates MUX packets one after another. A train of packets outputted from the multiplexer 14 are modulated by a modulator 15 in accordance with a predetermined modulation scheme, power-amplified by a transmitter 16, and radio-transmitted via an antenna 17.

In FIG. 1B, a radio-transmitted signal is received via an antenna 21, amplified by a RF amplifier 22, demodulated and detected by a demodulator 23, and supplied to a demultiplexer 24. This demultiplexer 24 takes out a multiplex table from the header of a demodulated signal every packet, and demultiplex the image data, voice data, and additional data from the packet by referring to the multiplex table. The demultiplexed image data is supplied to an image transmission processor 25, and converted to its original signal format therein. The demultiplexed voice data is supplied to a voice transmission processor 26, and converted to its original signal format therein. The demultiplexed additional data is supplied to a data transmission processor 27, and converted to its original signal format.

Concrete processing contents of a part of the above described configuration forming the feature of the present invention will now be described.

Figure 2:
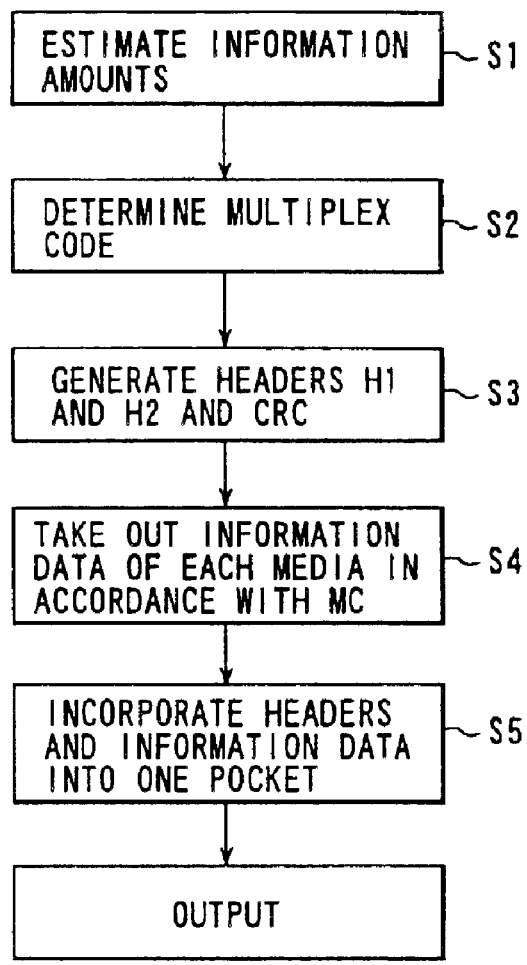
FIG. 2 is a flow chart showing concrete processing contents of the first embodiment.

On the transmitting side, the multiplexer 14 conducts processing in accordance with a flow chart shown in FIG. 2. First of all, the multiplexer 14 estimates information amounts supplied from the signal processors 11 to 13 (step S1), and determines a multiplex code on the basis of respective information amounts (step S2). Subsequently, the multiplexer 14 finds a parity of the determined (first) multiplex code, makes it a second multiplex code, and adds a CRC to each of the multiplex codes to produce two kinds of header information H1 and H2 (step S3). Finally, information data of each media is taken out in accordance with the multiplex codes (step S4), incorporates the information data together with the two kinds of header information into a packet, and outputs a resultant packet (step S5).

Figure 3:
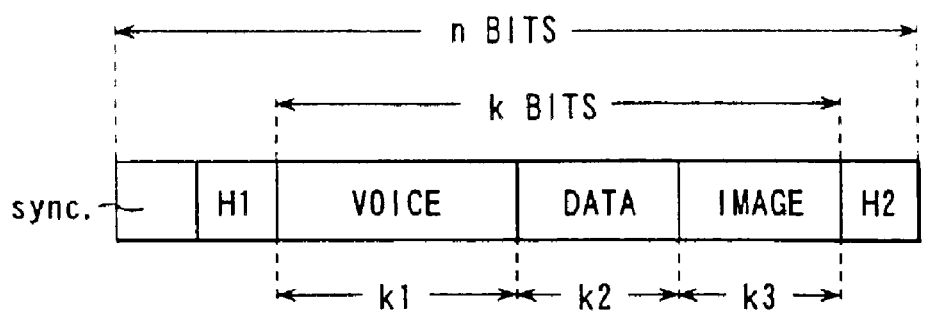
FIG. 3 is a diagram showing a basic concept of a MUX packet of the first embodiment.

FIG. 3 is a diagram showing a basic concept of a concrete configuration method of a MUX packet. The MUX packet has basically a fixed length of n bits. The MUX packet includes a synchronizing area (Sync.) for attaining synchronizing, a header H1 in which the multiplex table is written, media information of voice, data and video image having predetermined number of bits, i.e., k1, k2 and k3 bits, respectively, and having a total number of bits k, and a header H2. The header H1 and header H2 are formed so as to satisfy a relation described in (1) or (2) below.

(1) The header H2 is formed so as to correspond to the parity bit of the header H1. By passing the header H2 through a parity inverter, however, the original information, i.e., the header H1 can be restored. A header decoding procedure on the demultiplexer 24 of the receiving side in this case is shown in FIG. 4.

Figure 4:
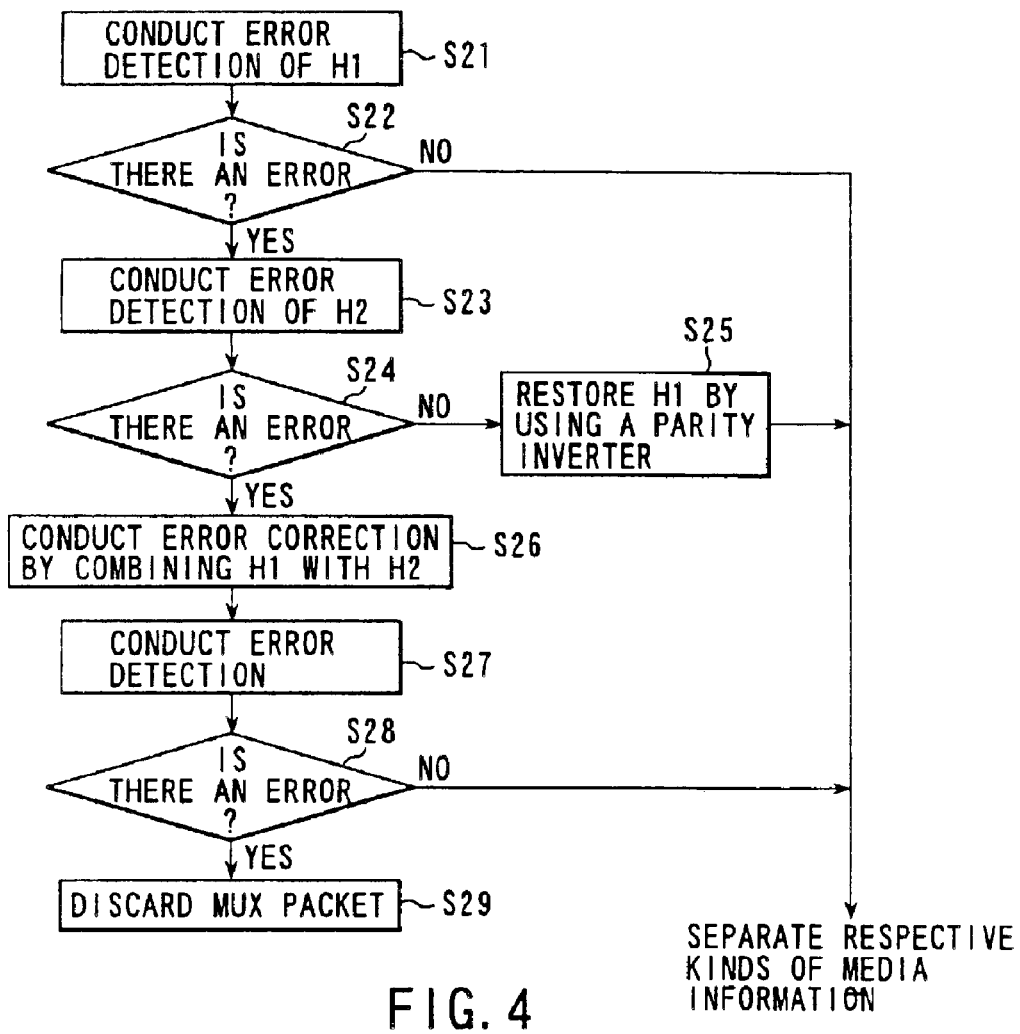
FIG. 4 is a flow chart showing a decoding procedure of the MUX packet illustrated in FIG. 3.

With reference to FIG. 4, error detection of the header H1 is first conducted by using the CRC (steps S21 and S22). If as a result it is determined that there are no errors (NO), respective kinds of media information are taken out from the MUX packet on the basis of the content of the multiplex table written in the header H1.

If an error is detected (YES), then error detection of the header H2 is conducted (steps S23 and S24). If it is determined that there are no errors (NO), then the header H2 is passed through a parity inverter to restore the header H1 (step S25), and the respective kinds of media information are taken out from the MUX packet on the basis of the content of the multiplex table. By the way, the parity inverter refers to a parity having such a property as to restore an original information bit from a parity bit.

If it is determined here again that there is an error (YES), error correction is conducted by combining H1 with H2 (step S2). After the error correction has been conducted, error detection is performed again (steps S27 and S26). If as a result it is determined that all errors have been corrected (NO), respective kinds of media information are taken out from the MUX packet on the basis of the content of the multiplex table. If an error still remains (YES), then the MUX packet is judged to be unrestorable and it is discarded (step S29).

Figure 5:
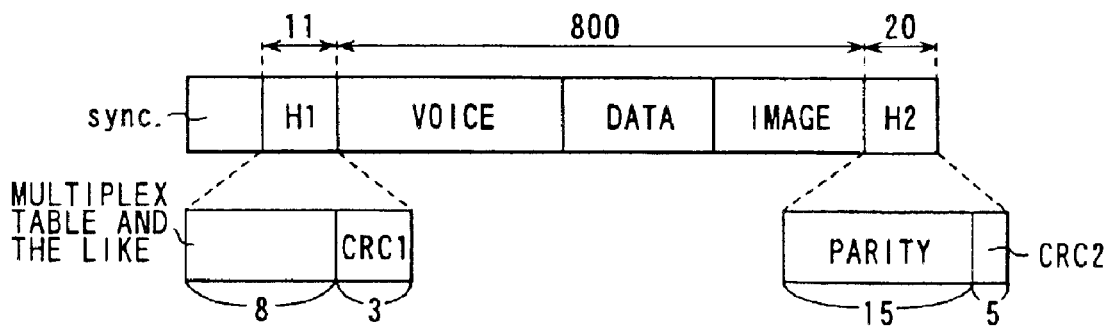
FIG. 5 is a diagram showing another concrete example of the MUX packet.

In FIG. 5, a concrete example of a MUX packet based upon the above described configuration method of (1) is shown.

In FIG. 5, it is now assumed that the headers H1 and H2 have 11 bits and 20 bits, respectively. It is assumed that in 11 information bits of the header H1 there are contained 8 bits including bits representing a multiplex table and 3 bits of a CRC (CRC1) (Hamming code). As for the header H2, parity bits of 15 bits are produced on the basis of a shortened (30, 15) BCH code which is obtained by shortening a 15-bit (31, 16) BCH code (Hamming code) having 11 bits and 4 bits of '0' by 1 bit. Another CRC (CRC2) of 5 bits is added thereto to form the header H2.

As described in (1), the header H1 can be reproduced by passing the header H2 through the parity inverter. A decoding procedure in the case of this example is shown in FIG. 6.

Figure 6:
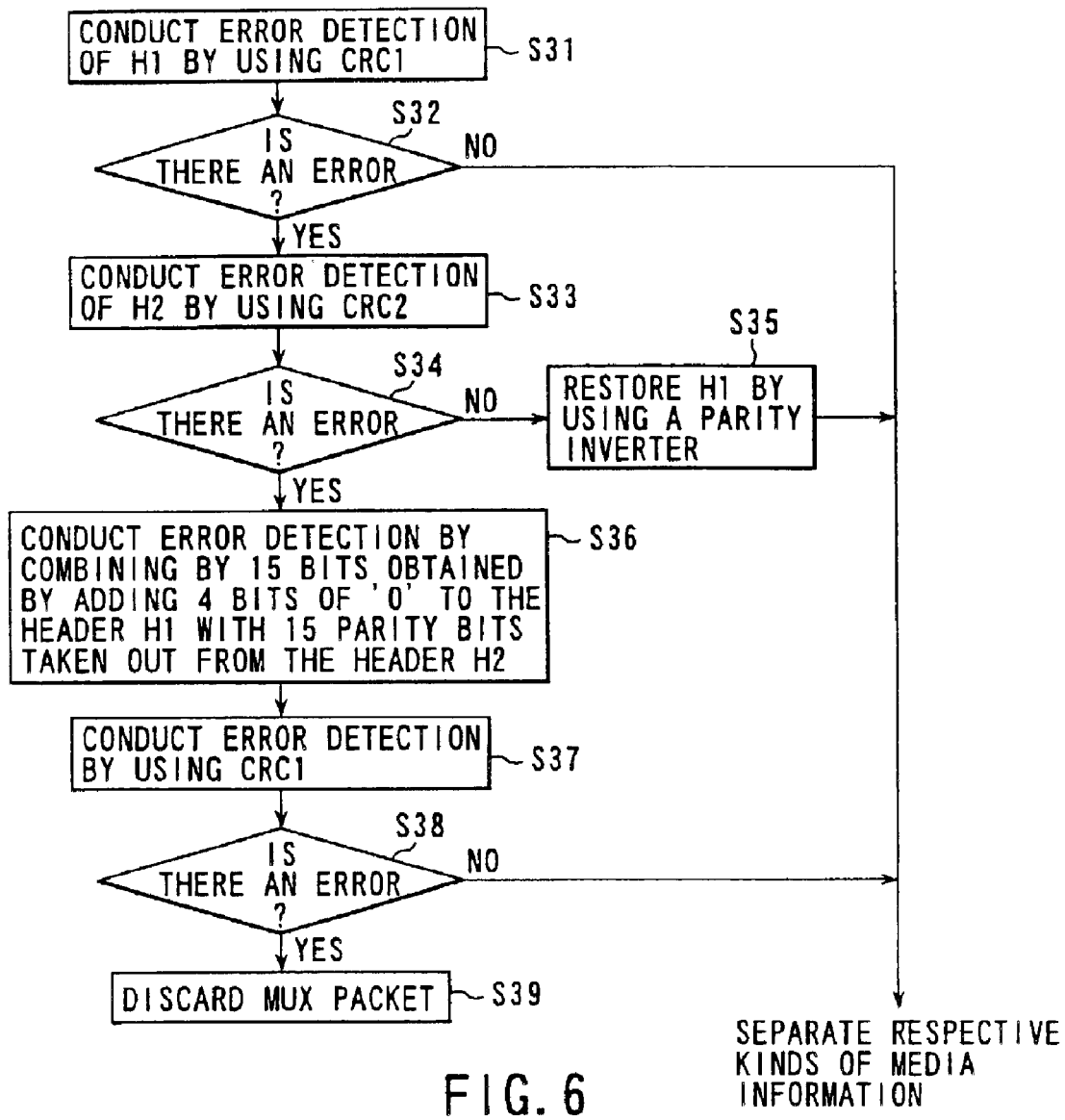
FIG. 6 is a flow chart showing a decoding procedure of the MUX packet illustrated in FIG. 5.

With reference to FIG. 6, it is first determined whether there is an error in the header H1 by using the CRC1 (steps S31 and S32). If there are no errors (NO), then the 8 bits including bits representing the multiplex table are taken out, and respective kinds of media information are taken out on the basis of this information. If there is an error (YES), then error detection of the header H2 is conducted by using the CRC2 (steps S33 and S34). If it is determined that there are no errors (NO), then the header H1 is restored by using a parity inverter (step S35), and the 8 bits including bits representing the multiplex table are taken out from the restored H1. If there is further an error (YES), then a shortened (30, 15) BCH having a combination of 15 bits obtained by adding 4 bits of '0' to the header H1 with 15 parity bits obtained by removing the CRC2 from the header H2 is decoded, and error correction is conducted (step S36). For a result of decoding, error detection using the CRC1 is conducted (steps S37 and S38). If as a result there are no errors (NO), the 8 bits including bits representing the multiplex table are taken out. If nevertheless there still remains an error (YES), the MUX packet is discarded (step S39).

Figure 7:
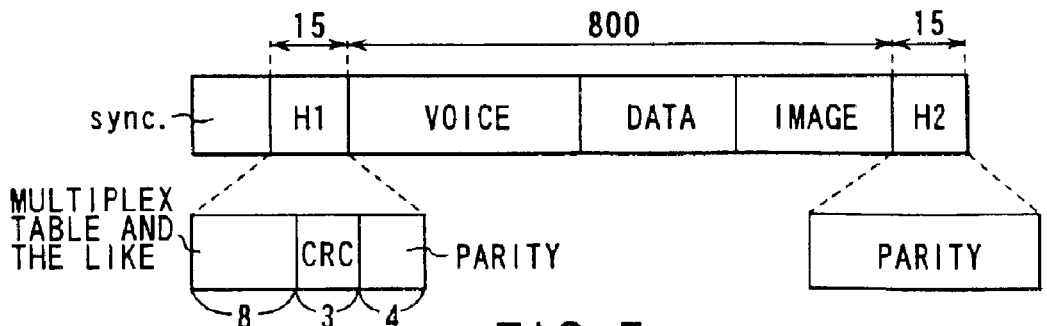
FIG. 7 is a diagram showing still another concrete example of the MUX packet.

In FIG. 7, another concrete example of a MUX packet based upon the above described configuration method of (1) is shown.

With reference to FIG. 7, it is now assumed that each of the headers H1 and H2 has 15 bits. In the information bits of 15 bits of the header H1, 8 bits including bits representing the multiplex table, 3 bits of a CRC, and 4 bits of parity for a (15, 11) BCH code regarding those 11 bits as information bits are contained. As the header H2, there are used parity bits of 15 bits produced on the basis of a shortened (30, 15) BCH code which is obtained by shortening a 15-bit (31, 16) BCH code having 15 bits of the header H1 by 1 bit. Here, the header H1 can be reproduced by passing the header H2 through a parity inverter as described in (1). A decoding procedure in the case of this example is shown in FIG. 8.

Figure 8:
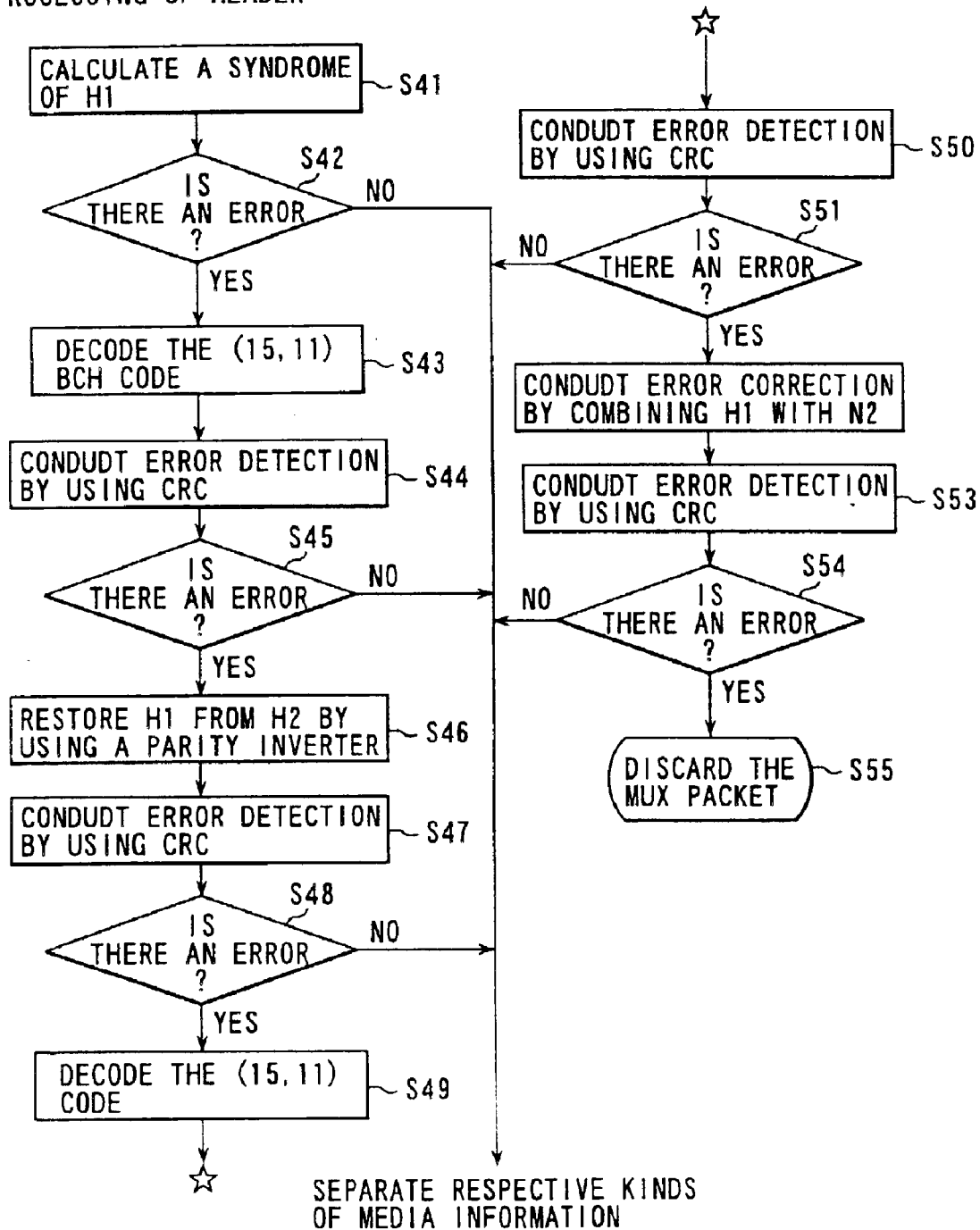
FIG. 8 is a flow chart showing a decoding procedure of the MUX packet illustrated in FIG. 7.

With reference to FIG. 8, it is first determined whether there is an error by calculating a syndrome of the header H1 (steps S41 and S42). If there are no errors (NO), then the 8 bits including bits representing the multiplex table are taken out. If there is an error (YES) and the error is correctable, then error detection is conducted by using the (15, 11) BCH code (steps S43).

Thereafter, it is determined whether there is an error in the header H1 by using the CRC (steps S44 and S45). If there are no errors (NO), the 8 bits including bits representing the multiplex table are taken out. If there is an error (YES) and the error is uncorrectable, then the header H1 is restored from the header H2 by using a parity inverter (step S46), and error detection of the restored header H1 by using the CRC (steps S47 and S48). If there are no errors (NO), the 8 bits including bits representing the multiplex table are taken out. If there is further an error (YES) and the error is correctable, then error correction is conducted by using the (15, 11) BCH code (step S49).

Thereafter, it is determined whether there is an error in the header H1 by using the CRC (steps S50 and S51). If there are no errors (NO), the 8 bits including bits representing the multiplex table are taken out. If there is still an error (YES), then a shortened (30, 15) BCH obtained by combining the header H1 with the header H2 is decoded, and error correction is conducted (step S52). For a result of decoding, error detection using the CRC is conducted (steps S53 and S54). If as a result there are no errors (NO), the 8 bits including bits representing the multiplex table are taken out. If nevertheless there still remains an error (YES), the MUX packet is discarded (step S55).

In order to shorten a delay time taken for the decoding processing in the decoding procedure of FIG. 8, it is also possible to conduct the processing ranging from the process for restoring the header H1 from the header H2 by using the parity inverter (step 46) to the process for conducting the error correction by combining the header H1 with the header H2 (step 53) in parallel with the processing of the header H1 immediately after the packet has been received. (As for configurations of the headers H1 and H2, see "Error Control Coding" written by S. Lin and D. Costello and published by Prentice Hall Inc., 1983.)

(2) It is now assumed that each of the headers H1 and H2 is subjected to convolutional encoding with an encoding rate of ½ and then punctured with a predetermined encoding rate r' (r'>½). The puncturing means processing for generating a code having a high encoding rate by removing predetermined bits after encoding.

Here, a punctured bit pattern of the header H1 is made to have an opposite relation to that of the header H2. In other words, bits punctured in the header H1 are left in the header H2, whereas bits left in the header H1 are punctured in the H2 except a first one bit. A decoding procedure of the headers in this case is shown in FIG. 9.

Figure 9:
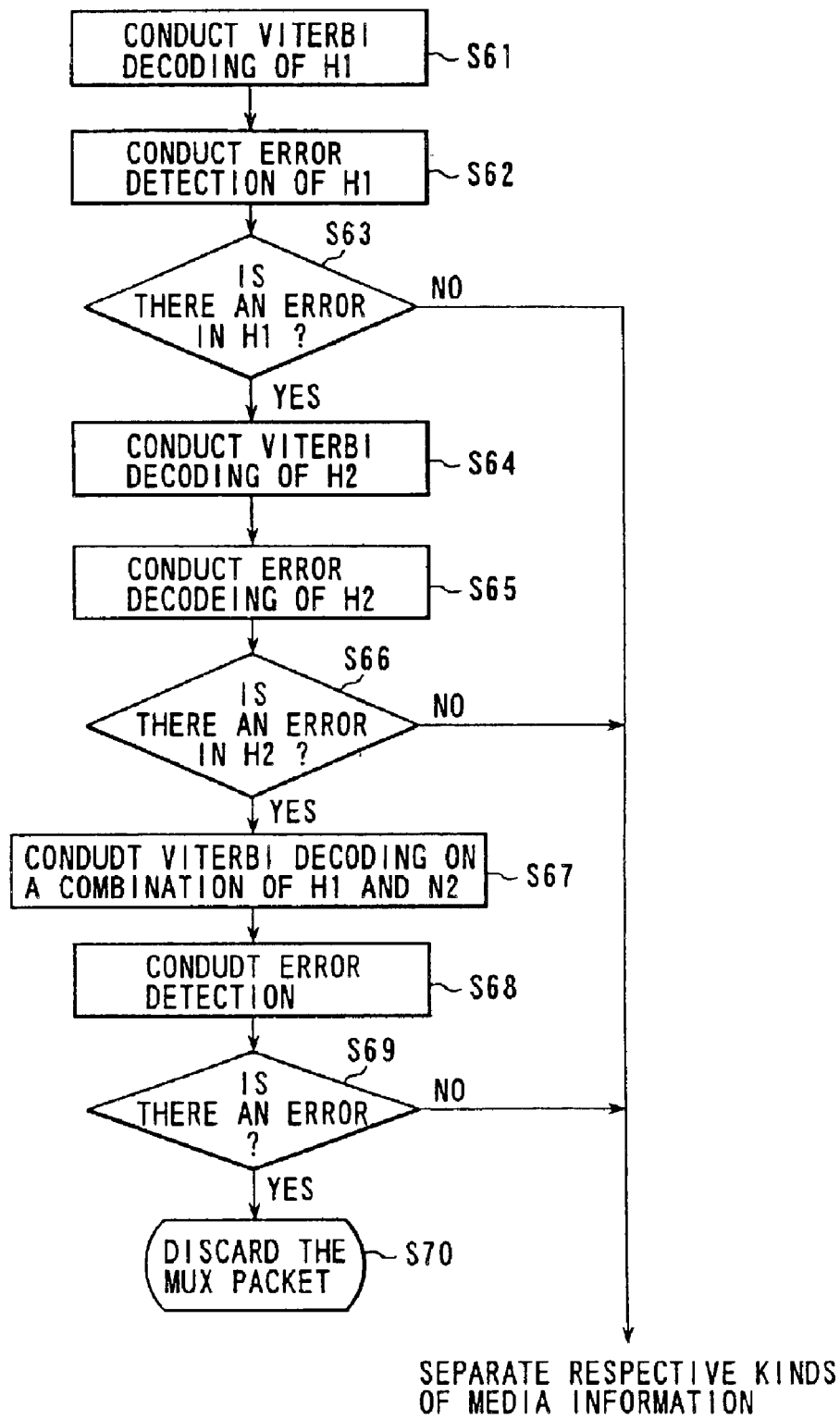
FIG. 9 is a flow chart showing a decoding procedure of a MUX packet produced by using another concrete configuration method of a MUX packet of the first embodiment.

With reference to FIG. 9, error correction of the header H1 is first conducted by using a procedure of decoding of a convolutional code having an encoding rate r' such as Viterbi decoding (step S61). Then, error detection is conducted by using the CRC (steps S62 and S63). If as a result it is determined that there are no errors (NO), respective kinds of the media information are taken out from the MUX packet on the basis of the content of the multiplex table written in the header H1. If an error is detected (YES), then error correction of the header H2 is conducted in the same way as the header H1 (step S64), and error detection is conducted (steps S65 and S66).

If it is determined here that there are no errors (NO), respective kinds of the media information are taken out from the MUX packet on the basis of the content of the multiplex table. If it is determined here as well again that there is an error (YES), decoding of the convolutional encode having an encoding rate of ½ is conducted by combining the header H1 with the header H2 (step S67). For a result of the error correction, error detection is conducted 'steps S68 and S69). If it is determined that all errors have been corrected (NO), respective kinds of the media information are taken out from the MUX packet on the basis of the content of the multiplex table. If it is determined here as well again that there is an error (YES), then the MUX packet is judged to be unrestorable, and the MUX packet is discarded (step S70).

Figures 10A, 10B:
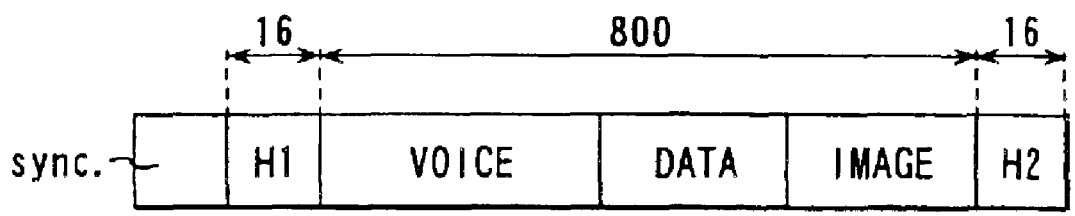
FIGS. 10A and 10B are diagrams showing a concrete example of a MUX packet produced by using the concrete configuration method of FIG. 9.

In FIG. 10A, a concrete example of a MUX packet based upon the above described configuration method of (2) is shown. In FIG. 10A, it is now assumed that each of the headers H1 and H2 has 16 bits. These 16 bits are formed by using a convolutional code of an encoding rate of ½ as an original code and by conducting convolutional encoding of punctured r=⅞ on 14 bits containing 8 bits including bits representing the multiplex table, 3 bits of a CRC, and 3 bits of '0'.

Here, a puncture pattern of the header H1 is generated by leaving bits corresponding to '1's of a puncture matrix shown in FIG. 10B and thinning bits corresponding to '0's. A puncture pattern of the header H2 is generated by thinning bits corresponding to '1's of a puncture matrix shown in FIG. 10B except x1 and y1 and leaving bits corresponding to '0's. (As for the configuration and so on of a convolutional code, see "Encoding Theory" written by Imai and published by The Institute of Electronics, Information and Communication Engineers in 1990, for example.)

Figure 11:
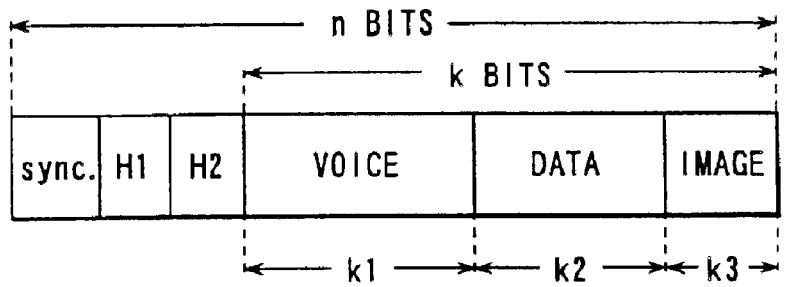
FIG. 11 is a diagram showing a basic concept of still another concrete configuration method of the MUX packet.

FIG. 11 is a diagram showing a basic concept of another concrete configuration method of a MUX packet. The MUX packet has basically a fixed length of n bits. The MUX packet includes a synchronizing area (Sync.) for attaining synchronizing, a header H1 in which the multiplex table is written, media information of voice, data and video image having predetermined number of bits, i.e., k1, k2 and k3 bits, respectively, and having a total number of bits k, and a header H2. The headers H1 and H2 are formed as described above in (1) or (2).

Figure 12:
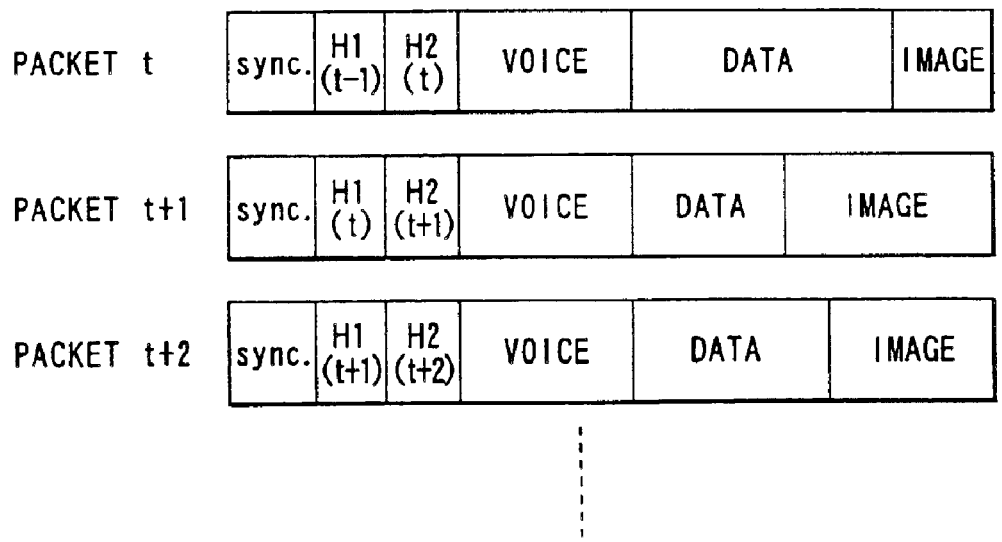
FIG. 12 is a diagram showing a time series of the MUX packet illustrated in FIG. 11.

FIG. 12 shows a MUX packet at each of certain time points t, t+1, and t+2. With reference to FIG. 12, a packet t at time t has a header H1 of a packet t−1 and a header H2 of the packet t. A packet t+1 at time t+1 has a header H1 of the packet t and a header H2 of the packet t+1. By thus separating H1 from H2, a time diversity effect can be provided, and comparatively high insusceptibility to deteriorated factors of the transmission channel such as fading can be obtained.

In the example described above, the header H1 of the packet t is contained in the packet t+1. Alternatively, the header H1 of the packet t may be contained in a packet t+2, a packet t+3, or the like.

In the configuration of the above described embodiment, headers of a MUX packet are provided with an error correction capability as apparent from the foregoing description. Even in a poor transmission channel state in a mobile radio communication system, therefore, respective kinds of media information can be taken out from the MUX packet. The probability of the MUX packet being discarded can thus be reduced.

Furthermore, headers are separated and transmitted a plurality of times, and error correction encoding is conducted so that original headers may be reproduced from any of them. Therefore, the time diversity effect can be provided for the transmission channel variation such as fading as well. As a result, headers can be reproduced efficiently.

Besides, the following can be considered as an error correction code added to the header information.

Figure 14:
FIG. 14 is a diagram for description of another concrete example according to the first embodiment of the present invention.

In the case of FIG. 14, a BCH (15, 7) code is added to the MC field and the HEC field of the header H1.

Figure 15:
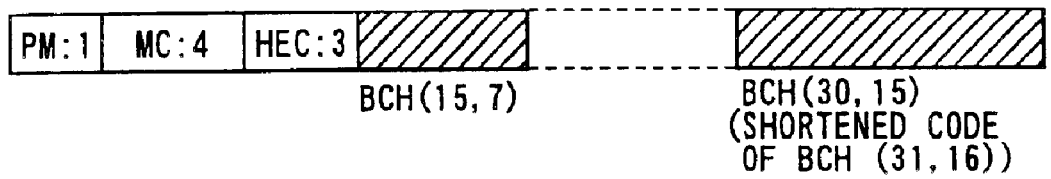
FIG. 15 is a diagram for description of another concrete example according to the first embodiment of the present invention.

In the case of FIG. 15, a BCH (15, 7) code is added to the MC field and the HEC field of the header H1. In addition, a BCH (30, 15) code which is a shortened code of a BCH (31, 16) code is added to the MC field, the HEC field and the BCH (15, 7) code.

Figure 16:
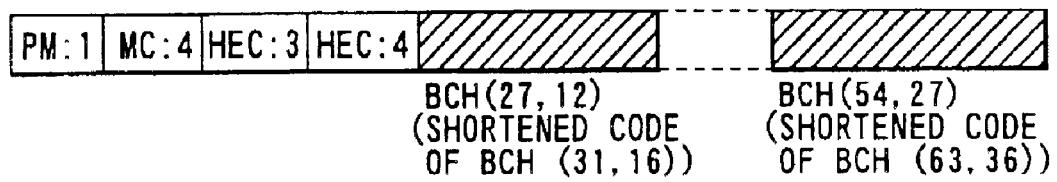
FIG. 16 is a diagram for description of another concrete example according to the first embodiment of the present invention.

In the case of FIG. 16, a BCH (27, 12) code which is a shortened code of a BCH (31, 16) code is added to the PM, the MC field, the HEC field, and the CRC code of the header H1. In addition, a BCH (54, 27) code which is a shortened code of a BCH (63, 36) code is added to the PM, the MC field, the HEC field, the CRC code, and the BCH (27, 12) code.

Figure 17:
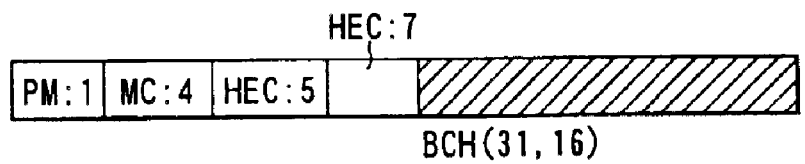
FIG. 17 is a diagram for description of another concrete example according to the first embodiment of the present invention.

By adopting such an error correction scheme, the following effect can be brought about. That is, characteristics of the scheme of the present invention shown in FIG. 15 were evaluated by using computer simulation. Its results are shown in FIGS. 18 and 19. As a subject of comparison, a conventional scheme described in the current H.223/A, i.e., the scheme using the BCH (31, 16) code, 5 bits of HEC, and 7 bits of CRC (FIG. 17) was selected. Because the BCH (31, 16) code is used in both schemes as the error correction code and the schemes differ in only the method of practical use of remaining bits except the 4 bits of the MC.

As a decoding procedure of the scheme of the present invention, the following was used.

(i) The BCH code added to the head is used for error detection. If it is determined that there are no errors together with the HEC, the MC is taken out.

(ii) A parity inverter is passed through 15 bits added to the tail to reproduce 4 bits of the MC, 3 bits of the HEC, and 8 bits of the BCH (15, 7) parity. Thereafter, processing similar to (i) is conducted.

(iii) If it is determined at (ii) as well that there is an error, then error correction is conducted by using the BCH (30, 15) code, error correction is further conducted by using the BCH (15, 7) code, and a check is conducted by using the HEC.

Simulation conditions were determined as follows.

MUX-PDU length: Variable-length MUX-SDU of 100 octets in average+header length

The number of times of simulation: 1,000,000 MUX-PDUs

Error pattern: GSM, DECT (14 km/h)

As for the evaluation criterion, the following two conditions were used.

First condition: As many MCs as possible can be taken out.

Second condition: Under the first condition, an erroneous MC is not judged to be correct.

Simulation Results

Correct decoding rate: A rate of MUX-PDUs among 1,000,000 MUX-PDUs for each of which the MC could be taken out correctly without an error Overlooking ratio: A rate of MUX-PDUs among 1,000,000 MUX-PDUs for each of which the MC was judged to be correct although the MC was erroneous Decoding error: A rate of MUX-PDUs among 1,000,000 MUX-PDUs for each of which the MC was judged to be erroneous and left to the end It is appreciated from FIGS. 18 and 19 that in all items the rate of correct decoding has been improved in the present invention scheme as compared with the conventional scheme. As for the error overlooking rate, the conventional scheme using double CRC is more excellent. In the light of the evaluation criterion of the header protection, however, it will be appreciated that the present invention scheme is more excellent in total.

In the schemes shown in FIGS. 14 and 15, the case where an error correction code is added only to the MC and the HEC in the header information is shown. In these schemes, however, any protection is not effected on the packet marker PM.

In the first embodiment of the present invention, therefore, a PM bit formed of one bit is inserted in the header three times on the transmitting side, for example, as shown in FIG. 22. On the receiving side, decision of the majority is effected on the received three PM bits, and the PM bit is determined on the basis of the result.

By doing so, it becomes possible to reproduce the PM bit with high precision while maintaining the format prescribed in H.223 as far as possible. The PM bit is important information used to mark the end of MUX-SDU of a divisible logical channel. Therefore, it is extremely effective in accurately receiving and reproducing packets to be able to correctly reproduce the PM bit.

Evaluation results of simulation of this PM repetition scheme are shown in FIGS. 23 and 24. As evident from FIGS. 23 and 24, the number of errors has been improved in the present invention scheme in all items as compared with the conventional scheme having only one PM.

Simulation conditions are shown below.

MUX-PDU length: Variable-length MUX-SDU of approximately 20 octets in average+header length The number of times of simulation: 1,000,000 MUX-PDUs Error pattern: GSM, DECT (14 km/h)

(Second Embodiment)

With reference to the first embodiment, the protection scheme of the header has been described. For transmitting information with a high quality in mobile communication, however, it is necessary to protect the payload field as well.

In a second embodiment of the present invention, suitable protection is effected on a plurality of kinds of information inserted in the payload field of a packet, such as three kinds of information, i.e., voice, data and image, without significantly changing the format of H.223. This will be hereafter described in detail.

First of all, as for computer data, the present embodiment proposes such a scheme as to add a shortened Reed-Solomon code over $GF(2^8)$ to the AL-SDU.

As for the voice, the present embodiment proposes such a scheme as to add an 8-bit CRC code to its control field (having one optional octet) and add a shortened Reed-Solomon code over $GF(2^8)$ to the AL-SDU and CRC.

As for the image, the present embodiment proposes such a scheme as to add a BCH (15, 7) code only to the sequence number SN in the case where the control field has one octet, and such a scheme as to add a BCH (31, 16) code to the entire control field in the case where the control field has two octets. The present embodiment also proposes such a scheme as to add a shortened Reed-Solomon code over $GF(2^8)$ to the control field, AL-SDU and CRC.

As for the transmitting unit, the size of the AL-PDU must be set so as not to exceed the maximum AL-PDU size that the receiving unit is capable of receiving. The size of the AL-PDU is prescribed in H.245 Capability.

Parameters defining the AL-PDU length are as follows.

Figure 54:
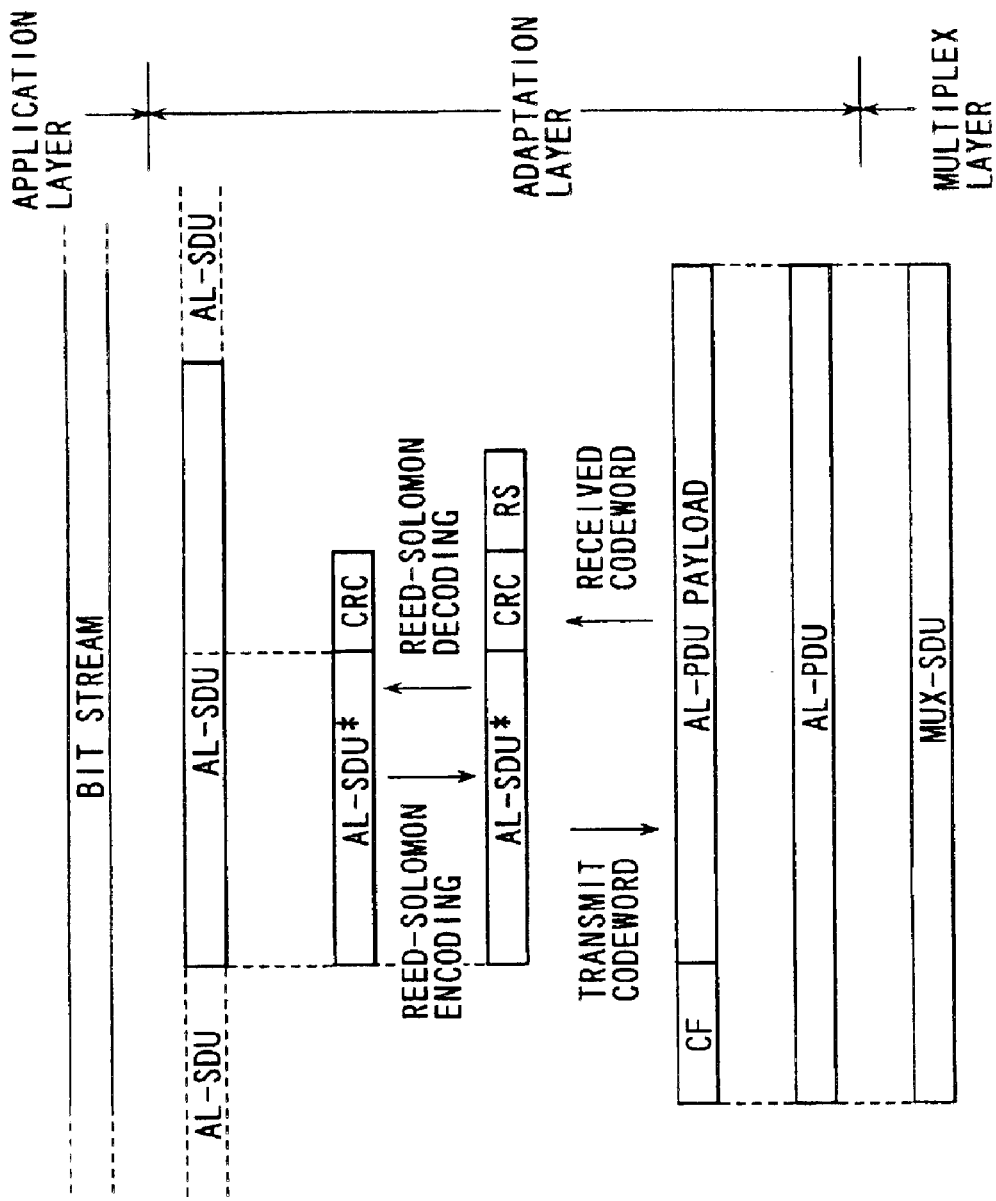
FIG. 54 shows a signal format for description of a payload protection scheme in the second embodiment of the present invention.

$I_v$ Length of AL-PDU in bits t Length of AL-SDU* in bits $e_{target}$ Correction capability of SRS code in octets $1_h$ Length of control header (CF) in bits $1_{CRC}$ Length of CRC in bits FIG. 54 shows a signal format for description of the payload protection system in the second embodiment.

With reference to FIG. 54, the AL-SDU is divided into a plurality of segments in the case where it is longer than a fixed length (255-2e) defined in H.223. In other words, in the case where use of a division procedure is communicated by an Open Logical Channel message in the frame transfer mode, the AL-SDU is divided into one or more AL-SDUs in the adaptation layer. This division procedure is indispensable at the time of receiving. By the way, the Open Logical Channel message is one of commands prescribed in H.245.

Subsequently, a CRC (Cyclic Redundancy Check) code is added to each of AL-SDUs resulting from the division. In other words, the CRC code provides the entire AL-SDU* with an error detection function. The CRC code is added to the AL-SDU before an error correction encoding procedure is conducted. The CRC is used in the receiving unit in order to determine whether the decoding procedure of the error correction algorithm is free from an error. As for the CRC length, 8, 16, 24 and 32 bits are supported, and which of them should be used is specified by an Open Logical Channel procedure. The CRC is evaluated according to a procedure described in 7.3.3.2.3 of Recommendation H.223.

Subsequently, a shortened Reed-Solomon (SRS) code is added to the above described AL-SDU having the CRC added thereto. In other words, in the transmitting unit, a coupled field of the AL-SDU* and the CRC field is subjected to SRS encoding. As a result, an AL-PDU is generated. The SRS encoding of the CRC field begins from a highest-order term of a polynomial representing the CRC field. In the receiving unit, the coupled field of the AL-SDU* and the CRC field is reconstructed by SRS decoding. Since this code is systematic, it is possible in the receiving unit to extract the CRC-protected AL-SDU* directly from a received bit stream without conducting SRS decoding.

An SRS code defined over a Galois field $GF(2^8)$ is obtained from the following generation polynomial.

$$g(x)=(x-\alpha)(x-\alpha^2)\ldots(x-\alpha^{2e\ target})$$

Here, $\alpha i$ ($0 \leq i \leq 254$) represents a root of the following primitive polynomial.

$$m(x)=x^8+x^4+x^3+x^2+1$$

Figure 55:
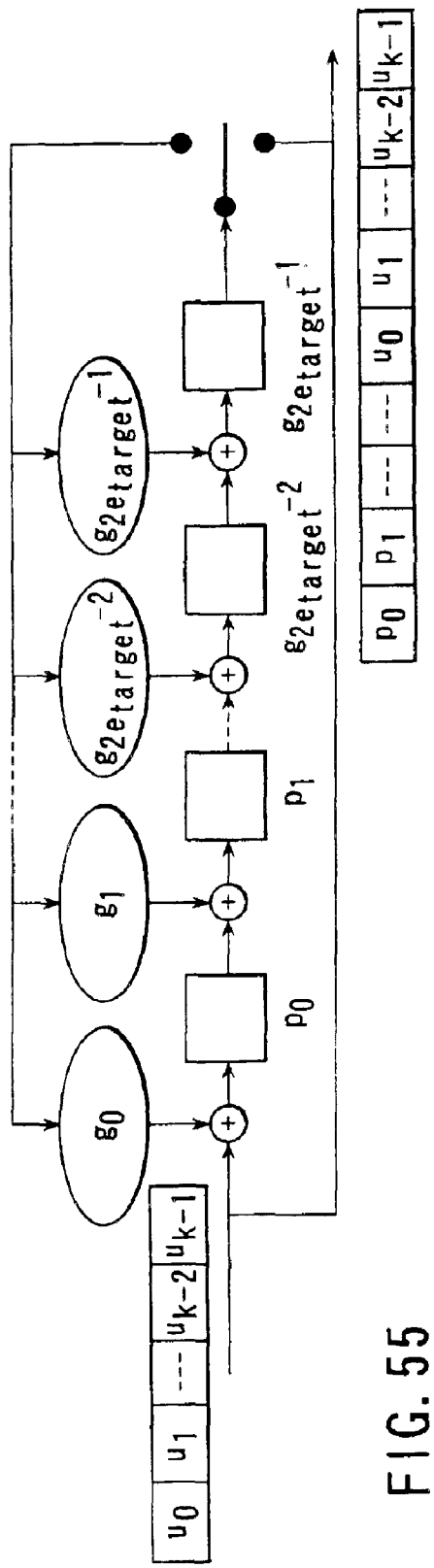
FIG. 55 is a circuit block diagram showing a configuration of a SRS encoder using a shift register, according to the second embodiment of the present invention.

FIG. 55 is a circuit block diagram showing the configuration of a SRS encoder using shift registers. In FIG. 55,
each element of a message sequence $u(u_{k-1}, u_{k-2}, \ldots u_1, u_0)$ corresponds to an element of the AL-SDU* taking an octet as the unit. Therefore, the length of the AL-SDU* satisfies the relation t=8k. A parity check polynomial p(x) is calculated by using the following expression.

$$p(x)=x^{2e\ target}\cdot u(x) \bmod g(x)=p_{2e\ target-1}x^{2e\ target-1}+p_{2e\ target-2}x^{2e\ target-2}+\ldots+p_1x+p_0 \quad (2\text{-}1)$$

Here, u(x) represents a message polynomial, and is defined by the following expression.

$$u(x)=u_{k1}x_{k1}+u_{k2}x_{k2}+\ldots+u_1x+u_0 \quad (2\text{-}2)$$

From the expressions (2-1) and (2-2), a code polynomial c(x) is obtained as follows.

$$c(x)=u_{k-1}x^{2e\ target+k-1}+u_{k-2}x^{2e\ target+k-2}+\ldots+u_1x^{2e\ target+1}+u_0x^{2e\ target}+p_{2e\ target-1}x^{2e\ target-1}+p_{2e\ target-2}x^{2e\ target-2}+\ldots+p_1x+p_0 \quad (2\text{-}3)$$

For example, if e target=2, and $u=(u_3, u_2, u_1, u_0)=(\alpha^2\ \alpha^4\ \alpha^7\ \alpha^{11})$, then the generation polynomial g(x) becomes as follows.

$$g(x)=(x-\alpha)(x-\alpha^2)(x-\alpha^3)(x-\alpha^4)=x^4+\alpha^{76}x^3+\alpha^{251}x^2+\alpha^{81}x+\alpha^{10} \quad (2\text{-}4)$$

Each element of the message sequence ($\alpha^2\ \alpha^4\ \alpha^7\ \alpha^{11}$) corresponds to an element of the AL-SDU* taking an octet as the unit. Therefore, the parity check polynomial p(x) is calculated by using the following expression.

$$p(x)=x^4(\alpha^2x^3+\alpha^4x^2+\alpha^7x+\alpha^{11}) \bmod g(x)=\alpha^{112}x^3+\alpha^7x^2+\alpha^{173}x+\alpha^{224} \quad (2\text{-}5)$$

From the expressions (2-4) and (2-5), the code polynomial c(x) is represented by the following expression.

$$c(x)=\alpha^2x^7+\alpha^4x^6+\alpha^7x^5+\alpha^{11}x^4+\alpha^{112}x^3+\alpha^7x^2+\alpha^{173}x+\alpha^{224} \quad (2\text{-}6)$$

Figure 56:
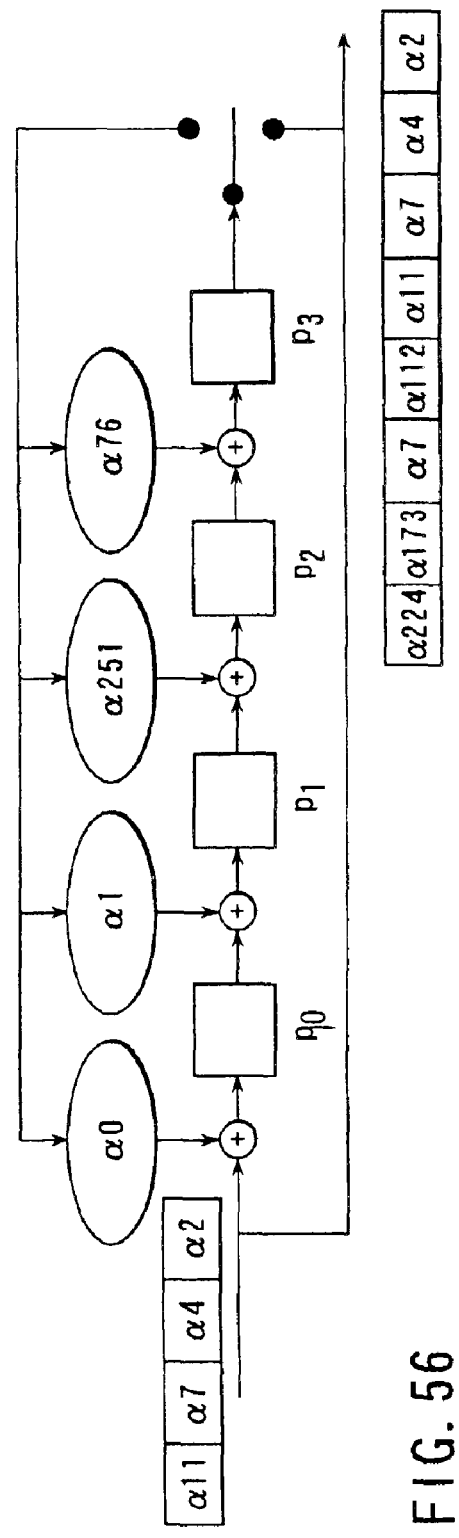
FIG. 56 is a circuit block diagram showing a concrete example of the SRS encoder illustrated in FIG. 55.

Accordingly, a code sequence ($\alpha^2, \alpha^4, \alpha^7, \alpha^{11}, \alpha^{112}, \alpha^7, \alpha^{173}, \alpha^{224}$) is obtained. FIG. 56 shows the configuration of a SRS encoder implementing this example by using shift registers.

The length $1_v$ of the AL-PDU can be obtained by using the following expression.

$$1_v=1_h+t+1_{CRC}+16e_{target} \quad (2\text{-}7)$$

The parameters $1_v$, t and $1_{CRC}$ must be byte-aligned. Furthermore, the expression (2-7) must be used by the transmitting unit. In the receiving unit, the length of the AL-SDU*t can be obtained by using the following expression.

$$t=1_v-1_h-1_{CRC}-16e_{target} \quad (2\text{-}8)$$

Both the expressions (2-7) and (2-8) must be calculated in octets as shown in the following example. It is now provisionally assumed that the receiving unit wants to transmit an AL-SDU* having t=378 bits (47 octets), 2 target=2, $1_h$=24 bits (3 octets), 1 CRC=16 bits (2 octets).

By using the expression (2-7), the length of the AL-PDU is found to be 1 v=56 octets. An instantaneous rate $r_{result}$ can be obtained by using the following expression.

$$r_{result}=(t+1_{CRC})/(1_v-1_h)$$

In this example, the instantaneous rate $r_{result}$ becomes $r_{result}$=49/53≈0.9245.

In the second embodiment, as heretofore described, a CRC code is first added to each of AL-SDUs obtained by dividing the AL-SDU at intervals of a predetermined length, and a coupled field of the AL-SDU and the CRC code is subjected to error correction encoding by taking an octet as the unit and using a shortened Reed-Solomon (SRS) code over $GF(2^8)$. Therefore, it becomes possible to provide the AL-PDU payload with a high burst error correction capability while maintaining the conformity to H.223. In application to a mobile communication system, therefore, it is possible to realize communication of high reliability by surely protecting not only the header but also the AL-PDU payload against transmission errors.

In addition, in the present embodiment, the error correction encoding processing of the AL-SDU is conducted by using the shortened Reed-Solomon encoder over $GF(2^8)$. Therefore, the present embodiment can be applied to an AL-SDU having a variable length as well. In other words, a variable length encoding scheme is typically adopted as the image encoding scheme, in multimedia communication including image data. Accordingly, the AL-SDU length varies from frame to frame. By using the shortened Reed-Solomon code over $GF(2^8)$ as in the second embodiment according to the present invention, however, such a variation in AL-SDU length can also be coped with.

Furthermore, as the encoder for implementing the shortened Reed-Solomon encoding over $GF(2^8)$, an encoder using shift registers as shown in, for example, FIG. 55 is used. And when inputting the AL-SDU to this encoder in the present embodiment, the message elements are input in the order of $u_{k-1}, u_{k-2}, \ldots, u_1$ and $u_0$ as illustrated. By doing so, it is possible to implement the shortened Reed-Solomon encoding processing using a conventionally used general-purpose encoder of shift register type as it is.

FIGS. 20 and 21 show results of simulation of the scheme heretofore described conducted with respect to an error rate occurrence situation. In the simulation results, the subject of comparison is a convolutional code of H.223/A. It was examined to what degree the error rate was improved without conducting retransmission in the case of computer data. As evident from FIGS. 20 and 21, the present invention scheme provides excellent error rate characteristics as compared with the conventional scheme which protects information data by using the convolutional code.

Conditions of the above described simulation are shown below.

MUX-PDU length: Variable-length AL-PDU of approximately 40 octets in average+error correction code The number of times of simulation: 10,000 MUX-PDUs Error pattern: GSM, DECT (14 km/h)

It is supposed that there are no errors in synchronizing and header.

As another configuration of the shortened Reed-Solomon ncoder, the following configuration is conceivable. First of all, the length of the variable-length encoded coupled field of the AL-SDU and the CRC is compared with a fixed length (255 bytes). If the length is shorter than the fixed length, the length of the AL-SDU+CRC is made equal to the fixed length by adding a sequence of null codes (0) thereto. Subsequently, the coupled field of the AL-SDU and CRC made to have the fixed length is input to the encoder shown in FIG. 55 in the order of $u_0, u_1, \ldots u_{k-2}$ and $u_{k-1}$ beginning from its head element, and encoded. From the encoded AL-PDU, the sequence of null codes is removed. A resultant shortened code is transmitted. By using such a configuration as well, the shortened Reed-Solomon code can be implemented.

(Third Embodiment)

Figure 25:
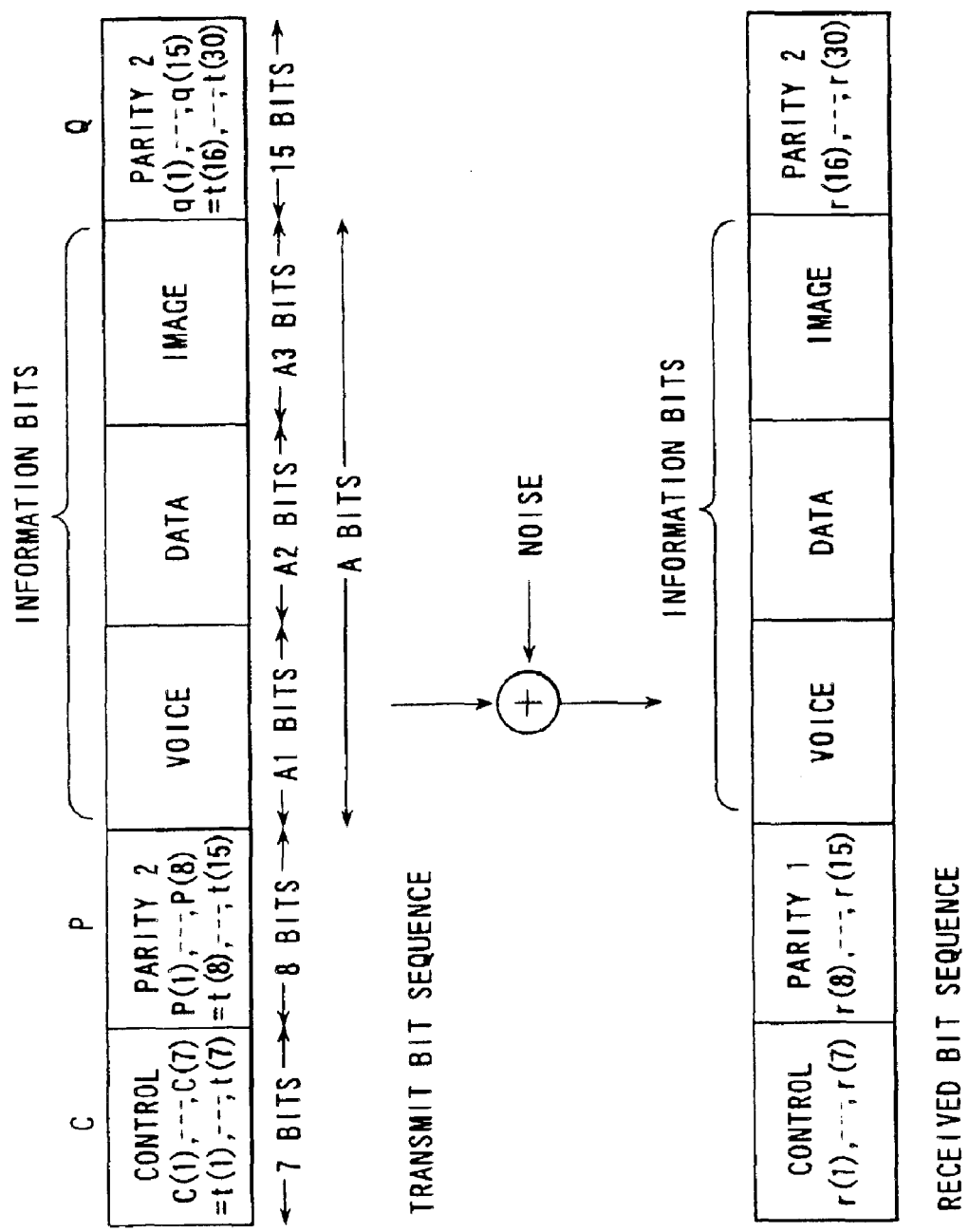
FIG. 25 is a schematic configuration diagram of a signal for description of third and fourth embodiments of the present invention.

FIG. 25 is a schematic configuration diagram of a MUX packet for description of a third embodiment of the present invention.

In the MUX packet, a 7-bit header, i.e., a control bit group, represented as $C=[c(1), \ldots, c(7)]$ with each element assuming a value of +1 or −1. In the control bit group, various kinds of control information, such as the number of bits of each kind in multiplexing the media information pieces of voice, data and image, are contained. Unless these control bits are recognized correctly on the receiving side, the multiplexed media information of voice, data and image cannot be separated and reproduced.

On the transmitting side, therefore, an 8-bit parity 1 represented as $P=[p(1), \ldots, p(8)]$ is generated for the 7-bit control bit group according to an encoding rule of the BCH (15, 7). And for 15 bits obtained from the 7-bit control bit group C and the 8-bit parity 1P, 15-bit parity 2 represented as $Q=[q(1), \ldots, q(15)]$ is generated according to an encoding rule of the shortened BCH (30, 15). Details of the BCH codes are described in, for example, Hideki Imai, "Encoding Theory," Corona Publishing Co., LTD, 1990.

As a result, the 8-bit parity 1 and the 15-bit parity 2 are added to the 7-bit control bit group. Thereby, a 30-bit encoded control bit group $T=[t(1), \ldots, t(30)]$ is generated, where $$t(i)=c(j), j=1, \ldots, 7\ \ t(j+7)=p(j), j=1, \ldots, 8\ \ t(j+15)=q(j),$$
$$j=1, \ldots, 15 \quad \text{(Expression 1)}$$

And the 30 bits of the encoded control bit group T are not transmitted en bloc. Between the last bit of the 8-bit parity 1 and the head bit of the 15-bit parity 2, media information bits containing A1 voice bits, A2 data bits and A3 image bits and having A=A1+A2+A3 bits in total are interposed. Resultant bits are transmitted. In other words, the parity 1 and the parity 2 are spaced from each other in time and transmitted.

On the other hand, the receiving side receives the 30-bit encoded control bit group T and the A-bit information bit group. The received bits are equivalent to the transmitted bits plus noise added thereto on the transmission channel. In other words, the received encoded control bit group is the sum of the transmitted encoded control bit group $T=[t(1), \ldots, t(30)]$ and a noise component $G=[g(1), \ldots, g(30)]$, and is represented as $R=[r(1), \ldots, r(30)]$, where $$r(j)=t(j)+g(j), j=1, \ldots, 30. \quad \text{(Expression 2)}$$

If $D[d(1), \ldots, d(30)]$ is derived in the decision unit according to $$d(j) = \begin{cases} +1 : r(j) \geq 0 \\ -1 : r(j) < 0, \end{cases} \quad \text{(Expression 3)}$$

then decision errors occur more frequently as the noise component becomes greater. If errors exceed the decoding capability of the BCH code, then the control bits contain a bit error which is not corrected, and the characteristic is degraded. Therefore, such decision means should not be used.

In the third embodiment of the present invention, therefore, decoding is conducted on the basis of a maximum likelihood decoding method in order to improve the characteristic against noise.

Among 30 bits of the transmitted encoded control bit group T, the control bits are 7 bits of $t(1)=c(1), \ldots, t(7)=c(7)$. Each of the 7 control bits assumes a value of +1 or −1. Therefore, there are 2 ways in total. Bits other than 7 control bits are parity bits determined from the control bits. In the parity 1 represented as $P=[t(8)=p(1), \ldots, t(15)=p(8)]$ as well, therefore, there are $2^7$ ways. In the parity 2 represented as Q=[t(16)=q(1), ..., t(30)=q(15)] as well, there are $2^7$ ways. Furthermore, also in the 30-bit transmitted encoded control bit group T=[t(1), ..., t(30)] containing all of them, there are $2^7$ ways.

With respect to r(1), ..., r(15) among received encoded control bits, a distance δ1 from the transmitted encoded control bits t(1), ..., t(15) having $2^7$ ways is first derived by using calculation of Euclidean distance represented by the following expression.

$$\delta_1 = (r(1)-t(1))^2 + \ldots + (r(15)-t(15))^2 \qquad \text{(Expression 4)}$$

Thus, $2^7$ δ$_1$ values are obtained. A transmitted encoded control bit group Tmin1=[t(1), ..., t(15)] associated with a minimum value δ$_{min1}$ among $2^7$ δ$_1$ values is regarded as the most likely transmitted encoded control bit group estimated from the received encoded control bits r(1), ..., r(15), and selected.

With respect to r(16), ..., r(30) among received encoded control bits, a distance δ$_2$ from the transmitted encoded control bits t(16), ..., t(30) having $2^7$ ways is then derived in the same way by using the following expression.

$$\delta_2 = (r(16)-t(16))^2 + \ldots + (r(30)-t(30))^2 \qquad \text{(Expression 5)}$$

Thus, $2^7$ δ$_2$ values are obtained. A transmitted encoded control bit group Tmin2=[t(15), ..., t(30)] associated with a minimum value δ$_{min2}$ among 27 δ$_2$ values is regarded as the most likely transmitted encoded control bit group estimated from r(16), ..., r(30), and selected.

Then, δ$_{min1}$ and δ$_{min2}$ thus selected are compared with each other to find a minimum value among them. If as a result, for example, δ$_{min1}$ is minimum, the most reliable transmitted control bits are derived from the first 7 bits t(1)=c(1), ..., t(7)=c(7).

On the other hand, different processing is conducted in the case where δ$_{min2}$ is the minimum. In other words, t(15), ..., t(30) were obtained by transforming t(1), ..., t(15) on the basis of the encoding rule of the BCH (30, 15). Therefore, t(1), ..., t(15) can be obtained by applying inverse transform on t(15), ..., t(30). From the first 7 bits of t(1), ..., t(15), c(1), ..., c(7) can be obtained. In other words, from Tmin2=[t(15), ..., t(30)], the most reliable transmitted control bits t(1)=c(1), ..., t(7)=c(7) are derived by using the inverse transform.

In the present embodiment heretofore described, the most reliable transmitted control bits are reproduced in the transmission of the control bits for multimedia multiplexing by selecting an optimum one out of a plurality of kinds of minimum values of the distance between the received encoded control bits and conceivable transmitted encoded control bits. In addition, the parity 1 and the parity 2 are disposed in time positions spaced apart. Therefore, it is probable that the parity 1 has high additional noise, but the parity has low additional noise, or vice versa. A time diversity effect is thus obtained, resulting in reproduction of the control bits with high precision.

In the third embodiment heretofore described, the 8-bit parity 1 is generated for the 7-bit transmitted control bit group by using the BCH (15, 7), and furthermore the 15-bit parity 2 is generated by using the BCH (30, 15). However, the third embodiment is not restricted to this, but the parity 1 and the parity 2 can be generated for a transmitted control bit group having an arbitrary number of bits by using other encoding methods.

Figure 28:
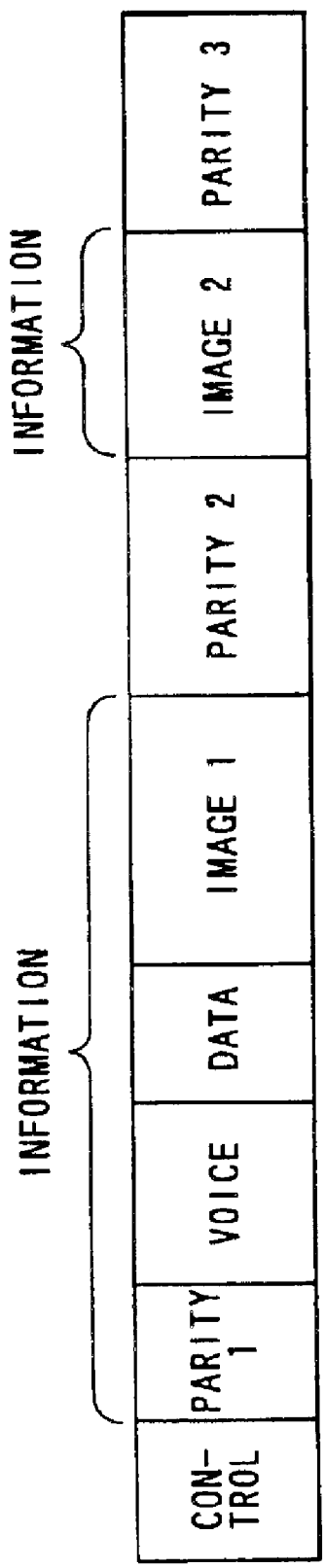
FIG. 28 is a packet configuration diagram for description of the third and fourth embodiments of the present invention.

For example, parity 3 may be added by using another encoding method after generating the parity 2 as shown in FIG. 28. By thus using a multi-stage configuration of parity, reproduction of the control bits with further higher precision can be realized.

Furthermore, in the third embodiment, the parity 1 and the parity 2 are transmitted with time spacing between. Even if additional noise is high in one of the time periods, therefore, the characteristic is improved by time diversity provided that additional noise is low in the other of the time periods. However, the present invention is not necessarily restricted to utilization of this time diversity effect.

Figure 29A:
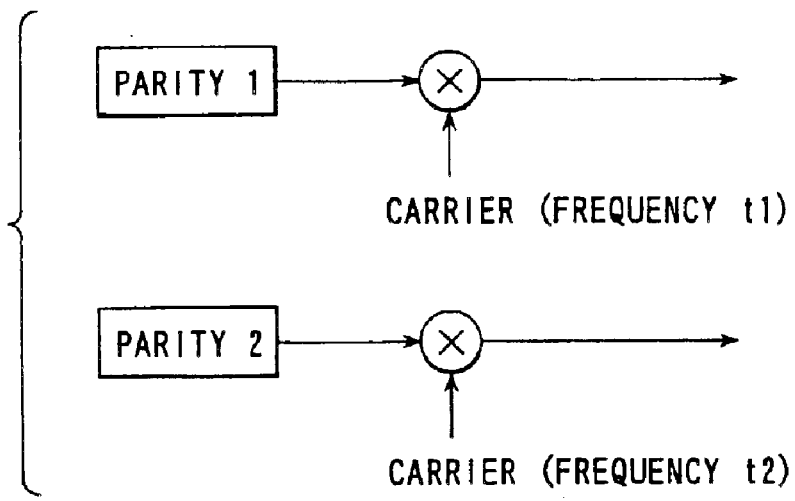
FIGS. 29A and 29B are diagrams for description of respective variants of the third and fourth embodiments of the present invention, respectively.

For example, the parity 1 and the parity 2 may be transmitted with frequency spacing between as shown in FIG. 29A. Even if additional noise is high at one frequency in this case, a high quality receiving characteristic can be obtained owing to a frequency diversity effect provided that additional noise is low at the other frequency.

Furthermore, in application to spread spectrum communication, the parity 1 and the parity 2 may be spread out and transmitted by using different spreading codes, for example, as shown in FIG. 29. Even if an interference signal has strong correlation with one of the spreading codes in this case, there is a possibility that the interference signal has weak correlation with the other of the spreading codes. By utilizing this, received data can be reproduced with a high quality.

(Fourth Embodiment)

As described with reference to the third embodiment, the MUX packet has a 7-bit control bit group represented as C=[c(1), ..., c(7)] and its each element has a value of +1 or −1. Unless the control bits are recognized correctly on the receiving side, multiplexed media information such as voice, data and image cannot be demultiplexed and reproduced.

On the transmitting side, therefore, the 8-bit parity 1 represented as P=[p(1), ..., p(8)] is generated for the 7-bit control bit group according to the encoding rule of the BCH (15, 7). And for 15 bits obtained from the 7-bit control bit group C and the 8-bit parity 1, 15-bit parity 2 represented as Q=[q(1), ..., q(15)] is generated according to an encoding rule of the shortened BCH (30, 15).

As a result, the 8-bit parity 1 and the 15-bit parity 2 are added to the 7-bit control bit group. Thereby, a 30-bit encoded control bit group T=[t(1), ..., t(30)] is generated, where $$t(j)=c(j), j=1, \ldots, 7 \ t(j+7)=p(j), j=1, \ldots, 8. \ t(j+15)=q(j), j=1, \ldots, 15 \qquad \text{(Expression 6)}$$

And the 30 bits of the encoded control bit group T are not transmitted en bloc. Between the last bit of the 8-bit parity 1 and the head bit of the 15-bit parity 2, information bits containing A1 voice bits, A2 data bits and A3 image bits and having A=A1+A2+A3 bits in total are interposed. Resultant bits are transmitted. In other words, the parity 1 and the parity 2 are spaced from each other in time and transmitted.

On the other hand, the receiving side receives the 30-bit encoded control bit group T and the A-bit information bit group. The received bits are equivalent to the transmitted bits plus noise added thereto on the transmission channel, and indicate real number values. In other words, the received encoded control bit group is the sum of the transmitted encoded control bit group T=[t(1), ..., t(30)) and a noise component G=[g(1), ..., g(30)], and is represented as R=[r(1), ..., r(30)], where $$r(j)=t(j)+g(j), j=1, \ldots, 30. \qquad \text{(Expression 7)}$$

If D [d(1), ..., d(30)] is derived in the decision unit according to $$d(j) = \begin{cases} +1 : r(j) \geq 0 \\ -1 : r(j) < 0, \end{cases} \quad \text{(Expression 8)}$$

then decision errors occur more frequently as the noise component becomes greater. If errors exceed the decoding capability of the BCH code, then the control bits contain a bit error which is not corrected, and the characteristic is degraded.

In a fourth embodiment of the present invention, therefore, decoding is conducted with due regard to the reliability of the decided value, in order to improve the characteristic against noise. In other words, reliability estimation of a decision value D=[d(1), ..., d(30)] is conducted on the basis of the received encoded control bit group R=[r(1), ..., r(30)] as hereafter described.

Among 30 bits of the transmitted encoded control bit group T, the control bits are 7 bits of t(1)=c(1), ..., t(7)=c(7). Each of the 7 control bits assumes a value of +1 or −1. Therefore, there are $2^7$ ways in total. Bits other than 7 control bits are parity bits determined from the control bits. In the parity 1 represented as P=[t(8)=p(1), ..., t(15)=p(8)] as well, therefore, there are $2^7$ ways. In the parity 2 represented as Q=[t(16)=q(1), ..., t(30)=q(15)] as well, there are $2^7$ ways. Furthermore, also in the 30-bit transmitted encoded control bit group T=[t(1), ..., t(30)] containing all of them, there are $2^7$ ways.

In the 30-bit transmitted encoded control bit group T=[t(1), ..., t(30)], there are $2^7$ ways. Here, a jth (j=1, 2, ..., 30) element t(j) will now be considered. There are $2^6$ ways in T having +1 as t(j). In the same way, there are also $2^6$ ways in T having −1 as t(j).

A weighting parameter W [w(1), ..., w(30)] formed of 30 elements is defined. Initial values are determined as follows.

$$W(j)=0.0, j=1, 2, \ldots, 30$$

Furthermore, a soft output S=[s(1), ..., s(30)] formed of 30 elements is defined. Initial values are determined as follows.

$$s(j)=r(j), j=1, 2, \ldots, 30$$

Here, r(j) is a jth element of the received encoded control bit group R=[r(1), ..., r(30)]. The weighting parameter W and the soft output S are corrected by an iterative process hereafter described. A process unit is executed by setting M and N as follows.

Step 1: M=1, N=30
Step 2: M=1, N=15
Step 3: M=16, N=30

Figure 26:
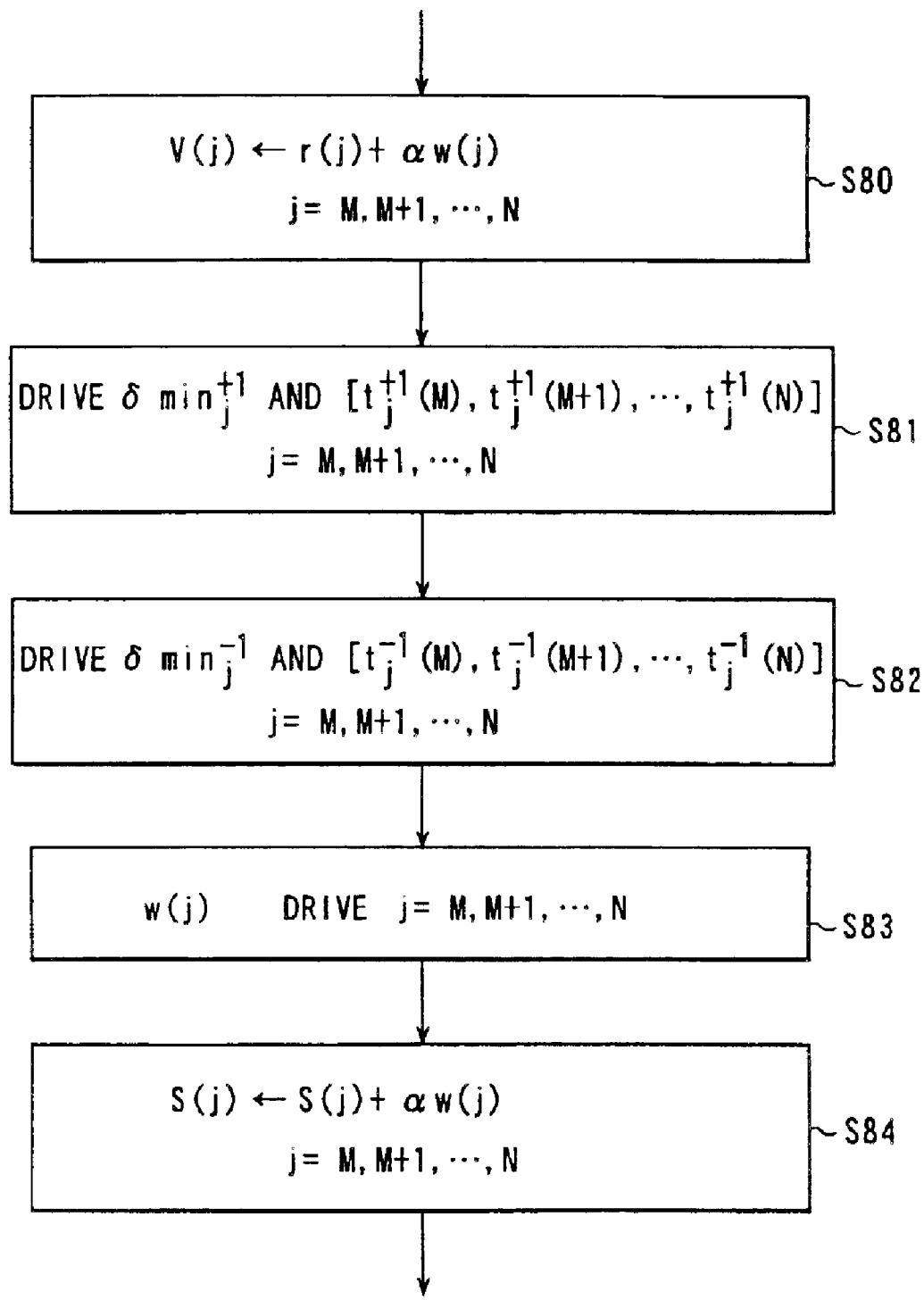
FIG. 26 is a flow chart for description of the third and fourth embodiments of the present invention.
Figure 27:
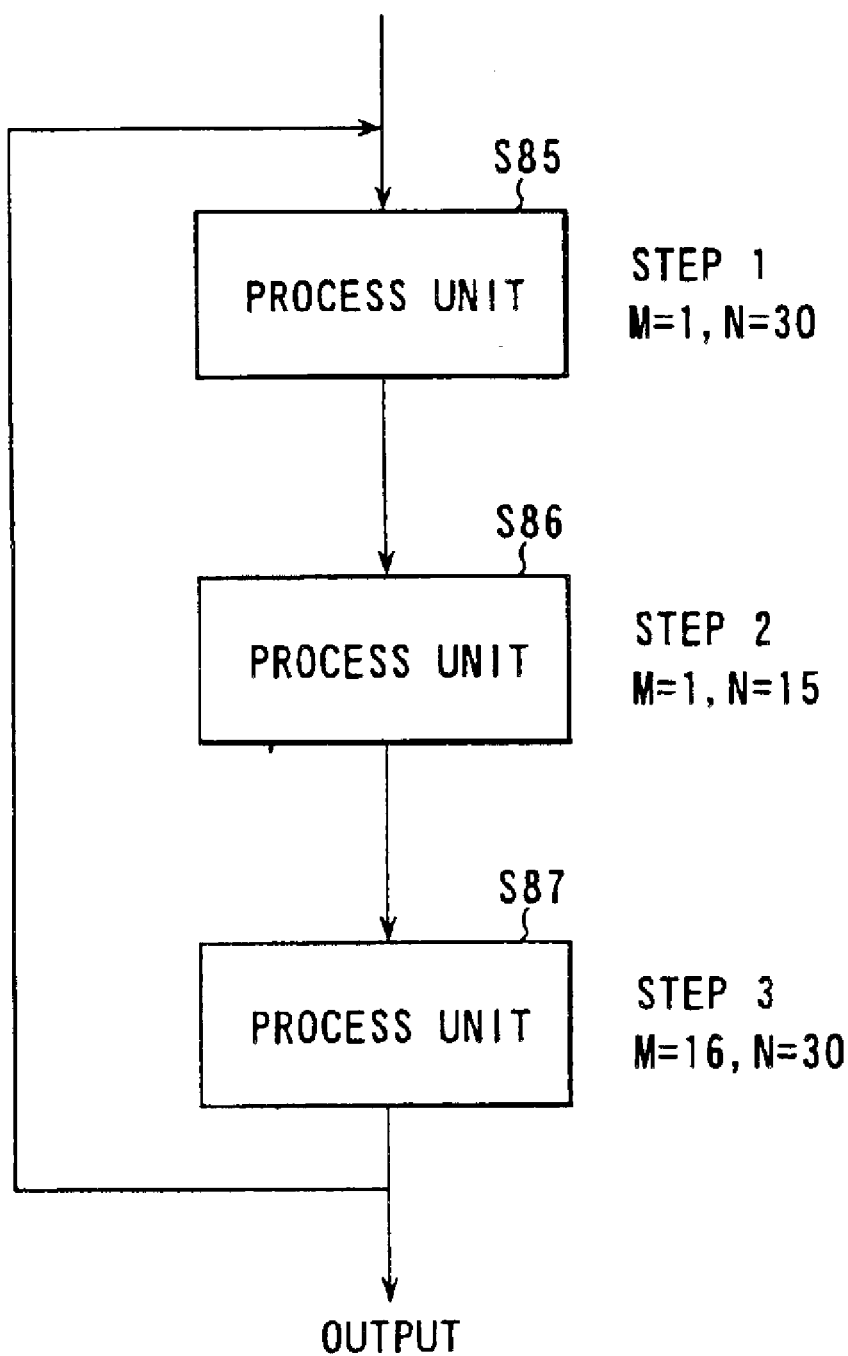
FIG. 27 is a flow chart for description of the third and fourth embodiments of the present invention.

As shown in FIG. 27, a process unit forming these three steps is repeated by steps S85, S86 and S87. Processing contents of the process unit are shown in FIG. 26.

The process unit is also based on an algorithm applied to iterative decoding of a product code. First, for the soft input V [v(1), ..., v(30)], $$v(j)=r(j)+\alpha w(j), j=M \ldots, N \quad \text{(Expression 9)}$$

is calculated at step S80, where α is an coefficient of a real number value.

Subsequently at step S81, an Euclidean distance δ j+1 between the soft input v(M), ..., v(N) and the transmitted encoded control bits of $2^6$ ways which are included in the transmitted encoded control bits t(M), ..., t(N) of $2^7$ ways and which have an element t(j) (j=M, ..., N) equivalent to +1 is calculated by using the following expression.

$$\delta_j^{+1} = (v(M)-t(M))^2 + \ldots + (v(N)-t(N))^2 \quad \text{(Expression 10)}$$

Among $2^6$ Euclidean distance values, a minimum one is defined as $\delta_{min\ j}+1$. In addition, the transmitted encoded control bits at that time are defined as $t_j+1(M), \ldots, t_j+1(N)$.

In the same way, at step S82, a distance $\delta_j-1$ between the received encoded control bits t(M), ..., t(N) and the transmitted encoded control bits of $2^6$ ways which are included in the transmitted encoded control bits t(M), ..., t(N) of $2^7$ ways and which have an element t(j) (j=M, ..., N) equivalent to −1 is calculated by using the following expression.

$$\delta_j^{-1} = (v(M)-t(M))^2 + \ldots + (v(N)-t(N))^2 \quad \text{(Expression 11)}$$

Among $2^6$ Euclidean distance values, a minimum one is defined as $\delta_{min\ j}-1$. In addition, the transmitted encoded control bits at that time are defined as $t_j-1(M), \ldots, t_j-1(N)$.

When the received encoded control bit group R is received and its element r(j) is judged to be d(j)=+1, it can be said that the reliability is high in the case where $\delta_{min\ j}-1$ is as great as possible and $\delta_{min\ j}+1$ is as small as possible. On the contrary, when the element r(j) is judged to be d(j)=−1, the reliability is high in the case where $\delta_{min\ j}+1$ is as great as possible and δ min j−1 is as small as possible.

Here, a log likelihood ratio (LLR) of t(j) of a transmitted symbol which is transmitted is defined by the following expression.

$$LLR(j) = \log \frac{Pr[x(j)=+1/R]}{Pr[x(j)=-1/R]}, j=1, 2, \ldots N \quad \text{(Expression 11-1)}$$

Here, Pr[t(j)=+1/R] is a probability that a jth transmitted symbol t(j) is 1 for a received symbol sequence R. In the same way, Pr[t(j)=−1/R] is a probability that the t(j) is −1.

By using $\delta_{min\ j}+1$ and $\delta_{min\ j}-1$, an approximate value of LLR(j) as represented by the following expression can be obtained.

$$u(j) = \delta\ \min_j{}^{-1} - \delta\ \min_j{}^{+1} \quad \text{(Expression 12)}$$

When the element r(j) is judged to be d(j)=+1, u(j) thus defined has a greater positive value as its reliability becomes higher. On the contrary, when the element r(j) is judged to be d(j)=−1, u(j) assumes a negative value having a greater absolute value as its reliability becomes higher. Therefore, u(j) represents a decision result with due regard to the reliability.

Letting $$h_j(1) = \begin{cases} 0 : t_j^{+1}(1) = t_j^{-1}(1) \\ 1 : t_j^{+1}(1) \neq t_j^{-1}(1), \end{cases} \quad \text{(Expression 13)}$$

u(j) can be rewritten as $$u(j) = 4\left(v(j) + \sum_{1=1, 1\neq j}^{N} r(1)t_j^{+1}(1)h_j(1)\right) \quad \text{(Expression 14)}$$

In this expression, the second term of the right side is a parameter dominating the reliability. By using this, the weighting parameter w(j) is corrected as $$w(j) \leftarrow \sum_{l=1, l \neq j}^{N} r(l) t_j^{+1}(1) h_j(1), \, j = M, \ldots, N \quad \text{(Expression 15)}$$

at step S83. In the same way, the soft output s(j) is corrected as $$s(j) \leftarrow s(j) + \alpha w(j), \, j = M, \ldots, N \quad \text{(Expression 16)}$$

at step S84.

As heretofore described, repetition of the processing unit is conducted. Results of decision effected on s(1), ..., s(7) by taking 0 as the reference are reproduced control bits.

In the iteration of the process units heretofore described, the reliability of each received encoded control bit is gradually increased. At step 1, processing is conducted so as to include the parity 1 and the parity 2. At step 2, processing is conducted so as to include only the parity 1. At step 3, processing is conducted so as to include only the parity 2.

Furthermore, since the parity 1 and the parity 2 are disposed in positions spaced apart in time, the case where additional noise is high, for example, in the parity 1, but additional noise is low in the parity 2, or vice versa may occur. In other words, a time diversity effect is brought about. Even if the precision of the reliability information obtained from one of the parity 1 and the parity 2 is low, therefore, reproduction of the control bits with high precision is conducted provided that the precision of the reliability information is high.

Furthermore, in the fourth embodiment, intensity of the correction in the repetitive processing depends upon the magnitude of the coefficient $\alpha$. The coefficient $\alpha$ may be constant, or may be altered every step or in the middle of the repetition. In an early stage of the repetition, the precision of the estimated reliability is not necessarily high. For example, therefore, such a technique as to provide $\alpha$ with a value close to 0 in the early stage of the repetition and gradually make $\alpha$ closer to 1 as the repetition proceeds is conceivable.

In the fourth embodiment heretofore described, the processing for raising the reliability is repeated in the order of the step 1, step 2, and then step 3. However, the order is not restricted to this. Furthermore, all of the three steps 1, 2 and 3 need not necessarily be used. For example, only the steps 1 and 2 may be used. Or the number of steps may be altered in the middle of the repetition. For example, processing is conducted so as to include the parity 1 and the parity 2 at step 1, so as to include only the parity 1 at step 2, and so as to include only the parity 2 at step 3. As for the repetition of processing, it is desirable from the viewpoint of the precision to use a step including such a parity as to involve as less additional noise as possible. By selecting and altering a step according to the situation, the characteristic is further improved.

Furthermore, in the fourth embodiment, the 8-bit parity 1 is generated for the 7-bit transmitted control bit group by using the BCH (15, 7). In addition, the 15-bit parity 2 is generated by the BCH (30, 15). However, the fourth embodiment is not restricted to this. For the transmitted control bit group having an arbitrary number of bits, the parity 1 and the parity 2 can be generated by using other encoding methods.

Figure 29B:
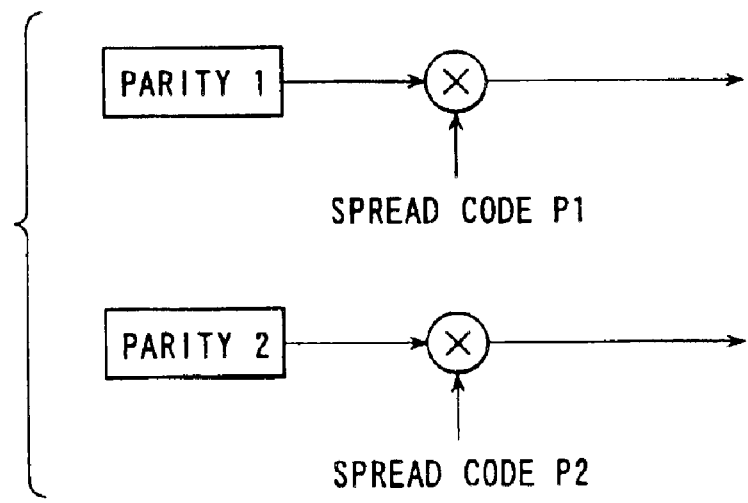

Furthermore, in the fourth embodiment as well, the parity may have a multi-stage configuration as shown in FIG. 28. By doing so, reproduction of the control bits with further higher precision is implemented. Furthermore, the parity 1 and the parity 2 may be transmitted with frequency spacing between as shown in FIG. 29A in order to improve the receiving quality. Or the parity 1 and the parity 2 may be spread out and transmitted with by using different spreading codes as shown in FIG. 29B in order to improve the receiving quality. Or the above described schemes may be combined.

(Fifth Embodiment)

A fifth embodiment of the present invention shows an example of the case where the error protection is effected not only for the header but also for information signals such as computer data, voice and image.

Figure 30:
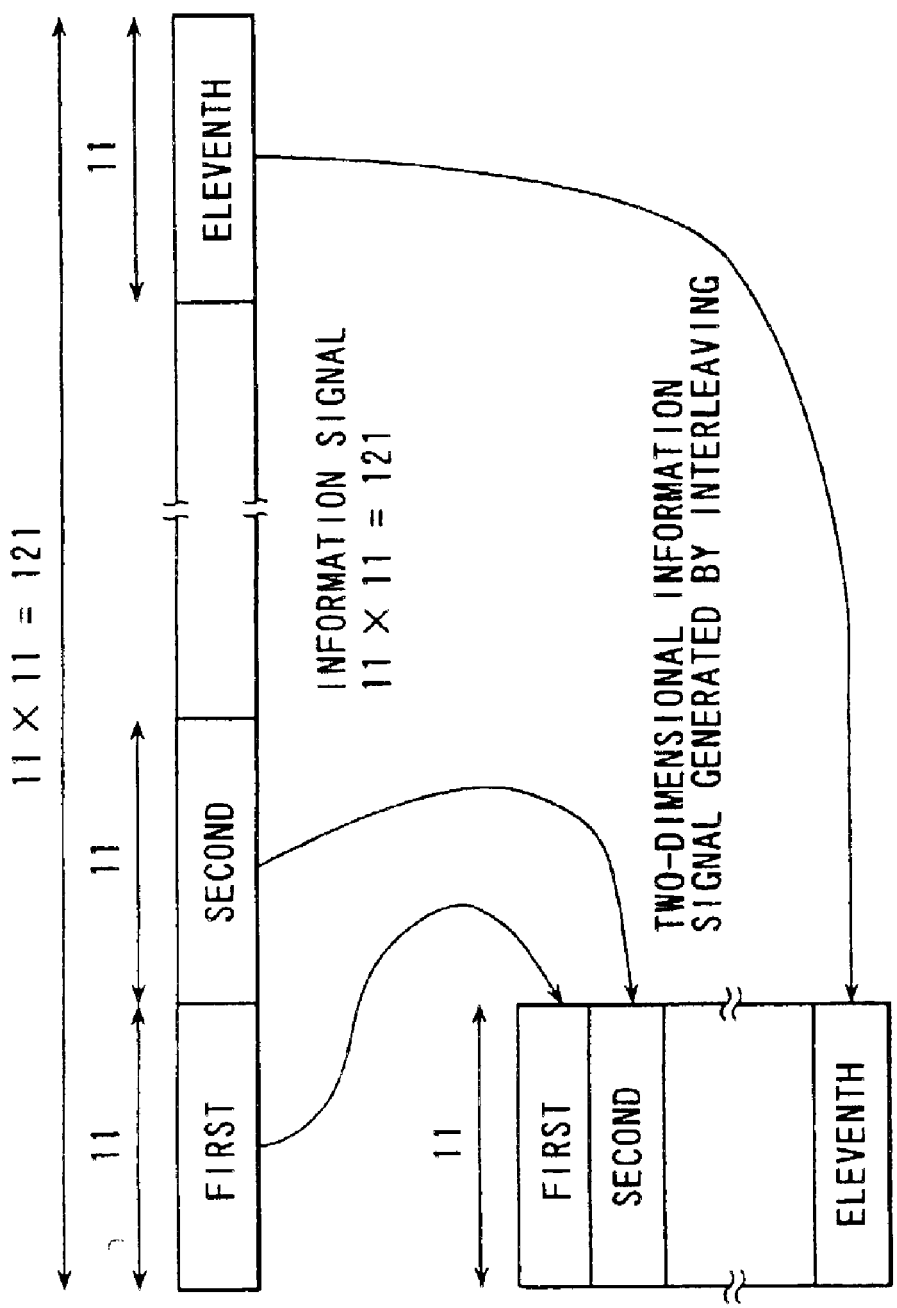
FIG. 30 is a diagram for description of a fifth embodiment of the present invention.
Figure 31:
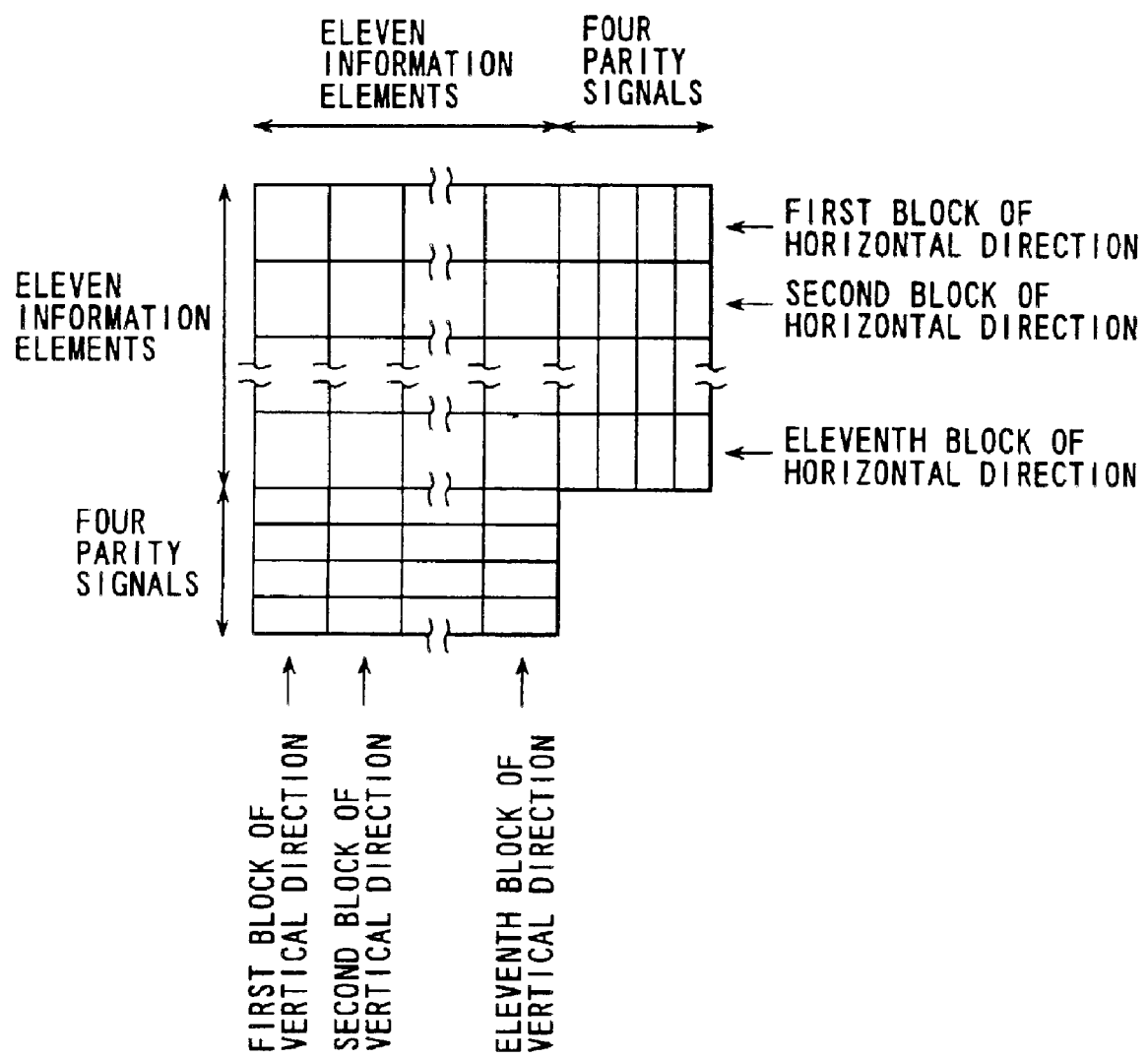
FIG. 31 is a diagram for description of a fifth embodiment of the present invention.

FIGS. 30 and 31 are configuration diagrams of an information signal for description of this embodiment. It is now provisionally assumed that there is an information signal having 11×11=121 elements as shown in FIG. 30. This information signal includes computer dada, voice, and image.

An apparatus of transmitting side first rearranges this information signal into a two-dimensional arrangement having 11 elements in the horizontal direction and having 11 elements in the vertical direction by using an interleaving unit. The interleaving brings about an effect of spreading burst errors caused on the transmission channel.

Subsequently, for the two-dimensionally arranged elements, parity signals are provided by taking a block as the unit as shown in FIG. 31. In other words, every information block having 11 elements in the horizontal direction is provided with 4 parity signals according to the encoding rule of, for example, BCH (15, 11). Subsequently, every information block having 11 elements in the vertical direction is provided in the same way with 4 parity signals according to the encoding rule of, for example, BCH (15, 11). By this processing, 11×4=44 parity signals in total are added in the horizontal direction, and 11×4=44 parity signals in total are added in the same way in the vertical direction as well.

As a result, a transmitted encoded signal having 121+44+44=209 elements which include both information signals and parity signals is generated.

On the other hand, a receiving apparatus conducts decoding processing on the received encoded signal by using the decoding scheme described before with reference to the fourth embodiment, i.e., the decoding scheme in which the reliability of the decision value of each bit is derived by the repetition of the process unit to effect code decision. In the above described fourth embodiment, however, there are $2^7$ patterns of the encoded signal because the BCH (15, 7) code is used. The present embodiment differs from the fourth embodiment in that there are 211 encoded signal patterns because the BCH (15, 11) code is used. Furthermore, in the process unit, M=1 and N=15. In the present embodiment, the signals defined in the fourth embodiment are considered to be two-dimensional signals, such as a transmitted encoded signal t(I,j), a received encoded signal r(i,j), a reliability signal w(i,j), an input signal v(i,j), and an output signal s(i,j).

For the input signal v(i,j), the reliability signal w(i,j) and output signal s(i,j) each having 209 elements, initial values are determined as follows.

$$v(i,j)=0.0$$

$$w(i,j)=0.0$$

$$s(i,j)=r(i,j)$$

And letting at step 1

$$v(i,j)=r(i,j)+\alpha w(i,j), j=1, \ldots, 15,$$

the process unit in the fourth embodiment is executed for the first to eleventh blocks in the horizontal direction (i=1, ..., 11), and the reliability parameter w(i,j) is derived for every element. And the output signal s(i,j) is corrected as $$s(i,j) \leftarrow s(i,j) + \alpha w(i,j), j=1, \ldots, 15.$$

Subsequently, letting at step 2

$$v(i,j) = r(i,j) + \alpha w(i,j), j=1, \ldots, 15,$$

the process unit in the fourth embodiment is executed for the first to eleventh blocks in the vertical direction (j=1, ..., 11), and the reliability parameter w(i,j) is derived for every element. And the output signal s(i,j) is corrected as $$s(i,j) \leftarrow s(i,j) + \alpha w(i,j), j=, \ldots, 15.$$

By repetitively executing the step 1 and the step 2, the output signal s(i,j) raised in reliability can be obtained for every element. As the number of times of repetition is increased at this time, the reliability is raised, but the amount of computation and the processing time is increased.

After repetitive computation of an appropriate number of times has been completed for all elements, therefore, computation is repeated for only elements requiring especially high reliability among all elements, i.e., requiring high error protection.

For example, if important data has been inserted in the first block of the horizontal direction, then repetitive computation of an appropriate number of times is conducted, and thereafter the step 1 is executed only for the first block (i=1) of the horizontal direction, and the step 2 is executed for each of the first to eleventh blocks (j=1, ..., 11) of the vertical direction. Thereafter, the step 1 and the step 2 are repeated. As a result, elements included in the first block of the horizontal direction are subjected to correction of the reliability w(i,j) in both the step 1 and the step 2. Therefore, the computer data inserted in the first block of the horizontal direction can be decoded with high reliability. On the other hand, correction of the reliability w(i,j) for elements of other blocks is conducted only at the step 2. Therefore, the amount of computation is reduced, and the processing time is shortened.

In the fifth embodiment as heretofore described, correction of the reliability is conducted by using the steps 1 and 2 only for blocks in which highly important data out of the transmitted information is inserted. For other blocks, correction of the reliability is conducted by using only the step 2. As compared with the case where correction of the reliability is conducted by using the step 1 and the step 2 for all information blocks, therefore, it becomes possible to conduct decoding efficiently in a short processing time while keeping the receiving quality of highly important data high.

Furthermore, in the fifth embodiment, the number of parity bits added to all information can be made identical. Unlike, for example, the case where a large number of parities are added to information having high importance and a small number of parities are added to information having importance which is not so high, therefore, it becomes unnecessary to provide error correction encoders and error correction decoders each having a correction capability depending upon the intensity stage of error correction in the transmitting apparatus and the receiving apparatus, respectively. As a result, the circuit scale of the transmitting apparatus and the receiving apparatus can be made small.

In the fifth embodiment heretofore described, the reliability correction processing using the step 1 and the step 2 is repeated only for the first block of the horizontal direction. However, the reliability correction processing using the step 1 and the step 2 may be executed only for the first block of the vertical direction. Alternatively, the reliability correction processing using the step 1 and the step 2 may be executed for a plurality of specific blocks among all blocks of the horizontal direction and the vertical direction, or for specific elements in one block.

Furthermore, as the error correction signal, a different block code such as the Reed-Solomon code, or a convolutional code may be used instead of the BCH code. Furthermore, in the third and fifth embodiments, the distance between all patterns of the transmitted encoded signal and the received encoded signal has been directly derived by using the calculation of the Euclidean distance. However, the distance calculation is not restricted to this, but distance calculation utilizing the trelis structure frequently used in decoding convolutional codes and the like may also be used.

Furthermore, the present invention can be applied not only to media information, but also to other information data multiplex transmission. Especially, the present invention has been directed to the standardized scheme for multimedia information communication (MPEG (Moving Picture Experts Group) 4). As a matter of course, therefore, information of that standardized scheme is included as the handled information.

(Sixth Embodiment)

In a sixth embodiment of the present invention, a system for accommodating a plurality of kinds information data such as voice data, image data and computer data into a single packet and conducting radio transmission of the packet is divided into an important part and an unimportant part. In the important part, the above described various kinds of information data need to be intensely protected against transmission errors. Even if errors occur in the unimportant part, reception and reproduction of the information data are not so severely affected. And the important part is doubly encoded by using first and second error correction codes and transmitted. The unimportant part is encoded by using only the second error correction code and transmitted.

Figures 32A, 32B:
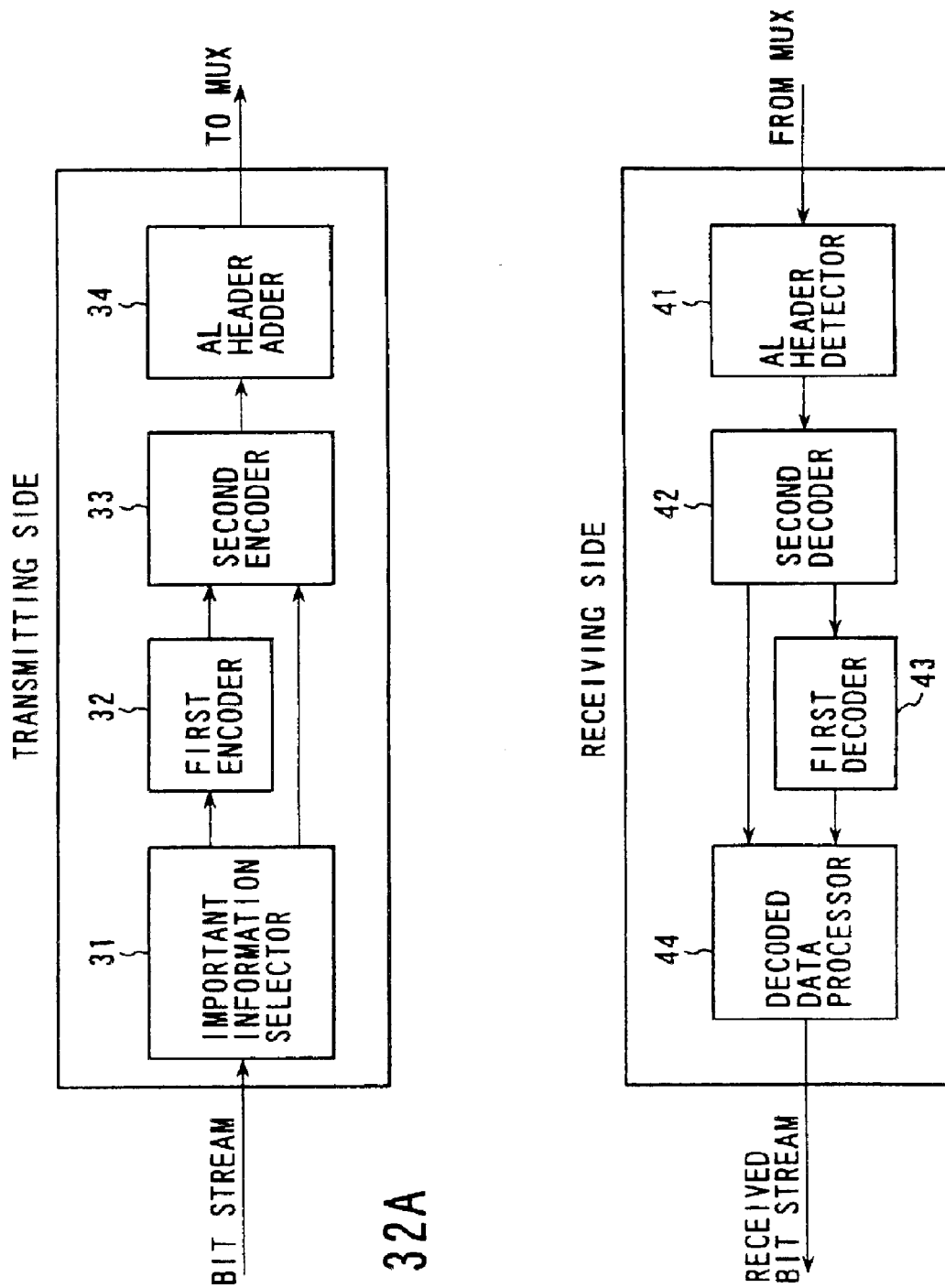
FIGS. 32A and 32B are block diagrams showing a configuration of an image transmission processor according to a sixth embodiment of the present invention.

FIGS. 32A and 32B are circuit block diagrams showing the configuration of an AL (Adaptation Layer) of a communication apparatus for implementing the present embodiment. FIG. 32A shows an AL processing unit of the transmitting side, and FIG. 32B shows an AL processing unit of the receiving side.

The AL processing unit of the transmitting side includes an important part (high QoS) selector 31, a first encoder 32, a second encoder 33, and an AL header adder 34. On the other hand, the AL processing unit of the receiving side includes an AL header detector, a second decoder 42, a first decoder 43, and a decoded data processor 44.

Such a configuration will now be described by taking image data as an example. A bit stream of image data is first input to the high QoS selector 31. In the high QoS selector 31, the bit stream of image data is divided into an important part (high QoS part) and an unimportant part (low QoS part). For example, in the case of a MPEG4 image, data such as RM (Resynchronization Marker), MBA (Macroblock Address) and QP (Quantization Parameter) is decided to be the important part and other data are decided to be the unimportant part.

Among the image data resulting from the division, the important part is input to the first encoder 32 and subjected to error correction encoding. As the first encoder 32, a Reed-Solomon (RS) encoder over $GF(2^8)$ having a correction capability of t bytes, for example, is used. In general, the code length of the RS code is fixed to 255 bytes. However, the length of the important part of the image data is a variable length and sometimes shorter than 255 bytes. In such a case, the RS code is shortened and used. For example, in the case where the code length of the important part is I HQ, a shortened (I HQ+2e, I HQ) RS code is used, where I HQ+2e $\leq$ 255.

To the head of encoded image data of the important part output from the first encoder 32, a header H (1 byte) representing its code length is added. As illustrated, this header is formed of 8-bit length information representing the length of the important part (high QoS part), 4-bit location information representing the location of the important part in the AL-SDU, and an error correction code having a 12-bit Golay (24, 12) code.

Furthermore, to the tail end of the encoded image data of the important part with the header H added thereto and image data of the unimportant part, a CRC serving as an error correction code and a tail bit TB are added. The TB is provided for convolutional encoding conducted in the second encoder 33.

An AL-SDU thus generated is input to the second encoder 33 and subjected to error correction encoding therein. For the second error correction encoding, a convolutional code having an encoding rate of ¼ is used. An encoded image data sequence obtained as a result of this convolutional encoding is punctured so as to have a predetermined encoding rate $r_{target}$, and thereafter input to the AL header adder 34 as an AL payload. In the AL header adder 34, an AL header including a number indicating the transmitting order of the signal is added to the above described AL payload. The AL payload having the AL header added thereto is input to a multiplexing unit (MUX), which is not illustrated, as an AL-PDU (Protocol Data Unit).

Figure 13A:
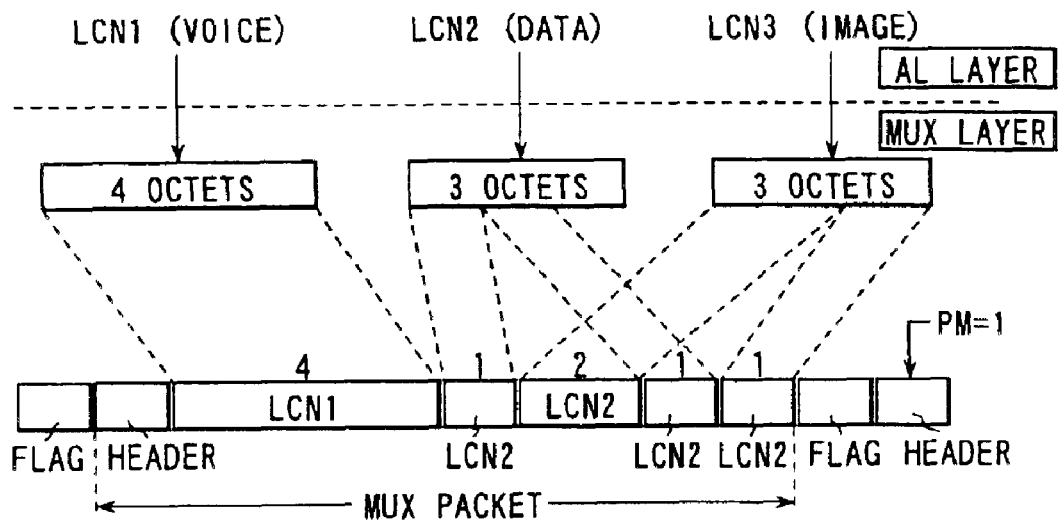
FIGS. 13A and 13B are diagrams showing an example of a conventional standardized multimedia multiplex scheme.
Figure 13B:
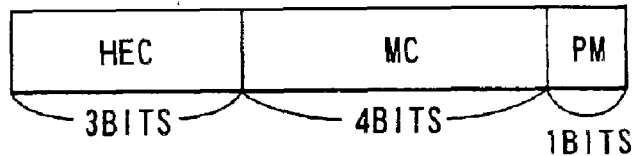

In the multiplexer, the above described AL-PDU of image data is inserted into a packet as shown in FIG. 13 together with an AL-PDU of voice data and an AL-PDU of voice data generated in the same way in other AL processors. And this multiplex packet is modulated, and then transmitted from a radio unit onto a radio transmission channel.

On the other hand, in a communication apparatus of the receiving side, the multiplex packet signal transmitted via the radio transmission channel is received, demodulated, and then input to a demultiplexing unit. In the demultiplexing unit, the multiplex packet signal is demultiplexed to the AL-PDU of the image data, the AL-PDU of the voice data and the AL-PDU of the computer data. And these AL-PDUs are subjected to error correction decoding in respective AL processing units.

For example, in the AL processing unit for image data, the AL header is first extracted in the AL header detector 41. The AL payload is inverse-punctured, then input to the second decoder 42, and therein first subjected to error correction decoding by using the Viterbi decoding scheme. As for the AL-SDU' resulting from this decoding, the encoded image data of the important part is selected on the basis of the content of the header H. The encoded image data of the important part is input to the first decoder 43, and subjected to RS decoding therein. By the way, code errors caused in the header are corrected by error correction decoding using the error correction code (Golay (24, 12) code).

In the decoded data processor 44, the AL-SDU is reproduced by using the image data of the important part subjected to the RS decoding and the image data of the unimportant part of the AL-SDU'. From this AL-SDU, the received bit stream of image data is reproduced.

In the sixth embodiment heretofore described, information data is divided into an important part and an unimportant part. Only the important part is subjected to RS encoding. Thereafter, the information data of the encoded important part and the information data of the unimportant part are subjected to error correction encoding using a convolutional code.

Therefore, the important part of the information data can be protected intensely by using double error correction encoding. Even in the case where the information data is transmitted via a radio transmission channel having a degraded transmission quality, therefore, the probability that the information can be decoded and reproduced correctly on the receiving side becomes high. Furthermore, since double error correction is conducted only for the important part of the information data, the transmission efficiency can be raised as compared with the case where double error correction is conducted for all of the information data.

Furthermore, in the sixth embodiment, the error detection function is provided by adding the CRC to the header representing the code length of the data of the important part subsequent to the RS encoding. Therefore, it becomes possible to specify the range of the important part included in the AL-SDU' more accurately. As a result, it becomes possible to conduct the RS decoding of the information part more accurately.

For the sixth embodiment heretofore described, the following variant is conceivable.

Figure 34:
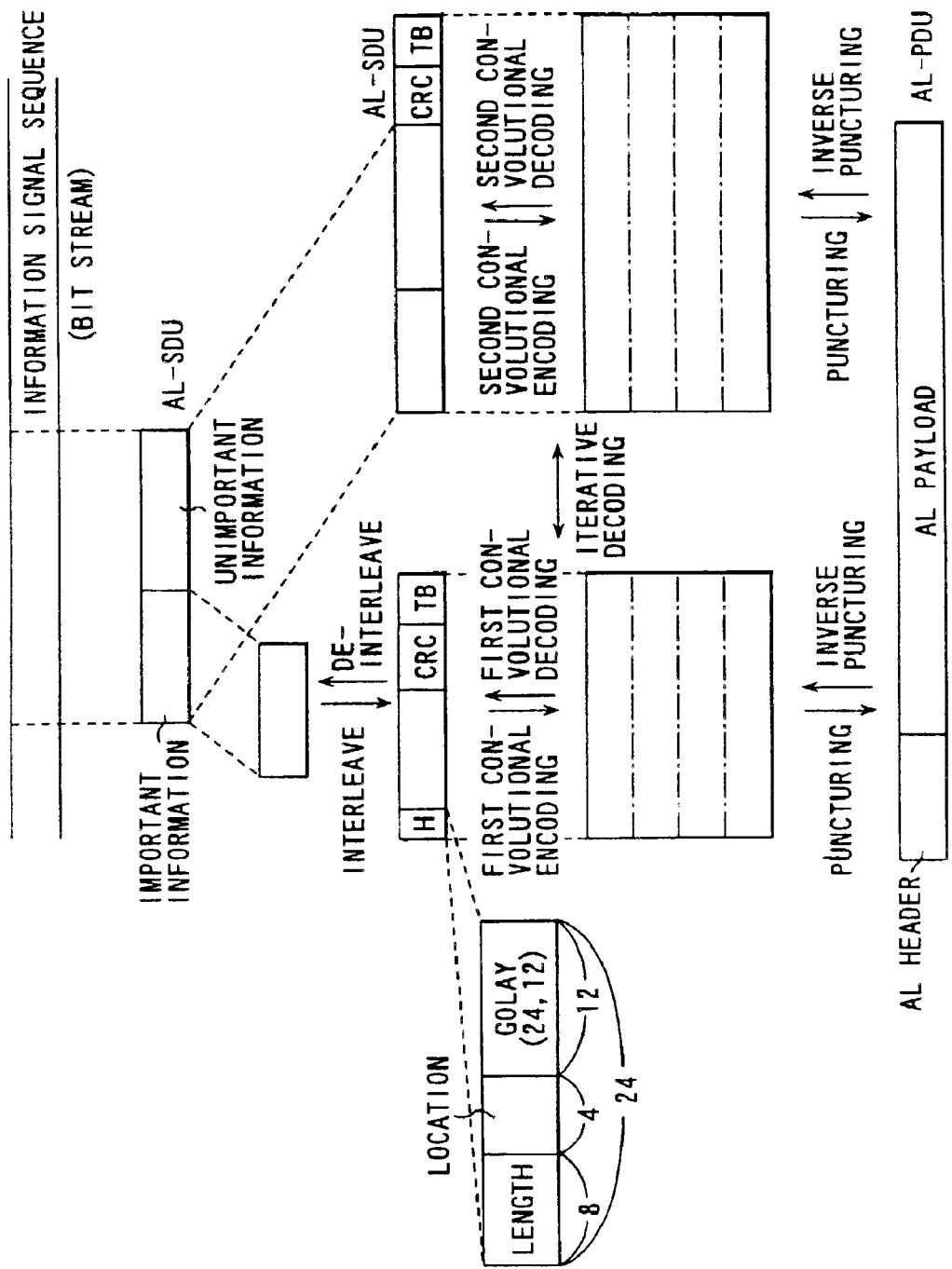
FIG. 34 is a diagram to be used for operation description of a variant of the sixth embodiment of the present invention.

In other words, the RS encoding conducted for the important part of the information data in the first encoder 32 can be replaced by convolutional encoding. FIG. 34 is a diagram showing operation conducted in the case where this convolutional encoding is effected.

On the transmitting side, interleaving is first conducted for the important (high QoS) part. To the information data of the important part, a header H (1 byte) representing its code length, a CRC, and a tail bit TB are added. Subsequently, for the whole of the information data of the important part having the header H and so on added thereto, convolutional encoding is conducted by using a first convolutional code. According to the necessity, it is then punctured so as to have a predetermined encoding rate.

Apart therefrom, a CRC and a tail bit TB are added to the whole of the above described AL-SDU including both the important part and the unimportant part of the information data to form AL-SDU'. For the AL-SDU', error correction encoding is conducted by using a second convolutional code. The encoded AL-SDU' is punctured so as to have a predetermined encoding rate.

Finally, the information data of the important part encoded by using the first convolutional code and the AL-SDU' encoded by using the second convolutional code are multiplexed to generate an AL payload. An AL header is added to the AL payload. An AL-PDU is thus generated, and transmitted.

On the receiving side, for the information data of the important part encoded by using the first convolutional code and the AL-SDU' encoded by using the second convolutional code, decoding processing is conducted by using different decoders, respectively. Between the decoders, iterative decoding is conducted for the information of the important part. Information data of the important part and information data of the unimportant part reproduced by the decoding processing are combined to form AL-SDU. On the basis of the AL-SDU, the bit stream of the original received data is reproduced.

Also by using such a configuration, it becomes possible to conduct double error correction encoding on the important part of the important part of the information data, and it becomes possible to transmit the information data correctly while ensuring the transmission efficiency to some degree.

In another variant, the transmission channel state is monitored. In the case where the transmission channel quality has been judged to be fine, the encoding rate target of the convolutional code in the second encoder 33 described with reference to FIG. 32 is set to 1. By doing so, it is possible to bring the second encoder 33 into a through state and omit the convolutional encoding for the AL-SDU'.

Furthermore, in a system fixedly using a transmission channel having a fine transmission quality, the second encoder 33 and the second decoder 42 may be removed from the multiplexing apparatus and the demultiplexing apparatus, respectively. Circuit configurations of the multiplexing apparatus and the demultiplexing apparatus in this case are shown in FIGS. 35A and 35B, respectively.

By using such a configuration, the encoding rate of the convolutional code required to obtain a desired quality becomes smaller. Even in a system having a limited transmission band, such as a mobile communication system, therefore, it is possible to implement information transmission of a higher quality and a higher rate. In addition, the error correction encoding and decoding processing in the multiplexing apparatus and the demultiplexing apparatus can be simplified.

Figure 33:
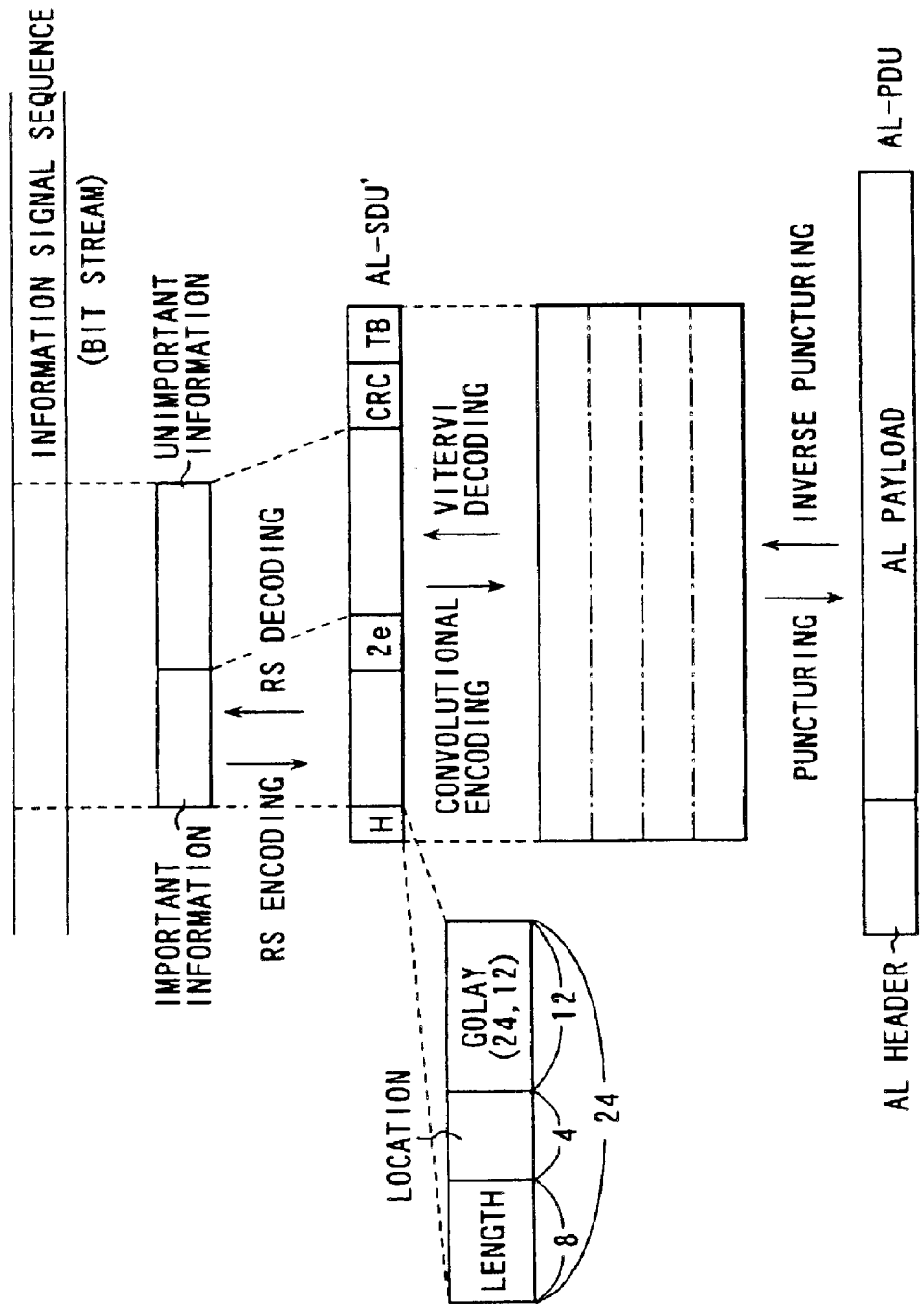
FIG. 33 is a diagram to be used for operation description of the image transmission processor according to the sixth embodiment of the present invention.

The RS code used in FIGS. 33 and 34 to conduct error correction encoding on the important part of the information data, and the first convolutional code described with reference to FIG. 34 may be replaced by other error correction codes.

The sixth embodiment has heretofore been described by taking the multiplexing apparatus and the demultiplexing apparatus of the multimedia multiplex information transmission system as an example. However, the error correction scheme for the information data described with reference to the sixth embodiment can be applied to other information transmission systems as well. As for the error correction scheme itself, various embodiments as hereafter described are conceivable. Hereafter, the embodiments will be described.

(Seventh Embodiment)

Figure 36:
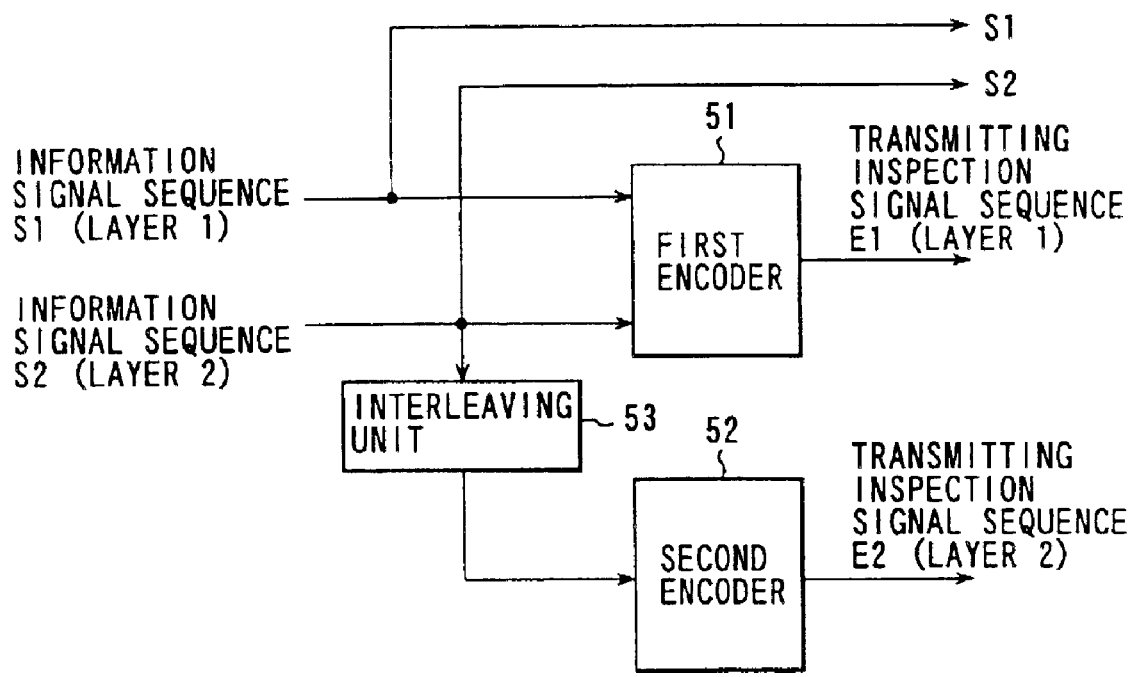
FIG. 36 is a block diagram showing a configuration of an error correction encoder according to a seventh embodiment of the present invention.

FIG. 36 is a schematic configuration diagram of an error correction coding apparatus of an error correction system according to a seventh embodiment of the present invention.

Information data are various kinds of media information such as computer data, voice data and image data. In an information classifier which is not illustrated, these information data are divided into a first information signal sequence (layer 1) requiring error protection of an ordinary degree and a second information signal sequence (layer 2) requiring more intense error protection than the layer 1. For example, in the case where a plurality of kinds of media information are subjected to multiplex. transmission, voice data and image data are classified as information of the layer 1 and computer data is classified as the layer 2. Furthermore, the same media information may be divided into the layer 1 and the layer 2. For example, in the case of image data, various kinds of control information, movement prediction information, and a low frequency component of discrete cosine transform (DCT) need intense error protection. Therefore, these kinds of information are classified as the layer 2, and information of a high frequency component of DCT is classified as layer 1.

A first information signal sequence S1 classified as the layer 1 and a second information signal sequence S2 classified as the layer 2 are input to a first encoder 51. In the first encoder 51, they are collectively subjected to error correction encoding by using, for example, a convolutional code. As a result, a first inspection signal sequence E1 is generated. Out of the first and second information signal sequences S1 and S2, the second information signal sequence S2 which is more important is changed in information element order by an interleaving unit 53, then input to a second encoder 52, and subjected to error correction encoding by using, for example, a convolutional code. As a result, a second inspection signal sequence E2 is generated.

Figure 37:
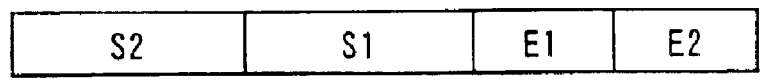
FIG. 37 is a diagram showing a transmission format of a transmitted encoded signal.

The first information signal sequence S1, the second information signal sequence S2, the first inspection signal sequence E1, and the second inspection signal sequence E2 are multiplexed, for example, as shown in FIG. 37, and transmitted to a transmission channel.

On the other hand, an error correction decoding apparatus of the receiving side is formed as described below. FIGS. 38 to 42 are circuit block diagrams showing the configurations.

In other words, five decoding schemes are conceivable.

(1) First Decoding Scheme

Figure 38:
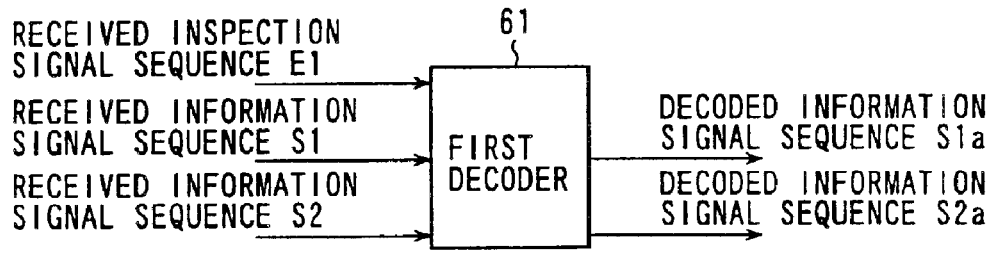
FIG. 38 is a block diagram showing a configuration of an error correction decoder implementing a first decoding scheme in the seventh embodiment of the present invention.

In a first decoding scheme, received information signal sequences S1 and S2 are input to a first decoder 61 together with an inspection signal sequence E1 as shown in FIG. 38. They are subjected to error correction decoding therein. As a result, first and second decoded information signal sequences S1a and S2a are obtained.

As for the decoding scheme of the first decoder 61, a decision is made as to whether a received information signal sequence of real value elements containing noise is +1 or −1 depending upon whether it is greater than 0. Thus, so-called hard decision is used. If this hard decision is used, simple decoding is possible. In the case where decoding of further higher precision is necessary, it is preferable to use most likelihood decoding based upon soft decision in which decoding is conducted without making a decision on the received information signal sequence of real value elements containing noise.

The first decoding scheme is used in the case where the transmission channel quality is comparatively favorable and the second information signal sequence S2 can be decoded correctly by error correction decoding in the first decoder 61.

(2) Second Decoding Scheme

Figure 39:
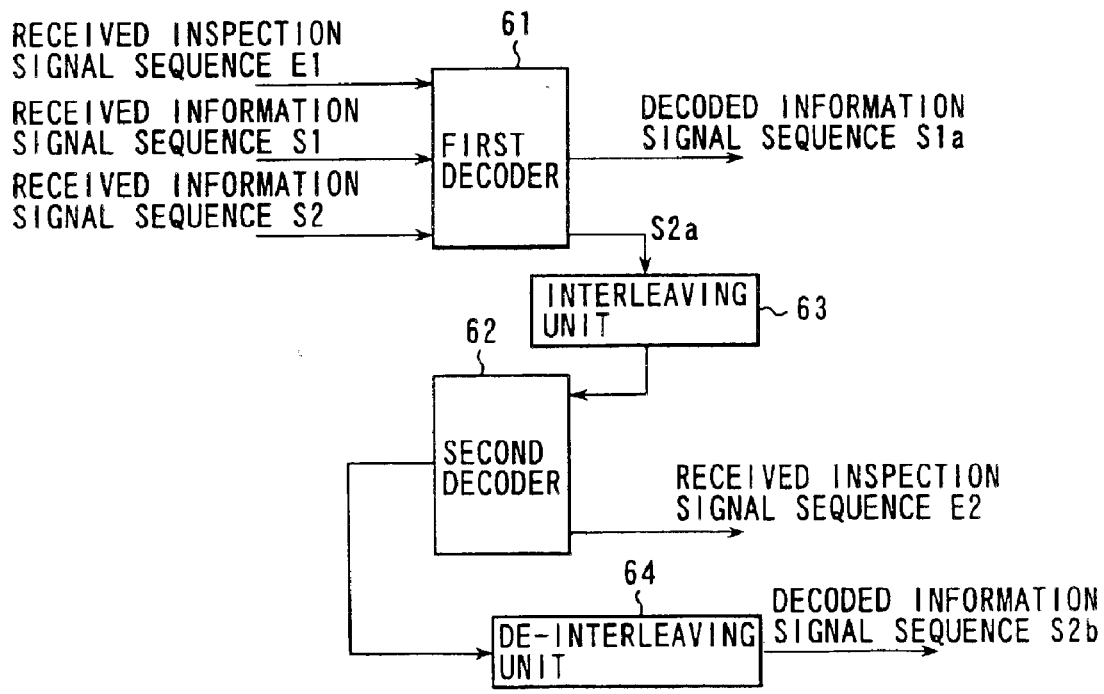
FIG. 39 is a block diagram showing a configuration of an error correction decoder implementing a second decoding scheme in the seventh embodiment of the present invention.

In a second decoding scheme, received information signal sequences S1 and S2 are input to a first decoder 61 together with a received inspection signal sequence E1 as shown in FIG. 39. They are subjected to error correction decoding therein. As a result, decoded information signal sequences S1a and S2a are obtained. Out of the decoded information signal sequences S1a and S2a, the decoded information signal sequence S2a is changed in information element order by an interleaving unit 63, then input to a second decoder 62 together with a received inspection code E2, and subjected to error correction encoding therein. Its output signal sequence is subjected to de-interleaving in a de-interleaving unit 64 to form a decoded information signal sequence S2b.

As for the decoding schemes of the first and second decoders 61 and 62, it is conceivable to use the hard decision for both decoders or use the most likelihood decoding method based upon the soft decision for both decoders. Besides, there is also conceivable such a scheme that the most likelihood decoding based upon the soft decision is conducted in the first decoder 61, and thereafter the hard decision is conducted in the second decoder 62.

In the second decoding scheme, double error correction decoding is conducted on the information signal sequence S2 of the layer 2 in the first and second decoders 61 and 62. Even if the transmission channel quality is poor as in the case where, for example, a radio transmission channel is used as the transmission channel, therefore, at least the second information signal sequence S2 can be decoded correctly. For example, in the case where image data are divided to a layer 1 and a layer 2 for transmission, at least various kinds of information which is important in constructing images can be decoded and reproduced correctly. Therefore, sufficiently decipherable images can be reconstructed.

(3) Third Decoding Scheme

Figure 40:
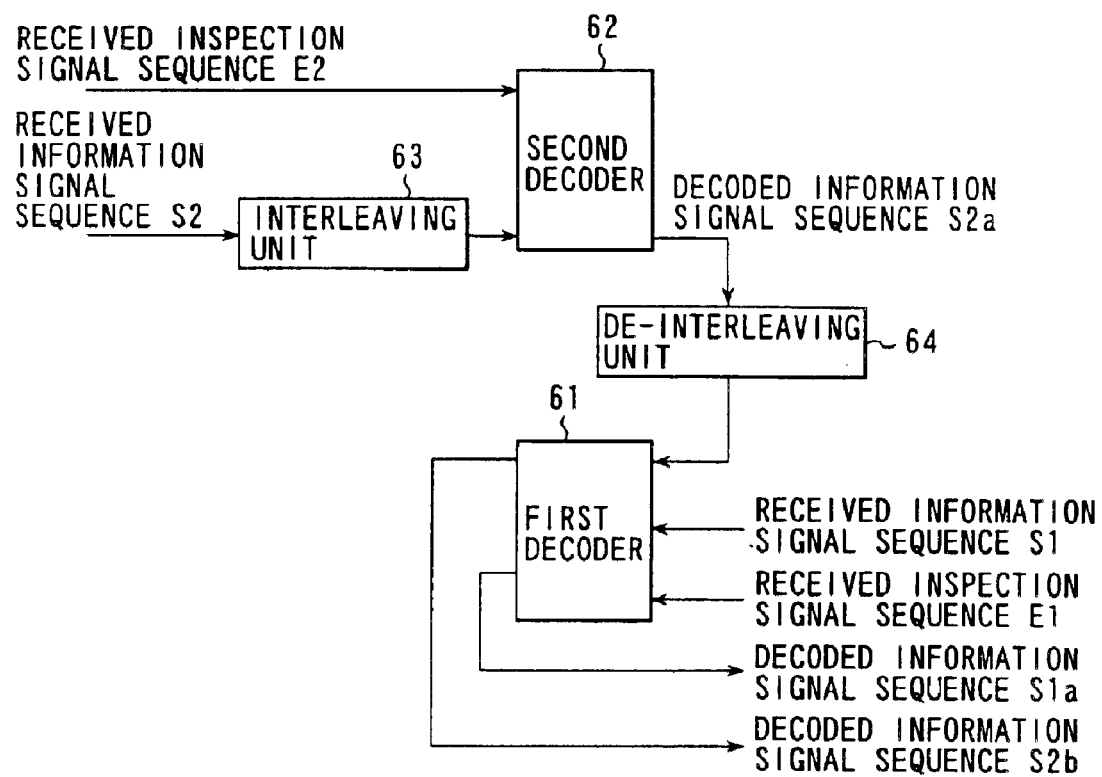
FIG. 40 is a block diagram showing a configuration of an error correction decoder implementing a third decoding scheme in the seventh embodiment of the present invention.

A third decoding scheme is shown in FIG. 40. First of all, a received information signal sequence S2 is subjected to interleaving in an interleaving unit 63, then input to a second decoder 62 together with a received inspection signal sequence E2, and subjected to error correction decoding therein. Subsequently, a decoded information signal sequence S2a obtained from the second decoder 62 is subjected to de-interleaving in a de-interleaving unit 64, then input to a first decoder 61 together with a received information signal sequence S1 and a received inspection signal sequence E1, and subjected to error correction decoding therein. As a result, a decoded information signal sequence S1a and a decoded information signal sequence S2b are obtained.

As for the decoding schemes of the first and second decoders 61 and 62, it is conceivable in the same way as the case of the second decoding scheme to use the hard decision for both decoders or use the most likelihood decoding method based upon the soft decision for both decoders. Besides, there is also conceivable such a scheme that the most likelihood decoding based upon the soft decision is conducted in the second decoder 62, and thereafter the hard decision is conducted in the first decoder 61.

(4) Fourth Decoding Scheme

In a fourth decoding scheme, decoding of an information signal sequence S2 requiring intense error protection is conducted by repeating the most likelihood decoding between a first decoder 61 and a second decoder 62. This aims at obtaining a highly reliable decoded information signal sequence.

Figure 41:
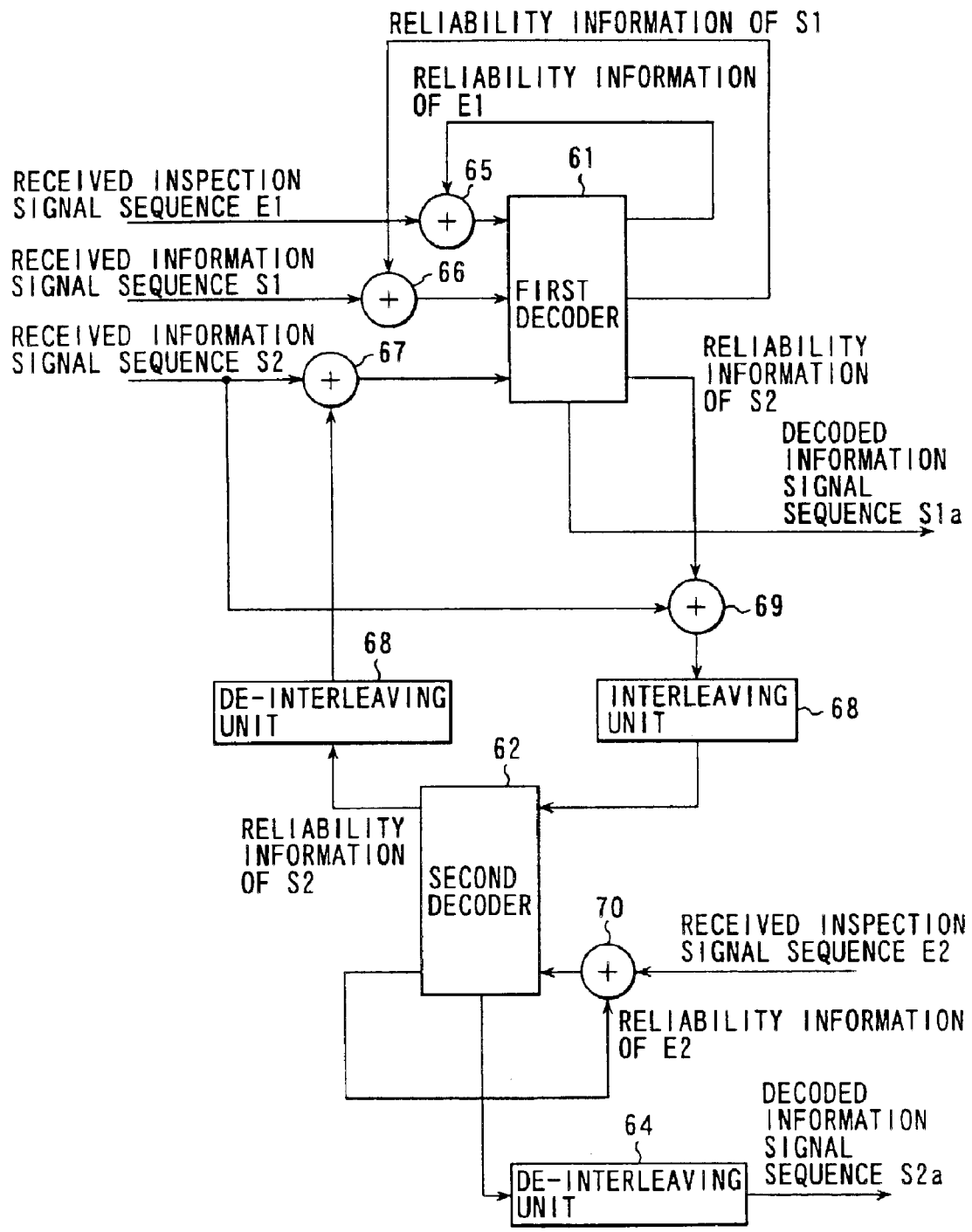
FIG. 41 is a block diagram showing a configuration of an error correction decoder implementing a fourth decoding scheme in the seventh embodiment of the present invention.

As shown in FIG. 41, a received information signal sequence S1 and a received information signal sequence S2 are first input to a first decoder 61 together with a received inspection signal sequence E1, and subjected to error correction decoding using the most likelihood decoding method therein. Reliability information of the received information signal sequence S2 obtained by the first decoder 61 is added in an adder 69 to the received information signal sequence S2, subjected to interleaving in an interleaving unit 63, then input to a second decoder 62 together with a received inspection signal sequence E2, and subjected to error correction decoding using the most likelihood decoding method therein. At this time, a decoded information signal sequence S1a obtained from the first decoder 61 is output as it is as a decoding result.

On the other hand, reliability information of the received information signal sequence S2 obtained from the second decoder 62 is subjected to de-interleaving in a de-interleaving unit 68, then added in an adder 67 to the received information signal sequence S2, and input to the first decoder 61. Furthermore, at this time, there are input to the first decoder 61 reliability information of the received information signal sequence S1 and reliability information of the received inspection signal sequence E1 previously obtained from the first decoder 61, after being added in adders 65 and 66 to the received information signal sequence S1 and the received inspection signal sequence E1, respectively. The most likelihood decoding is thus conducted therein again.

Reliability information of the received information signal sequence S2 obtained as a result of decoding of the second time from the first decoder 61 is added in an adder 69 to the received information signal sequence S2, then subjected to interleaving, and input to the second decoder 62. Furthermore, at this time, there is input to the second decoder 62 reliability information of the received inspection signal sequence E2 obtained by the decoding of the first time, after being added in an adder 70 to the received inspection signal sequence E2. The most likelihood decoding is thus conducted therein again.

Between the first decoder 61 and the second decoder 62, the decoding processing using the iteration of the most likelihood decoding is thus conducted on the received information signal sequence S2. The iterative decoding processing heretofore described is repeated by a predetermined number of times. After this repetition has been finished, a decoded information signal sequence obtained from the second decoder 62 is subjected to de-interleaving in a de-interleaving unit 64, and output as a decoded information signal sequence S2c.

During the iterative decoding processing heretofore described, the received information signal sequences S1 and S2 and the received inspection signal sequences E1 and E2 are stored in a memory which is not illustrated. Every iteration, they are read out from the memory and input to the first and second decoders 61 and 62. Before the iterative decoding processing is started, each reliability information is initialized to "0".

(5) Fifth Decoding Scheme

A fifth decoding scheme is another scheme using iteration of the most likelihood decoding.

Figure 42:
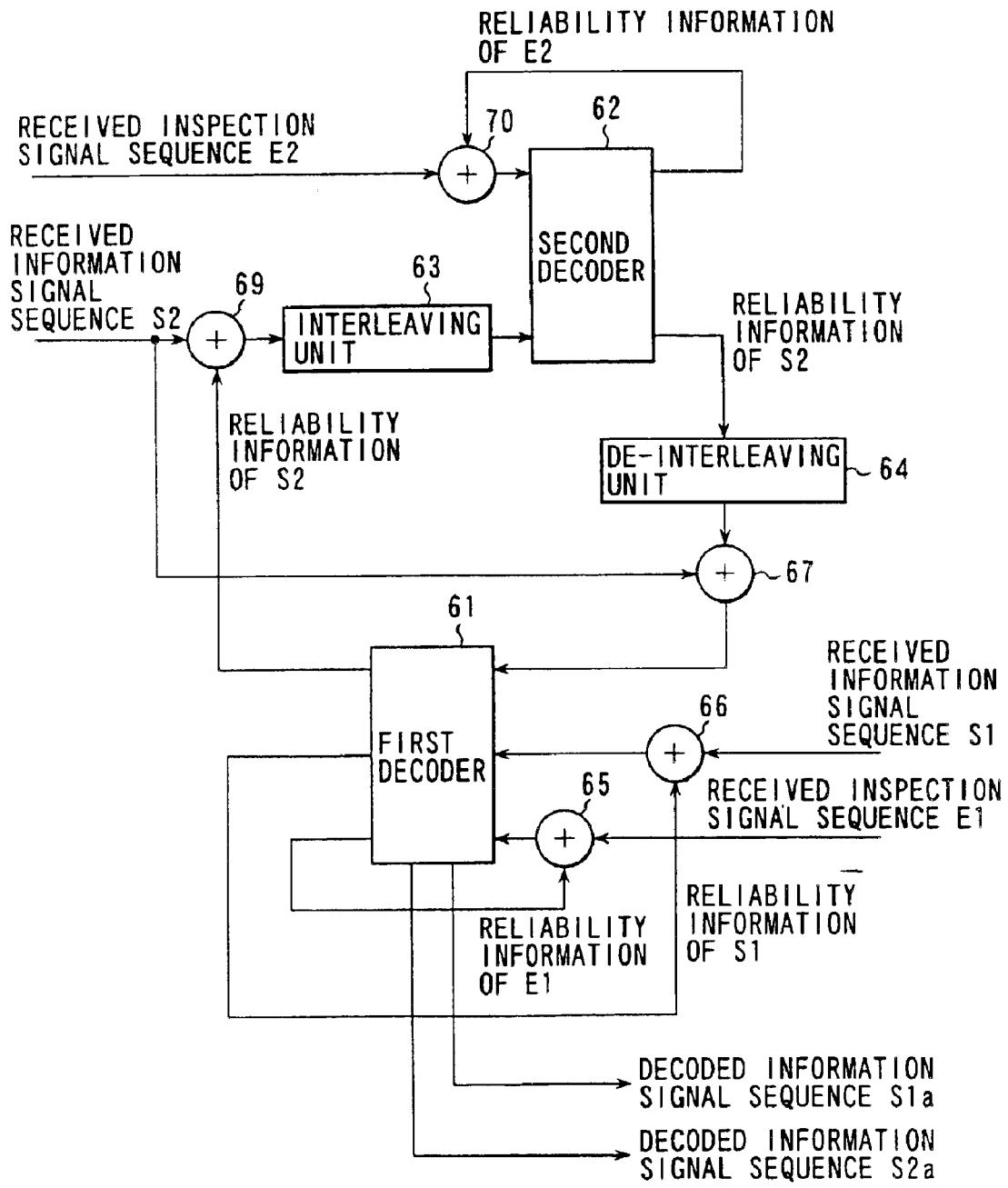
FIG. 42 is a block diagram showing a configuration of an error correction decoder implementing a fifth decoding scheme in the seventh embodiment of the present invention.

As shown in FIG. 42, a received information signal sequence S2 is first subjected to interleaving in an interleaving unit 63, then input to a second decoder 62 together with a received inspection signal sequence E2, and subjected to the most likelihood decoding therein. And reliability information of the received information signal sequence S2 obtained from the second decoder 62 is subjected to de-interleaving in a de-interleaving unit 64, then added in an adder 67 to the received information signal sequence S2, and input to a first decoder 61. At this time, a received information signal sequence S1 and a received inspection signal sequence E1 are input to the first decoder 61, and the most likelihood decoding is conducted.

Furthermore, reliability information of the received information signal sequence S2 obtained from the first decoder 61 is added in an adder 69 to the received information signal sequence S2, subjected to interleaving in the interleaving unit 63, and then input to the second decoder 62. At this time, there is input to the second decoder 62 reliability information of the received inspection signal sequence E2 obtained from the second decoder 62, after being added in an adder 70 to the received inspection signal sequence E2. The most likelihood decoding is thus conducted again.

Between the first decoder 61 and the second decoder 62, the decoding processing utilizing the iteration of the most likelihood decoding is thus conducted on the received information signal sequence S2. The iterative decoding processing heretofore described is repeated by a predetermined number of times. After this repetition has been finished, a decoded information signal sequence S2c resulting from hard decision in the decoder 61 is output together with a decoded information signal sequence S1a.

The decoding processing utilizing the iteration of the most likelihood decoding heretofore described in (4) and (5) can be theoretically explained as follows: if elements of a received signal sequence and previous information of respective elements are input to a most likelihood decoder, elements of the received signal sequence are output together with reliability information of respective elements.

To be concrete, if we let the number of elements of an encoded signal including both an information signal sequence and an inspection signal sequence be N, a transmitted encoded signal sequence is represented as $$x=[x(1), x(2), \ldots, (N)]$$

where x(j) is its jth element. If a received encoded signal sequence is represented as $$R=[r(1), r(2), \ldots, r(N)]$$

and a noise signal sequence added on the transmission channel is represented as $$E=[e(1), e(2), \ldots e(N)]$$

then it follows that $$r(j)=x(j)+e(j), j=1, 2, \ldots, N. \quad \text{(Expression 17)}$$

Here, the following long likelihood ratio (LLR) is calculated every element of each signal sequence.

$$LLR(j) = \log\frac{Pr[x(j) = +1/R]}{Pr[x(j) = -1/R]}, j = 1, 2, \ldots N \quad \text{(Expression 18)}$$

Here, the log likelihood ratio LLR(j) is a logarithm value of a ratio of a probability Pr[x(j)=+1/R] that a transmitted encoded value of a $j_{th}$ element of a received signal sequence R is x(j)=+1 to a probability Pr[x(j)=−1/R] that x(j)=−1. As the probability that x(j)=+1 becomes greater, LLR(j) assumes a positive value having a greater absolute value. As the probability that x(j)=−1 becomes greater, LLR(j) assumes a negative value having a greater absolute value.

The LLR(j) provides reliability information when judging each element r(j) of the received signal sequence R to be +1 or −1. The calculation method of LLR(j) is described, for example, in J. Hagenauer, E. Offer, L. Papke. "Iterative decoding of binary block and convolutional codes", IEEE Trans. IT., vol. 42, no. 2, pp. 429–445, March 1996.

In other words, the log likelihood ratio LLR is calculated in the first decoder 61 for each element of the received information signal sequence. As previous information, the reliability information of each element thus output is added to each element of the received signal sequence input to the second decoder 62. On the other hand, the log likelihood ratio LLR is calculated in the second decoder 62 for each element of the received signal sequence. As previous information, the reliability information of each element thus output is added to each element of the received signal sequence input to the first decoder 61. And by iterating the most likelihood decoding between the first decoder 61 and the second decoder 62, the reliability of the decoded information signal sequence thus output is gradually raised. After the decoding is conducted a predetermined number of times, hard decision of +1 and −1 is conducted and the decision values are adopted as the final decoded information signal sequence.

The number of times of iteration is suitably determined according to the demanded error correction capability and permitted processing amount and delay amount. For example, in the case where the demanded error correction capability is high, the number of times of iteration decoding is set to a greater value to conduct highly reliable decoding. By using the iterative decoding in this case, decoding having a high error correction capability can be implemented with a comparatively small circuit scale. In contrast to this, in the case where the permitted processing delay amount is small, the number of times of iteration is set within the range of the permitted delay amount.

When signal sequences are input to the first and second decoders 61 and 62 in the above described fourth and fifth decoding schemes, it is desirable to normalize each of these signal sequences by the root mean square value of each element r(j) forming a received encoded signal sequence R or the value of an element r(j)max assuming a maximum value. By doing so, it is possible to prevent the Euclidean distance from increasing although the reliability information is raised by the iterative decoding. As a result, the decoding precision can be raised. The normalization of the signal sequences may be effected by using two or more values preset on the basis of the level of the received encoded signal sequence R.

On the transmitting side in the seventh embodiment as heretofore described, information data is divided into an information signal sequence S2 requiring intense error protection and an information signal sequence S1 other than that. The information signal sequences S1 and S2 are subjected in the first encoder 51 to the error correction encoding to generate the inspection signal sequence E1. As for the information signal sequence S2, it is singly subjected in the second encoder 52 to the error correction encoding to generate the inspection signal sequence E2. These inspection signal sequences E1 and E2 are transmitted together with the information signal sequences S1 and S2.

On the other hand, five kinds of decoding scheme are prepared on the receiving side. At each time, an optimum one is selected out of the above described five kinds of decoding scheme according to various conditions concerning the transmission, and the received information signal sequences S1 and S2 are decoded by using the selected one.

As for the conditions forming the basis of the selection, the properties of the transmission information can be first mentioned. To be concrete, the properties are the kind of information data (image data, voice data, or computer data), whether the transmitted information data is required of real time property, required decoding quality, permitted processing delay amount, and so on. These conditions can be recognized in, for example, an interval of negotiation conducted between the transmitting side and the receiving side prior to the transmission of the information data.

As another condition forming the basis of the selection, the state of the transmission channel can be mentioned. This means the quality of the transmission channel. It can be detected by monitoring, on the communication apparatus of the receiving side, the received field strength, frequency of error detection using an error detection code such as a CRC (Cyclic Redundancy Code), frequency of re-transmitting using the repeat function such as ARQ (Automatic Repeat Request), jitter occurrence amount in the synchronizing or demodulation system, the accumulation amount of the information data in the transmitting and receiving buffers, and so on.

As a concrete example of the selection, the following can be mentioned. Under such a condition that the transmission channel quality is comparatively fine as in the case where a wire transmission channel is used, the first decoding scheme is selected for the decoding. On the other hand, under such a condition that the transmission channel quality is poor as in the case where a radio transmission channel is used, one of the second to fifth decoding schemes is selected for the decoding. Even if the same radio channel is used, the fourth or fifth decoding scheme is selected for decoding in the case where the transmission delay is permitted to some degree and high reliability is demanded. On the other hand, in the case where the degree of permission of the transmission delay is low, the second or third decoding scheme is selected for decoding.

In the case where information data requiring the real time property, such as voice data, is to be decoded, the second or third decoding scheme is selected. Or even if the fourth or fifth decoding scheme is selected, the number of times of iteration is set to a small value. On the other hand, in the case where information data which does not require the real time property, but requires high reliability is to be decoded, the fourth or fifth decoding scheme is selected and the number of times of iteration is set to a large value.

Owing to such a configuration, it is possible to keep the transmission efficiency high, and decode and reproduce at least information data requiring intense error protection with high reliability. In addition, it is possible to select an optimum decoding scheme for decoding according to the transmission condition at each time and the property of the transmitted information.

Furthermore, when inputting the first and second information signal sequences S1 and S2 to the first encoder 51 in the seventh embodiment, they are input as they are. On the other hand, when inputting the second information signal sequence S2 to the second encoder 52, interleaving is conducted. In the case where it is desired to simply decode the first and second information signal sequences on the receiving side by using only the first decoder 61, such a configuration makes it possible to conduct decoding without effecting the interleaving and de-interleaving.

(Eighth Embodiment)

An eighth embodiment of the present invention has been obtained by further improving the seventh embodiment. When inputting the second information signal sequence S2 to the second encoder in the error correction encoding apparatus of the transmitting side, the second information signal sequence S2 is input as it is. On the other hand, when inputting the first and second information signal sequences S1 and S2 to the first encoder in the error correction encoding apparatus of the transmitting side, interleaving is conducted on the second information signal sequence S2.

Figure 43:
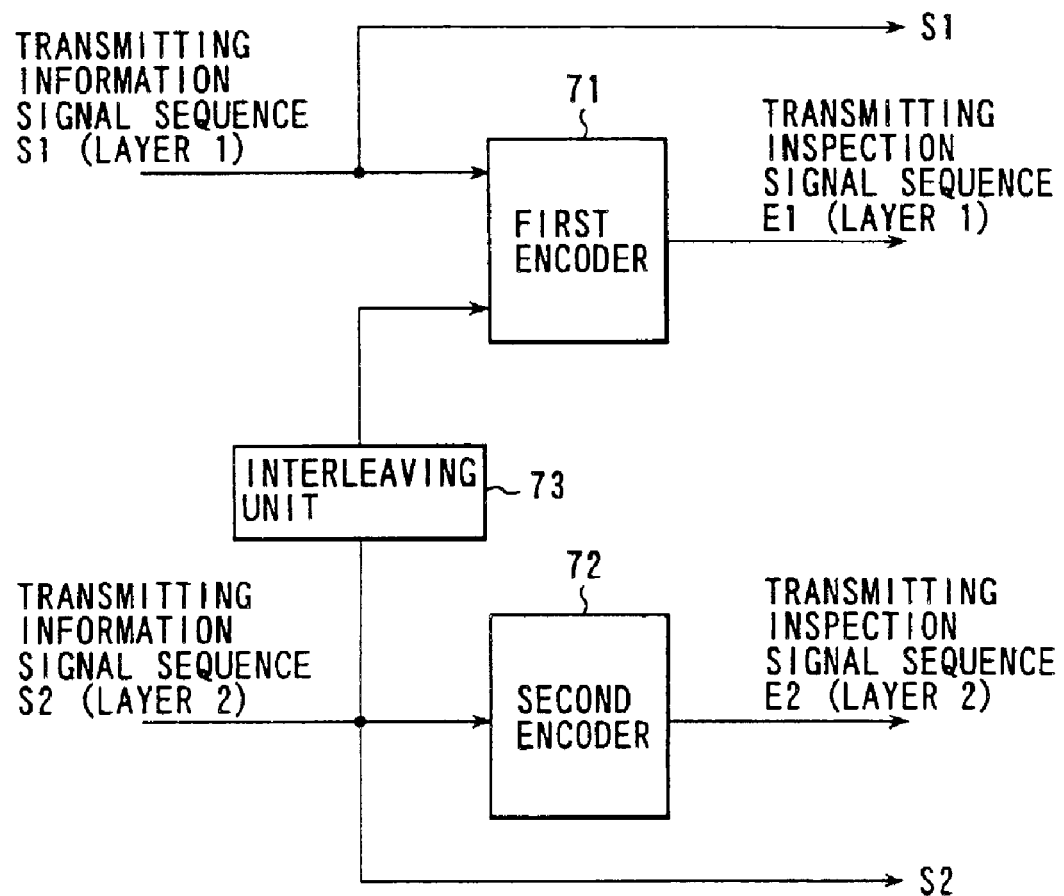
FIG. 43 is a block diagram showing a configuration of an error correction encoder according to an eighth embodiment of the present invention.

FIG. 43 is a block diagram showing the configuration of an error correction encoding apparatus according to the eighth embodiment.

A first information signal sequence S1 classified as a layer 1 by a classifying unit which is not illustrated is input to a first encoder 71 as it is. A second information signal sequence S2 classified as a layer 2 is changed in information element order by an interleaving unit 53, and then input to the first encoder 71. In the first encoder 71, the first and second information signal sequences S1 and S2 are collectively subjected to error correction encoding by using, for example, a convolutional code. As a result, a first inspection signal sequence E1 is generated.

On the other hand, the second information signal sequence S2 is input singly to a second encoder 72 as well, and subjected to error correction encoding therein by using, for example, a convolutional code. As a result, a second inspection signal sequence E2 is generated.

And the first information signal sequence S1, the second information signal sequence S2, the first inspection signal sequence E1, and the second inspection signal sequence E2 are multiplexed, for example, as shown in FIG. 37, and transmitted to a transmission channel.

On the other hand, an error correction decoding apparatus of the receiving side has a configuration hereafter described. FIGS. 44 to 48 are circuit block diagrams showing its configuration.

In other words, in the eighth embodiment as well, five decoding schemes are conceivable in the same way as the seventh embodiment.

(1) First Decoding Scheme

Figure 44:
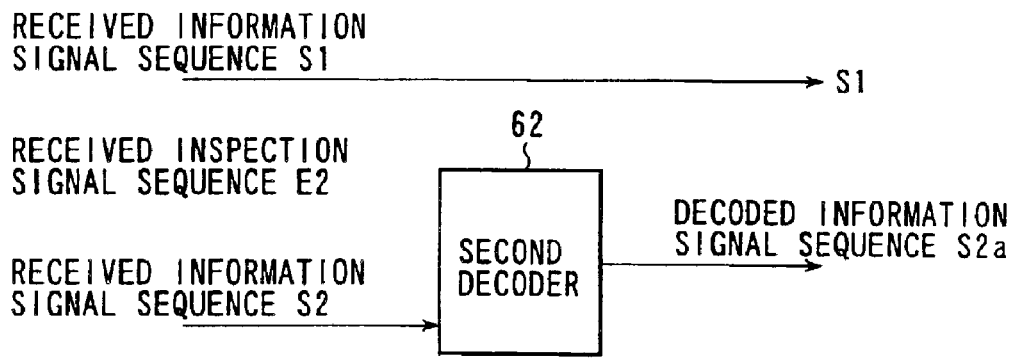
FIG. 44 is a block diagram showing a configuration of an error correction decoder implementing a first decoding scheme in the eighth embodiment of the present invention.

A first decoding scheme is shown in FIG. 44. A received information signal sequence S2 is input to a second decoder 82 together with an inspection signal sequence E2, and subjected to error correction decoding therein. As a result, a second decoded information signal sequence S2a is obtained. As for a received information signal sequence S1, it is output as it is, without being subjected to error correction decoding.

As for the decoding scheme of the second decoder 81, a decision is made as to whether a received information signal sequence of real value elements containing noise is +1 or −1 depending upon whether it is greater than 0. Thus, so-called hard decision is used. If this hard decision is used, simple decoding is possible. In the case where decoding of further higher precision is necessary, it is preferable to use most likelihood decoding based upon soft decision in which decoding is conducted without making a decision on the received information signal sequence of real value elements containing noise.

The first decoding scheme is used in the case where the transmission channel quality is comparatively favorable and the second information signal sequence S2 can be decoded correctly by error correction decoding in the second decoder 82.

(2) Second Decoding Scheme

Figure 45:
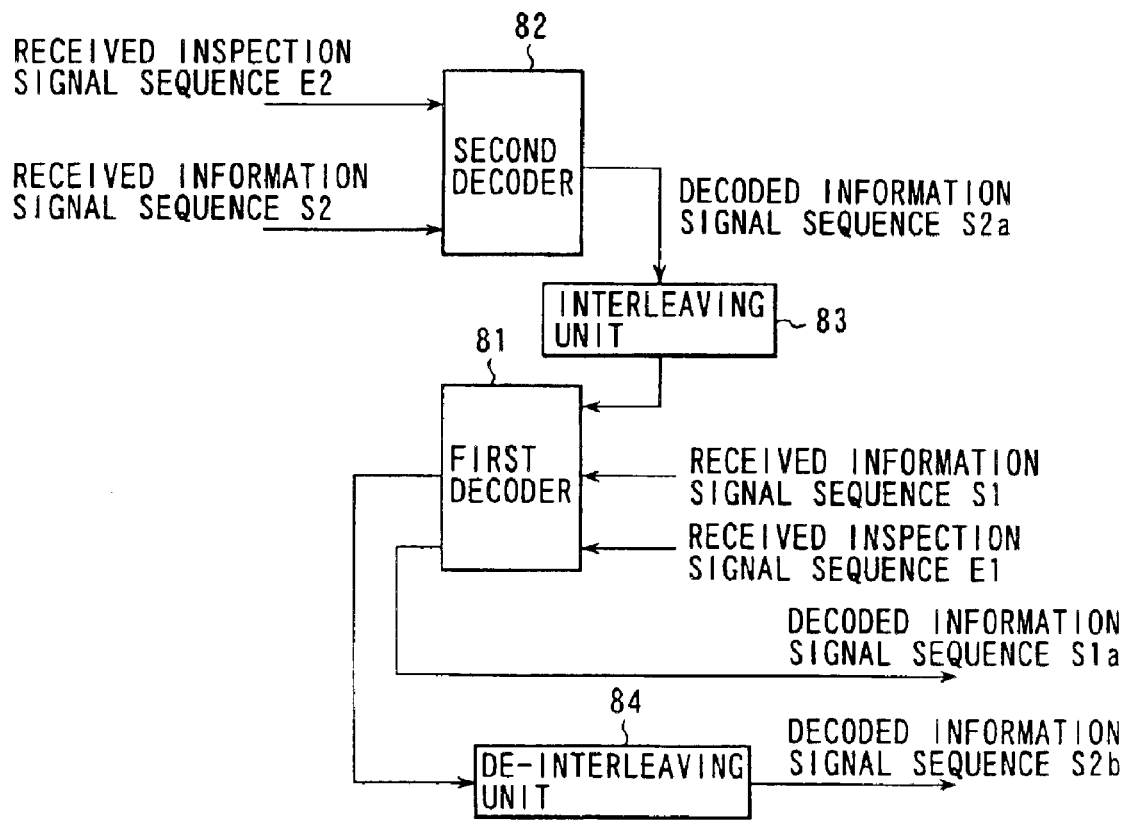
FIG. 45 is a block diagram showing a configuration of an error correction decoder implementing a second decoding scheme in the eighth embodiment of the present invention.

In a second decoding scheme, a received information signal sequence S2 is input to a second decoder 82 together with a received inspection signal sequence E2 as shown in FIG. 45. It is subjected to error correction decoding therein. As a result, a decoded information signal sequence S2a is obtained. The decoded information signal sequence S2a is changed in information element order by an interleaving unit 83, then input to a first decoder 81 together with a received information signal sequence S1 and a received inspection code E1, and subjected to error correction encoding therein. A decoded information signal sequence S1a output from the first decoder 81 is output as it is. The decoded information signal sequence S2a is subjected to de-interleaving in a de-interleaving unit 84. A resultant information signal sequence is output as a decoded information signal sequence S2b.

As for the decoding schemes of the first and second decoders 81 and 82, it is conceivable to use the hard decision for both decoders or use the most likelihood decoding method based upon the soft decision for both decoders. Besides, there is also conceivable such a scheme that the most likelihood decoding based upon the soft decision is conducted in the second decoder 82, and thereafter the hard decision is conducted in the first decoder 81.

In the second decoding scheme, double error correction decoding is conducted on the information signal sequence S2 of the layer 2 in the first and second decoders 81 and 82. Even if the transmission channel quality is poor as in the case where, for example, a radio transmission channel is used as the transmission channel, therefore, at least the second information signal sequence S2 can be decoded correctly. For example, in the case where image data are divided to a layer 1 and a layer 2 for transmission, at least various kinds of information which is important in constructing images can be decoded and reproduced correctly. Therefore, sufficiently decipherable images can be reconstructed.

(3) Third Decoding Scheme

Figure 46:
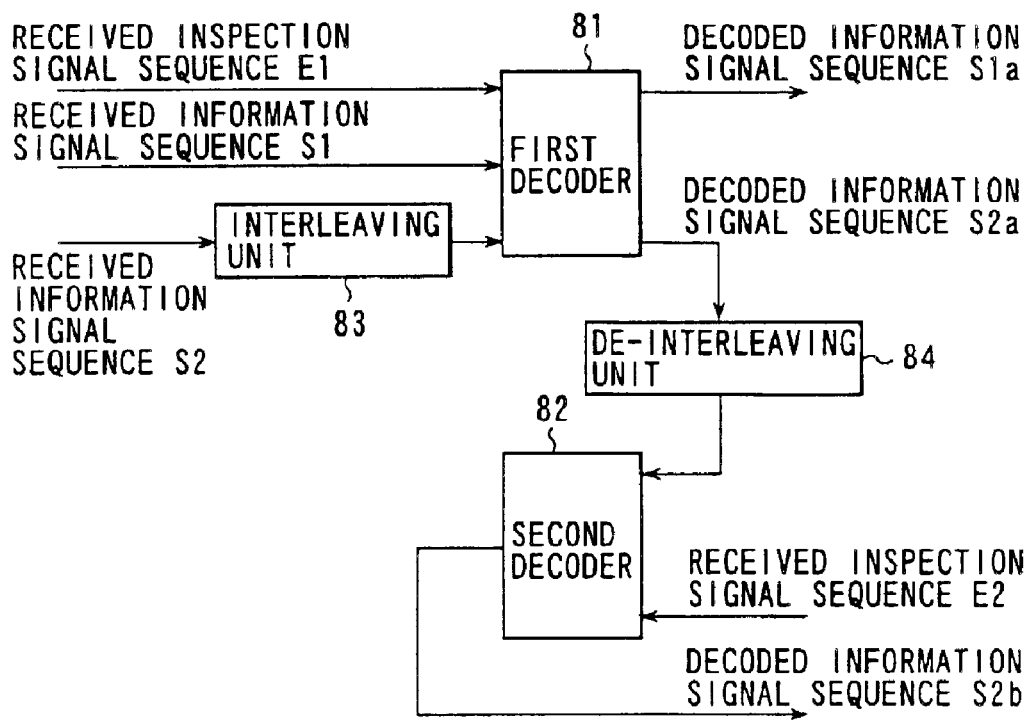
FIG. 46 is a block diagram showing a configuration of an error correction decoder implementing a third decoding scheme in the eighth embodiment of the present invention.

A third decoding scheme is shown in FIG. 46. First of all, a received information signal sequence S2 is subjected to interleaving in an interleaving unit 83, then input to a first decoder 81 together with a received information signal sequence S1 and a received inspection signal sequence E1, and subjected to error correction decoding therein. A decoded information signal sequence S2a obtained from the first decoder 81 is subjected to de-interleaving in a de-interleaving unit 84, then input to a second decoder 82 together with a received inspection signal sequence E2, and subjected to error correction decoding therein. As a result, a decoded information signal sequence S2b is obtained.

As for the decoding schemes of the first and second decoders 81 and 82, it is conceivable in the same way as the case of the second decoding scheme to use the hard decision for both decoders or use the most likelihood decoding method based upon the soft decision for both decoders. Besides, there is also conceivable such a scheme that the most likelihood decoding based upon the soft decision is conducted in the first decoder 81, and thereafter the hard decision is conducted in the second decoder 82.

(4) Fourth Decoding Scheme

In a fourth decoding scheme, decoding of an information signal sequence S2 requiring intense error protection is conducted by repeating the most likelihood decoding between a second decoder 82 and a first decoder 81. This aims at obtaining a highly reliable decoded information signal sequence.

Figure 47:
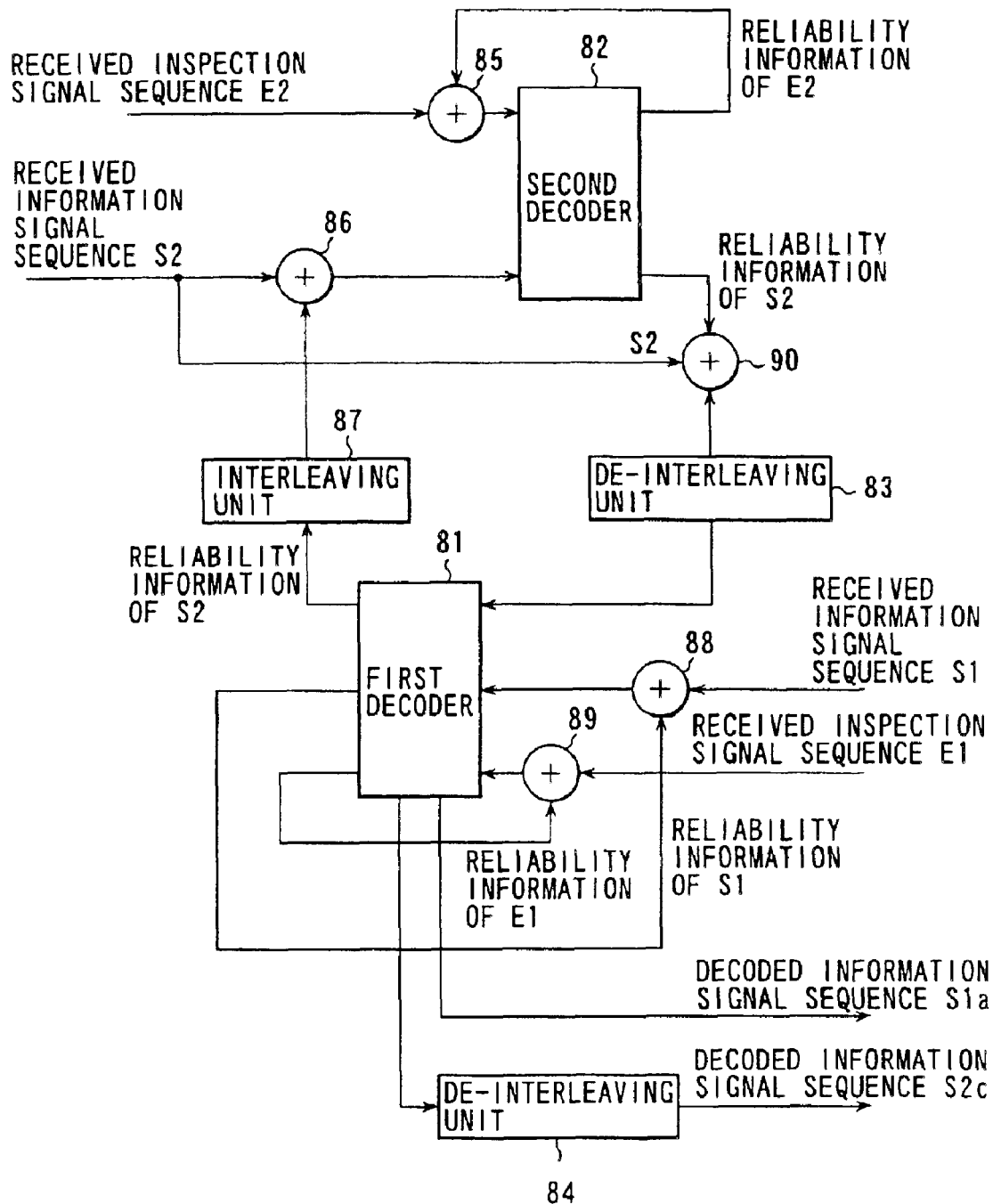
FIG. 47 is a block diagram showing a configuration of an error correction decoder implementing a fourth decoding scheme in the eighth embodiment of the present invention.

As shown in FIG. 47, a received information signal sequence S2 is first input to a second decoder 82 together with a received inspection signal sequence E2, and subjected to the most likelihood decoding therein. Reliability information of the received information signal sequence S2 obtained by the second decoder 82 is added in an adder 90 to the received information signal sequence S2, subjected to interleaving in an interleaving unit 83, then input to a first decoder 81. At this time, a received information signal sequence S1 and a received inspection signal sequence E1 are input to the first decoder 81. The most likelihood decoding is thus conducted.

Furthermore, reliability information of the received information signal sequence S2 obtained from the first decoder 81 is subjected to de-interleaving in a de-interleaving unit 87, then added in an adder 86 to the received information signal sequence S2, and input to the second decoder 82. Furthermore, at this time, there is input to the second decoder 82 reliability information of the received inspection signal sequence E2 obtained from the second decoder 82, after being added in an adder 85 to the received inspection signal sequence E2. The most likelihood decoding is thus conducted therein again.

Between the second decoder 82 and the first decoder 81, the decoding processing using the iteration of the most likelihood decoding is thus conducted on the received information signal sequence S2. The iterative decoding processing heretofore described is repeated by a predetermined number of times. After this iteration has been finished, a decoded information signal sequence S2c subjected to hard decision in the first decoder 61 is subjected to de-interleaving in a de-interleaving unit 84, and output. And a decoded information signal sequence S1a is output as it is.

During the iterative decoding processing heretofore described, the received information signal sequences S1 and S2 and the received inspection signal sequences E1 and E2 are stored in a memory which is not illustrated. Every iteration, they are read out from the memory and input to the first and second decoders 81 and 82. Before the iterative decoding processing is started, each reliability information is initialized to "0".

(5) Fifth Decoding Scheme

A fifth decoding scheme is another scheme using iteration of the most likelihood decoding.

Figure 48:
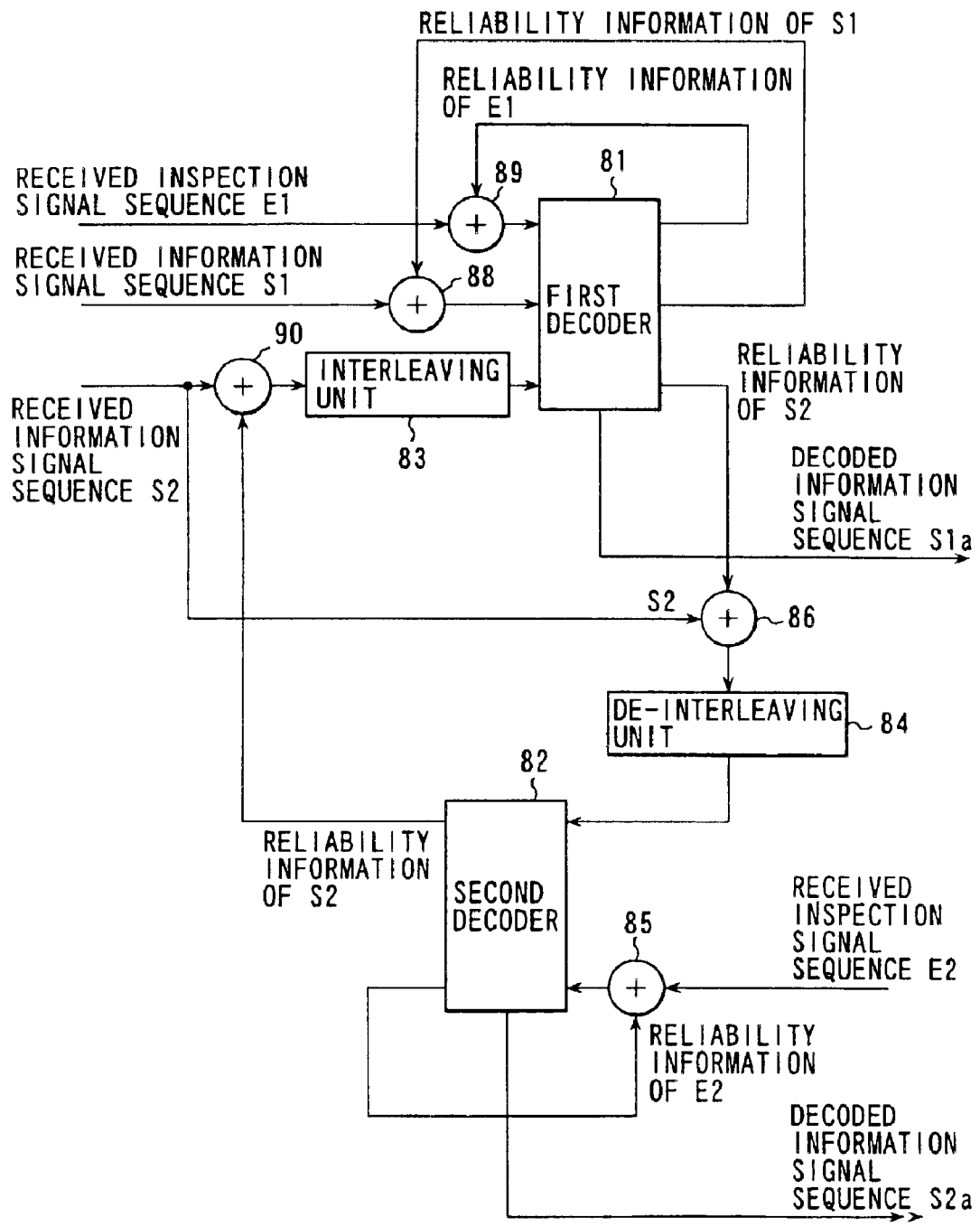
FIG. 48 is a block diagram showing a configuration of an error correction decoder implementing a fifth decoding scheme in the eighth embodiment of the present invention.

As shown in FIG. 48, a received information signal sequence S1 and a received information signal sequence S2 are first input to a first decoder 61 together with a received inspection signal sequence E1, and subjected to error correction decoding therein by using the most likelihood decoding method. At this time, the received information signal sequence S2 is subjected to interleaving in an interleaving unit 83 before being input to the first decoder 61.

Reliability information of the received information signal sequence S2 obtained from the first decoder 81 is subjected to de-interleaving in a de-interleaving unit 84, added in an adder 86 to the received information signal sequence S2, then input to a second decoder 82 together with a received inspection signal sequence E2, and subjected therein to error correction decoding using the most likelihood decoding method. At this time, a decoded information signal sequence S1a obtained from the first decoder 81 is output as it is as a result of decoding.

On the other hand, reliability information of the received information signal sequence S2 obtained from the second decoder 82 is added in an adder 90 to the received information signal sequence S2, then subjected to interleaving in the interleaving unit 83, and input to the first decoder 81. At this time, there are input to the first decoder 81 reliability information of the received information signal sequence S1 and reliability information of the received inspection signal sequence E1 after being added in adders 88 and 89 to the received information signal sequence S1 and the received inspection signal sequence E1. The most likelihood decoding is thus conducted again.

Reliability information of the received information signal sequence S2 obtained as a result of decoding of the second time from the first decoder 81 is subjected to de-interleaving in the de-interleaving unit 84, then added in the adder 86 to the received information signal sequence S2, and input to the second decoder 82. Furthermore, at this time, there is input to the second decoder 82 reliability information of the received inspection signal sequence E2 obtained by the decoding of the first time, after being added in an adder 85 to the received inspection signal sequence E2. The most likelihood decoding is thus conducted therein again.

Between the second decoder 82 and the first decoder 81, the decoding processing using the iteration of the most likelihood decoding is thus conducted on the received information signal sequence S2. The iterative decoding processing heretofore described is repeated by a predetermined number of times. After this repetition has been finished, a decoded information signal sequence S2c obtained from the second decoder 82 is output as it is as a decoded signal.

The number of times of iteration is suitably determined according to the demanded error correction capability and permitted processing amount and delay amount. When signal sequences are input to the first and second decoders 81 and 82 in the above described fourth and fifth decoding schemes, it is desirable to normalize each of these signal sequences by the root mean square value of each element $r(j)$ forming a received encoded signal sequence R or the value of an element $r(j)max$ assuming a maximum value. By doing so, it is possible to prevent the Euclidean distance from increasing although the reliability information is raised by the iterative decoding. As a result, the decoding precision can be raised. The normalization of the above described respective signal sequences may be effected by using two or more values preset on the basis of the level of the received encoded signal sequence R.

Furthermore, as for a selection scheme of the first to fifth decoding schemes as well, an optimum decoding scheme is selected according to the transmission condition at each time and the property of the transmitted information as described before with reference to the seventh embodiment.

In the same way as the seventh embodiment, it is possible, in the eighth embodiment as heretofore described as well, to keep the transmission efficiency high, and decode and reproduce at least information data requiring intense error protection with high reliability. In addition, it is possible to select an optimum decoding scheme for decoding according to the transmission condition at each time.

Furthermore, when inputting the second information signal sequence S2 to the second encoder in the eighth embodiment, it is input as it is. On the other hand, when inputting the first and second information signal sequences S1 and S2 to the first encoder, interleaving is conducted on the second information signal sequence S2. In the case where it is desired to simply decode only the second information signal sequence S2 on the receiving side by using only the second decoder 82, such a configuration makes it possible to conduct decoding without effecting the interleaving and de-interleaving.

In the seventh embodiment and the eighth embodiment, one decoding scheme is selected out of the first to fifth decoding schemes. Alternatively, such a configuration that one decoding scheme is selected out of the first decoding scheme and the second or third decoding scheme may be adopted. Or such a configuration that one decoding scheme is selected out of the second or third decoding scheme and the fourth or fifth decoding scheme may be adopted.

Figure 49:
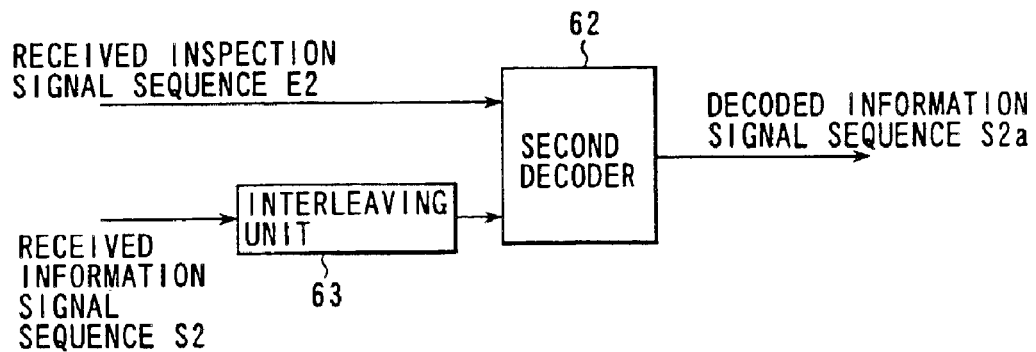
FIG. 49 is a block diagram showing a variant of the error correction decoder illustrated in FIG. 36.

Furthermore, in the case where only the received information signal sequence S2 is to be simply decoded in the seventh embodiment, such a decoding scheme as to conduct interleaving on the received information signal sequence S2 in an interleaving unit 63 and then input it to a second decoder 62 together with a received inspection signal E2 as shown in FIG. 49 may be adopted.

Figure 50:
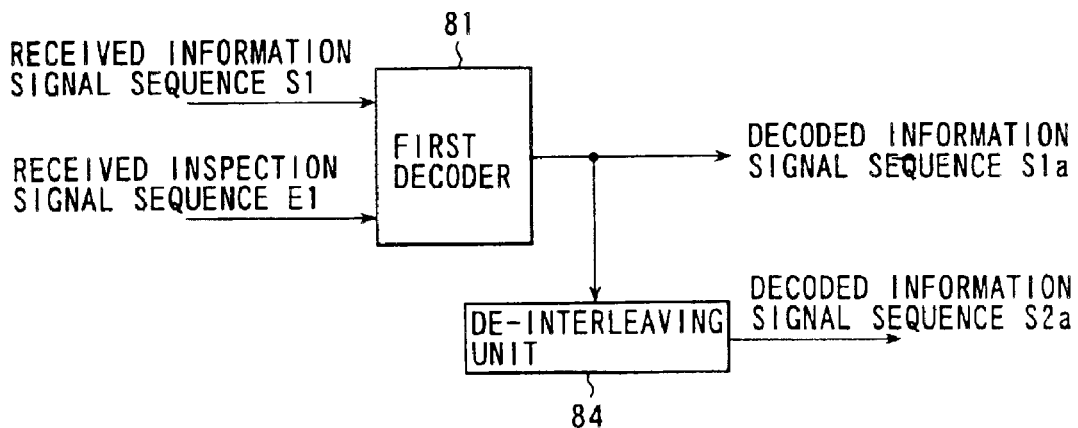
FIG. 50 is a block diagram showing a variant of the error correction decoder illustrated in FIG. 44.

In the same way, in the case where both the received information signal sequence S1 and the received information signal sequence S2 are to be simply decoded in the eighth embodiment, a decoding scheme as shown in FIG. 50 may be adopted. In this decoding scheme, the received information signal sequence S1 is input to a first decoder 81 together with a received inspection signal E1, and subjected to error correction decoding. An information signal sequence output from the first decoder 81 is subjected to de-interleaving in a de-interleaving unit 84. As a result, a decoded information signal sequence S2a is output.

Furthermore, in either of the seventh and eighth embodiments, a block encoder or a convolutional encoder can be used as each of the encoders 51, 52, 71 and 72 used in the error correction encoding apparatus of the transmitting side. In short, any encoder may be used so long as such a scheme that an inspection signal is added to an information signal in accordance with a predetermined encoding rule is adopted in the encoder.

As for a block code in general, an inspection signal sequence having (N−K) elements is added to an information signal sequence having K elements to form an encoded block having N elements. The block code is represented as (N, K) code, and an encoding rate is defined as K/N. In a convolutional code as well, so long as it is a systematic code, K information elements are input, and thereafter M additional information pieces for making contents of registers forming an encoder equal to 0 are inserted. Letting its encoding rate be 1/R, N=R(K+M). The convolutional code is represented as a (M, K) code.

(Ninth Embodiment)

Whereas the seventh and eighth embodiments has described error correction encoding and decoding schemes for information signal sequences, a ninth embodiment of the present invention describes an error correction encoding and decoding scheme for information signal blocks.

Figure 51:
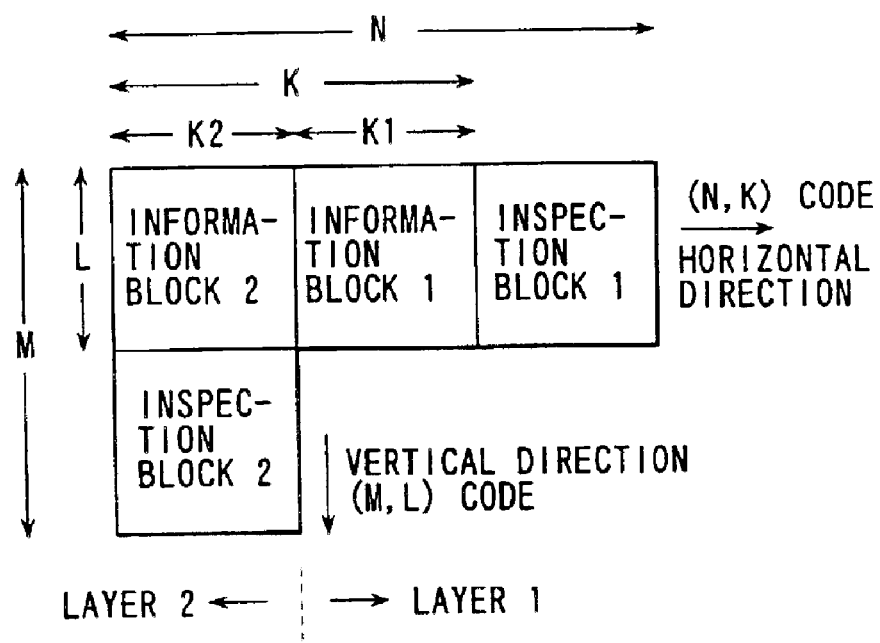
FIG. 51 is a diagram for description of an error correction scheme according to a ninth embodiment of the present invention.

Hereafter, the ninth embodiment will be described on the basis of FIG. 51.

It is now assumed that information blocks having 11 (=K) elements are set. Among them, 6 (=K1) elements form an information block 1 of layer 1, and 5 (=K2) remaining elements form an information block of layer 2. Four (=L) information blocks each formed of 11 elements are prepared, and a two-dimensional information blocks having 4×11=44 elements are thus set.

First of all, the two-dimensional information blocks are read out in the horizontal direction. In accordance with the error correction encoding rule of the BCH (15, 11), an inspection signal block 1 formed of 4 (=N−K) elements is added to each information block. Subsequently, a part including the information block 2 is read out in the vertical direction. In accordance with an error correction encoding rule of expanded Hamming (8, 4), an inspection block 2 formed of 4 (=M−L) elements is added to each information block.

In other words, elements of the information blocks 2 of the layer 2 are subjected to double error correction encoding of the horizontal and vertical directions. Here, reading the information blocks in different directions, i.e., in the horizontal direction and vertical direction, is fundamental interleave operation. This brings about an effect of spreading and randomizing burst errors caused on the transmission channel. Furthermore, error correction encoding of each of BCH (15, 11) and expanded Hamming (8, 4) has a 1-bit error correction capability.

An encoded two-dimensional block obtained by the error correction encoding processing is formed of an information block 1, an information 2, an inspection block 1, and an inspection block 2. This is transmitted onto a transmission channel as a transmitting encoded block.

On the receiving side, the block containing noise on the transmission channel is received as a block and decoded. As for the decoding scheme, there are five decoding schemes hereafter described.

(1) First Decoding Scheme

In a first decoding scheme, the received two-dimensional information block is subjected to binary decision and read out in the horizontal direction, and each information block is subjected to error correction decoding. By doing so, 1-bit error correction is effected for each of 11 blocks including both the information block 1 and the information block 2.

(2) Second Decoding Scheme

If the error correction is not perfectly conducted in the first decoding scheme, then in a second decoding scheme a part of the received two-dimensional information block including the information block 2 is subsequently read out in the vertical direction, and elements of the information block thus read out are subjected to error correction decoding of the expanded Hamming (8, 4). By doing so, 1-bit error correction is further conducted on the elements of the information block 2.

In the first and second decoding schemes heretofore described, an algebraic decoding method of hard decision is adopted.

(3) Third Decoding Scheme

In a third decoding scheme, the received two-dimensional information block is read out in the horizontal direction leaving the original analog value intact without conducting the binary decision. Each information block is subjected to the most likelihood decoding based upon the Euclidean distance without being subjected to a decision.

(4) Fourth Decoding Scheme

If the error correction is not perfectly conducted in the third decoding scheme, then in a fourth decoding scheme a part of the received two-dimensional information block including the information block 2 is subsequently read out in the vertical direction, and each information block is subjected to the most likelihood decoding based upon the Euclidean distance without being subjected to a decision.

The third and fourth decoding schemes heretofore described are based upon the most likelihood decoding method of soft decision.

(5) Fifth Decoding Scheme

In the fifth decoding scheme, an iteration method of the most likelihood decoding is adopted. In other words, the received two-dimensional information block is read out in the horizontal direction, and each block is subjected to the most likelihood decoding based upon the Euclidean distance. At this time, the magnitude of the decoded value becomes reliability information. In succession, a part of the received two-dimensional block including the information block 2 is read out in the vertical direction. To this, the reliability information obtained by the decoding in the horizontal direction is added. Each of resultant information blocks is subjected to the most likelihood decoding based upon the Euclidean distance. At this time as well, the magnitude of the decoded value becomes reliability information.

In other words, reliability information obtained by the most likelihood decoding of the horizontal direction is used as previous information when conducting the most likelihood decoding in the vertical direction, and reliability information obtained by the most likelihood decoding of the vertical direction is used as previous information when conducting the most likelihood decoding in the horizontal direction. Decoding is thus iterated.

Approximate calculation of the log likelihood ratio LLR will now be described. This calculation is base on R. Pyndiah, A. Glavieux, A. Picart, S. Jacq., "Near optimum decoding of product codes", IEEE GLOBECOM '94, pp. 339–343, 1994.

A transmitting encoded block formed of an information block having K elements and an inspection signal sequence having N–K elements is now represented by X=[x(1), x(2), ... x(N)] having N elements. Each element x(j) assumes a binary value +1 or –1. An encoded block received via a transmission channel is represented as R=[r(1), r(2), ... r(N)]. Each element assumes an analog value because it contains transmission channel noise.

If it is supposed that the transmission channel noise is white Gaussian random noise, then the LLR(j) is approximated as described below.

A distance δ j+1 between [r(1), r(2), ... r(N)] and the transmitted encoded block of 2K–1 ways which have an element x(j) equivalent to +1 is calculated by using the following expression.

$$\delta_j^{+1} = (r(1)-x(1))^2 + \ldots + (r(N)-x(N))^2, j=1, \ldots, N \quad \text{(Expression 19)}$$

Among 2K–1 distance values thus obtained, a minimum one is defined as $\delta_{min\ j}+1$. In addition, the transmitted encoded block at that time is defined as [xj+1(1), xj+1(2), ... , xj+1(N)].

In the same way, a distance δ j–1 between r(1), r(2), ... r(N)] and the transmitted encoded block of 2K–1 ways which are included in the transmitted encoded signals of patterns of 2K–1 ways and which have an element x(j) equivalent to –1 is calculated by using the following expression.

$$\delta_j^{-1} = (r(1)-x(1))^2 + \ldots + (r(N)-x(N))^2, j=1, \ldots, N \quad \text{(Expression 20)}$$

Among 2K–1 distance values thus obtained, a minimum one is defined as $\delta_{min\ j}-1$. In addition, the transmitted encoded block at that time is defined as [xj–1(1), xj–1(2), ... , xj–1(N)].

When the element r(j) is judged to be d(j)=1, it can be said that the reliability is high in the case where $\delta_{min\ j}-1$ is as great as possible and $\delta_{min\ j}+1$ is as small as possible.

On the contrary, when the element r(j) is judged to be d(j)=–1, the reliability is high in the case where $\delta_{min\ j}+1$ is as great as possible and $\delta_{min\ j}-1$ is as small as possible.

Here, LLR is approximated as u(j) in the following expression.

$$u(j) = \delta\ \min_j^{-1} - \delta\ \min_j^{+1}, j=1, \ldots, N \quad \text{(Expression 21)}$$

When the element r(j) is judged to be d(j)=+1, u(j) thus defined has a greater positive value as its reliability becomes higher. On the contrary, when the element r(j) is judged to be d(j)=–1, u(j) assumes a negative value having a greater absolute value as its reliability becomes higher. Therefore, u(j) represents a result of decision effected with due regard to the reliability. Letting $$g_i(1) = \begin{cases} 0 : x_j^{+1}(1) = x_j^{-1}(1) \\ 1 : x_j^{+1}(1) \neq x_j^{-1}(1), \end{cases} \quad \text{(Expression 22)}$$

u(j) can be rewritten as $$u(j) = 4(r(j) + w(j)), j = 1, \ldots, N \quad \text{(Expression 23)}$$

$$w(j) = \sum_{l=1, l \neq j}^{N} r(1) x_j^{+1}(1) g_j(1), j = 1, \ldots, N.$$

In this expression, w(j) is a parameter dominating the reliability.

On the basis of the foregoing description, a transmitted encoded signal x(I,j), a received encoded signal r(i,j), a reliability signal w(i,j), an input signal v(i,j), and an output signal s(i,j) are defined for each element of the received two-dimensional block. And initial values are determined as follows.

$$v(i, j) = 0.0 \quad \text{(Expression 24)}$$

$$w(i, j) = 0.0$$

$$s(i, j) = r(i, j)$$

Let first at step 1 (horizontal direction)

$$v(i,j) = r(i,j) + \alpha w(i,j), j=1, \ldots, 15, \quad \text{(Expression 25)}$$

where α is a coefficient having a real number value. For the first to fourth blocks in the horizontal direction (i=1, ... , 4), an approximate value of the LLR(j), j=1, ... , 15 is calculated, and the reliability parameter w(i,j) is derived for every element. And the output signal s(i,j) is corrected as $$s(i,j) \leftarrow s(i,j) + \beta w(i,j), j=1, \ldots, 15, \quad \text{(Expression 26)}$$

where β is a coefficient having a real number value.

Subsequently, let at step 2 (vertical direction)

$$v(i,j) = r(i,j) + \alpha w(i,j), i=1, \ldots, 8. \quad \text{(Expression 27)}$$

For the first to fourth blocks in the vertical direction (j=1, ... , 11), an approximate value of the LLR(i), i=1, ... , 8 is calculated, and the reliability parameter w(i,j) is derived for every element. And the output signal s(i,j) is corrected as $$s(i,j) \leftarrow s(i,j) + \beta w(i,j), \; i=1, \ldots, 8. \quad \text{(Expression 28)}$$

Figure 52:
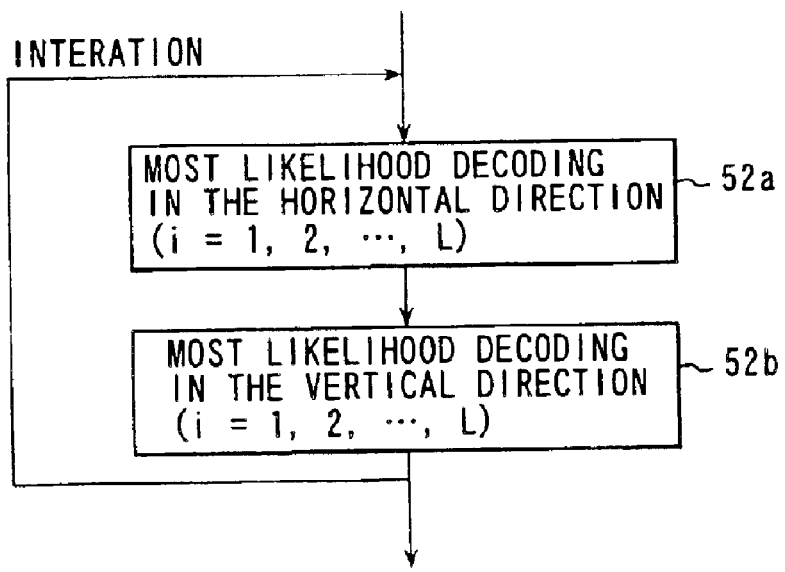
FIG. 52 is a flow chart to be used for description of repetitive decoding operation in the ninth embodiment of the present invention.

By repeating the most likelihood decoding in the horizontal direction (step 1) and the most likelihood decoding in the vertical direction (step 2) as shown in FIG. 52, the reliability parameter w(i,j) of each element included in the received information block 2 is corrected in both the step 1 and step 2. On the other hand, the reliability parameter w(i,j) of each element included in the information block 1 is corrected in only step 2. As the number of times of iteration is increased, the reliability of the information block 2 is raised.

By the magnitude of the coefficients α and β, intensity of the correction in the repetitive processing is determined. The coefficients α and β may be constant, or may be altered every step or in the middle of the repetition. For example, in initial stages of the repetition, the coefficients α and β are made to have values close to 0 because the precision of the estimated reliability is not necessarily high. As the repetition proceeds, the coefficients α and β are gradually made closer to 1.

To be concrete, the coefficients α and β are altered according to the calculated value of the LLR. In other words, the fact that the absolute value of each LLR is small means that the reliability of each LLR is low. When the absolute value of the LLR is small, therefore, the coefficients 60 and β are set to small values.

Furthermore, the coefficients α and β may be altered according to (+, −) of each LLR. In other words, when the sign of each LLR frequently changes between the plus sign and the minus sign in the iteration process, it is meant that the reliability of each LLR is low. At this time, therefore, the coefficients α and β are set at small values.

When providing each of elements of the information block to each of the most likelihood decoding of the step 1 and the step 2, it is desirable to normalize each of these blocks by the root mean square value of each element r(j) forming a received encoded signal sequence R or the value of an element r(j)max assuming a maximum value. By doing so, it is possible to prevent the Euclidean distance from increasing although the reliability information is raised by the iterative decoding. As a result, the decoding precision can be raised. The normalization of the above described respective signal sequences may be effected by using two or more values preset on the basis of the level of the received encoded signal sequence R.

In the ninth embodiment as heretofore described, error correction is conducted for the whole of a first information block in its horizontal direction, and in addition, error correction is conducted for a second information block which is included in the first information block and which is especially important in its vertical direction. As compared with the case where error correction of the horizontal direction and the vertical direction is conducted for the whole of the information block as shown in FIG. 31, therefore, efficient error correction decoding processing can be conducted only by adding a small number of inspection blocks. In other words, the transmission efficiency can be raised as compared with the method shown in FIG. 31.

(Other Embodiments)

In the embodiments heretofore described, an information signal sequence or an information block is divided into an important one and an unimportant one. For information having low importance, error correction encoding is not conducted, or error correction encoding using a first error correction scheme is conducted prior to transmission. On the other hand, for highly important information, error correction encoding is conducted prior to transmission by using a second error correction scheme having a higher correction capability than the first error correction scheme.

The present invention is not limited to this. If an information signal sequence or an information block is formed of first information transmitted under such a condition as not hardly cause transmission errors and second information transmitted under such a condition as to cause transmission errors more readily than the first information, then it is also possible that error correction encoding is not conducted, or error correction encoding using a first error correction scheme is conducted prior to transmission for the first information, whereas error correction encoding is conducted for the second information prior to transmission by using a second error correction scheme having a higher correction capability than the first error correction scheme.

For example, in the case where information is transmitted by using a multi-value modulation scheme, first information is disposed on signal points having a long distance between signal points whereas second information is disposed on signal points having a short signal distance between signal points in a certain system. In such a system, transmission errors occur more readily in the second information than in the first information. Therefore, an error correction scheme having a high correction capability is applied to the second information.

Figure 53A:
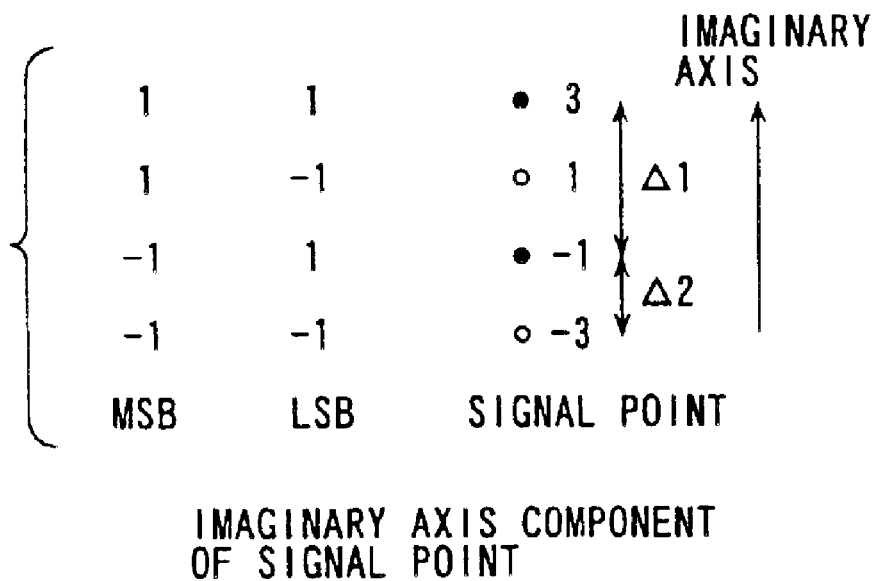
FIGS. 53A and 53B are diagrams for description of another embodiment of the present invention.
Figure 53B:
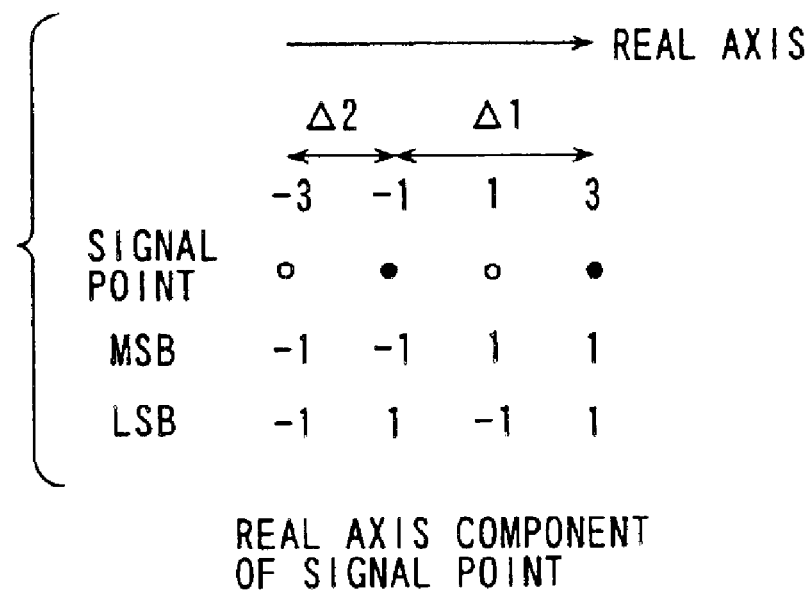

FIG. 53 shows an example thereof. In 16 QAM (Quadrature Amplitude Modulation) scheme, a distance Δ1 between signal points of the MSB (Most Significant Bit) is longer than a distance Δ2 between signal points of the LSB (Least Significant Bit). Therefore, errors cause in the LSB more readily than the MSB.

In the present invention, therefore, error correction encoding is not conducted, or error correction encoding using a first error correction scheme is conducted prior to transmission for the MSB bit, whereas error correction encoding is conducted for the second information prior to transmission by using a second error correction scheme having a higher correction capability than the first error correction scheme.

Despite the fact that a plurality of kinds of information differing in readiness of error occurrence are transmitted mixedly, these kinds of information can be transmitted so as to make the transmission errors uniform, by doing so.

Furthermore, the present invention can be applied to such a system that first information and second information are modulated by different modulation schemes prior to transmission, such as a system in which first information is modulated by the QPSK scheme which is comparatively strong against transmission errors whereas second information is modulated by the 16 QAM or 64 QAM scheme which causes transmission errors more readily than the QPSK scheme.

What is claimed is:

1. An information data multiplex transmission system for inserting a plurality of kinds of information data into one packet and conducting multiplex transmission, characterized in that a transmitting side generates a plurality of header information pieces, each of said plurality of header information pieces including a multiplex code indicating disposition positions in the packet according to kinds of information data inserted in said packet and including error detection bits for detecting a receiving error of the multiplex code, causes each header information piece to include error correction data making the header information piece independently restorable, inserts header information pieces in predetermined positions of said packet so as to space apart them from each other, and inserts said plurality of kinds of information data in positions of said packet indicated by said multiplex code.

2. An information data multiplex transmission system according to claim 1, characterized in that multiplexing is effected while conducting so as to make all packets have a predetermined length.

3. An information data multiplex transmission system according to claim 1, characterized in that a receiving side extracts one out of a plurality of header information pieces inserted in a packet, conducts error detection and error correction, and, if error correction is impossible, extracts another header information piece and conducts error detection and error correction, and repetitively executes processing of extracting another header information piece and conducting error detection and error correction for all header information pieces until errorless header information piece is reproduced.

4. An information data multiplex transmission system according to claim 3, characterized in that if all header information pieces cannot be corrected in error, all header information pieces are subjected together to error correction processing using a concatenated code.

5. An information data multiplex transmission system according to claim 1, characterized in that
when said header information piece includes a packet marker representing a continuation state between packets, a multiplex code field specifying kinds of information data inserted in the packet, and a header error control field having an error detection function,
a transmitting side comprises means for inserting a plurality of said packet markers in the header information piece repetitively; and
a receiving side comprises means for conducting a majority decision on said plurality of packet markers and reproducing one correct packet marker.

6. An information data multiplexing apparatus of a transmitting apparatus used in an information data multiplex transmission system for inserting a plurality of kinds of information data into one packet and conducting multiplex transmission, characterized in that said information data multiplexing apparatus comprises:
an information content estimation means for estimating information amounts respectively of said plurality of kinds of information data;
a multiplex code generation means for generating a first multiplex code indicating disposition positions within the packet on the basis of the information amounts of respective information data estimated by said information content estimation means, and further generating a second multiplex code having a fixed relation with said first multiplex code;
a header information generation means for adding error detection and correction code data for detecting and correcting receiving errors to each of the first and second multiplex codes generated by said multiplex code generation means and thereby generating first and second header information; and
a packet generation means for storing the information data to be transmitted in the packet together with said first and second header information on the basis of said multiplex codes.

7. An information data multiplexing apparatus according to claim 6, characterized in that said second multiplex code is a parity of said first multiplex code.

8. An information data multiplexing apparatus according to claim 6, characterized in that said error detection and correction code data is a convolutional code.

9. An information data multiplexing apparatus according to claim 6, characterized in that said error detection and correction code data is a Hamming code.

10. An information data multiplexing apparatus according to claim 6, characterized in that said packet generation means stores said first and second header information in an identical packet.

11. An information data multiplexing apparatus according to claim 6, characterized in that said packet generation means stores said first and second header information in different packets.

12. An information data multiplexing apparatus according to claim 6, characterized in that said multiplex code generation means determines the multiplex codes so as to make all packets have a predetermined length.

13. An information data demultiplexing apparatus of a receiving apparatus used in an information data multiplex transmission system for inserting a plurality of kinds of information data into one packet and conducting multiplex transmission, characterized in that said information data demultiplexing apparatus comprises:
when first and second header information pieces having a multiplex code indicating disposition positions in the packet according to said plurality of kinds of information data and error detection and correction code data for detecting and correcting receiving errors of the multiplex code are stored in said packet, and said plurality of information data are stored in positions of said packet indicated by said multiplex code,
a header information extraction means for selectively extracting said first and second information pieces from said packet;
a first demultiplexing means for conducting error detection on the first header information piece extracted by said header information extraction means, and responsive to detection of no errors, for demultiplexing and outputting said plurality of information data from said packet on the basis of the multiplex code included in said header information piece;
a second demultiplexing means, responsive to detection of an error by said first demultiplexing means, for conducting error correction of said first header information piece and then conducting error detection again, and responsive to detection of no errors, for demultiplexing and outputting said plurality of information data from said packet on the basis of the multiplex code included in said header information piece corrected in error; and
a third demultiplexing means, responsive to detection of an error by said second demultiplexing means, for conducting error detection of said second header information piece, and responsive to detection of no errors, for demultiplexing and outputting said plurality of information data from said packet on the basis of the multiplex code included in said header information piece.

14. An information data demultiplexing apparatus according to claim 13, characterized in that said information data demultiplexing apparatus further comprises a fourth demultiplexing means, responsive to detection of an error by said third demultiplexing means, for conducting error correction of said second header information piece and then conducting error detection again, and responsive to detection of no errors, for demultiplexing and outputting said plurality of information data from said packet on the basis of the multiplex code included in said header information piece corrected in error.

15. An information data demultiplexing apparatus according to claim 14, characterized in that said information data demultiplexing apparatus further comprises a fifth demultiplexing means, responsive to detection of an error by said fourth demultiplexing means, for conducting error correction of said first header information piece and said second header information piece collectively and then conducting error detection again, and responsive to detection of no errors, for demultiplexing and outputting said plurality of information data from said packet on the basis of the multiplex code included in said first or second header information piece corrected in error.

16. An information data multiplex transmission system for inserting a plurality of kinds of information data into one packet and conducting multiplex transmission, characterized in that a transmitting side comprises:

a first encoding means for generating a first parity signal formed of arbitrary elements according to a first encoding rule with respect to a first transmitting signal formed of an arbitrary number of elements;

a first interleaving means for altering order of elements of said first transmitting signal;

a second encoding means for generating a second parity signal formed of arbitrary elements according to a second encoding rule with respect to a second transmitting signal altered in element order by said first interleaving means; and a means for generating and transmitting a transmitting encoded signal including said first transmitting signal and said first and second parity signals, and a receiving side comprises:

a means for receiving said transmitting encoded signal, and outputting a received encoded signal including the first received signal, the first received parity signal, and the second parity signal;

a first decoding means for adding an adjustment signal formed of an arbitrary number of elements to said first received signal and said first received parity signal, thereby generating a first decoding input signal, and generating a decoding output signal from said first decoding input signal;

a first amending means for amending said adjustment signal on the basis of said first decoding output signal;

a second interleaving means for conducting interleaving processing on said first received signal, and outputting a second received signal;

a second decoding means for adding said adjustment signal to said second received signal and said second received parity signal, thereby generating a second decoding input signal, and generating a second decoding output signal from said second decoding input signal;

a second amending means for amending said adjustment signal on the basis of said second decoding output signal;

a control means for causing the generation processing of the first decoding output signal in said first decoding means and amending processing of the adjustment signal in said first amending means, and the generation processing of the second decoding output signal in said second decoding means and amending processing of the adjustment signal in said second amending means to be repetitively executed a predetermined number of times; and a means for setting so as to change said number of times of repetition for specific elements of the first and second received signals.

17. A multiplexing apparatus of an information data multiplex transmission system for inserting a plurality of kinds of information data into one packet and conducting multiplex transmission, characterized in that said multiplexing apparatus comprises:

a division means for dividing each of said plurality of kinds of information data into an important part and an unimportant part;

a first error correction encoding means for conducting error correction encoding on said important part resulting from the division in said division means by using a first error correction code;

a header generation means for generating first header information representing a boundary between encoded information data of the important part yielded by said first error correction encoding means and said unimportant data;

a second error correction encoding means for conducting error correction encoding on a new information data group including the encoded information data of the important part yielded by said first error correction encoding means, said first header information, and information data of said unimportant part, by using a second error correction code;

a multiplexing means for inserting encoded information data groups corresponding to said plurality of kinds of information data, yielded by said second error correction encoding means into predetermined positions of said packet, respectively; and a means for adding second header information representing a multiplexing state to the encoded information data groups multiplexed by said multiplexing means.

18. A multiplexing apparatus according to claim 15, characterized in that:

said header generation means has a function of generating an error detection code for conducting error detection on the first header information; and said second error correction encoding means conducts error correction encoding on a new information data group including the encoded information data of the important part yielded by said first error correction encoding means, the first header information and the error detection code thereof, and the information data of said unimportant part, by using the second error correction code.

19. A multiplexing apparatus according to claim 17, characterized in that said multiplexing apparatus further comprises:

an acquisition means for acquiring information representing a quality of a transmission channel; and an encoding control means for supplying said new information group to said multiplexing means without conducting said second error correction encoding if the quality of the transmission channel acquired by said acquisition means is better than a predetermined quality.

20. A demultiplexing apparatus of an information data multiplex transmission system for inserting a plurality of kinds of information data into one packet and conducting multiplex transmission, characterized in that said demultiplexing apparatus comprises:

a demultiplexing means for demultiplexing a plurality of kinds of encoded information data groups inserted in a received packet, on the basis of second header information representing a multiplex state thereof;

a second error correction decoding means for conducting second error correction decoding processing on each of the plurality of kinds of encoded information data groups demultiplexed by said demultiplexing means;

a first error correction decoding means for dividing each of the decoded information data groups yielded by said second error correction decoding means into encoded information data of an important part and decoded information data of an unimportant part on the basis of first header information included in said decoded information data group, and conducting first error correction decoding processing on the encoded information data of the important part; and a means for reproducing original information data from decoded information data of the important part yielded by said first error correction decoding means and the decoded information data of the unimportant part.

21. A multiplexing apparatus of an information data multiplex transmission system for inserting a plurality of kinds of information data into one packet and conducting multiplex transmission, characterized in that said multiplexing apparatus comprises:

a division means for dividing each of said plurality of kinds of information data into an important part and an unimportant part;

an error correction encoding means for conducting error correction encoding on said important part resulting from the division in said division means by using an error correction code;

a header generation means for generating first header information representing a boundary between encoded information data of the important part yielded by said error correction encoding means and information data of said unimportant part;

a multiplexing means for inserting new information data each including the encoded information data of the important part yielded by said error correction encoding means, said header information generated by said header generation means, and the information data of said unimportant part, into predetermined positions of said packet, respectively; and a means for adding second header information representing a multiplexing state thereof to the new information data multiplexed by said multiplexing means and transmitting resulting information data.

22. A multiplexing apparatus according to claim 21, characterized in that:

said header generation means has a function of generating an error detection code for conducting error detection of the first header information; and said multiplexing means inserts new information data each including the encoded information data of the important part yielded by said error correction encoding means, the first header information generated by said header generation means, and the information data of said unimportant part, into predetermined positions of said packet, respectively.

23. A demultiplexing apparatus of an information data multiplex transmission system for inserting a plurality of kinds of information data into one packet and conducting multiplex transmission, characterized in that said demultiplexing apparatus comprises:

a demultiplexing means for demultiplexing a plurality of kinds of information data groups inserted in a received packet, on the basis of second header information representing a multiplex state thereof;

an error correction decoding means for dividing each of the plurality kinds of information data groups demultiplexed by said demultiplexing means into encoded information data of an important part and information data of an unimportant part on the basis of first header information included in said information data group, and conducting error correction decoding processing on the encoded information data of the important part; and a means for reproducing original information data from decoded information data of the important part yielded by said error correction decoding means and the information data of the unimportant part.

* * * * *

UNITED STATES PATENT AND TRADEMARK OFFICE
CERTIFICATE OF CORRECTION

PATENT NO. : 6,865,699 B2
DATED : March 8, 2005
INVENTOR(S) : Tanaka et al.

It is certified that error appears in the above-identified patent and that said Letters Patent is hereby corrected as shown below:

<u>Title page, Item [54] and Column 1, line 2,</u>
Title, change "TRANSMISSION, SYSTEM, ITS" to -- TRANSMISSION SYSTEM, ITS --.

<u>Column 64,</u>
Line 40, change "claim 15," to -- claim 17, --.

Signed and Sealed this

Twenty-fourth Day of May, 2005

JON W. DUDAS
*Director of the United States Patent and Trademark Office*